(12) United States Patent
Yamada

(10) Patent No.: US 9,450,562 B2
(45) Date of Patent: Sep. 20, 2016

(54) RESONATOR, OSCILLATOR, ELECTRONIC APPARATUS, PHYSICAL QUANTITY SENSOR, AND MOBILE OBJECT

(71) Applicant: SEIKO EPSON CORPORATION, Tokyo (JP)

(72) Inventor: Akinori Yamada, Ina (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/582,621

(22) Filed: Dec. 24, 2014

(65) Prior Publication Data

US 2015/0188516 A1  Jul. 2, 2015

(30) Foreign Application Priority Data

Dec. 27, 2013  (JP) ................................ 2013-273627

(51) Int. Cl.
| | |
|---|---|
| *H03B 5/32* | (2006.01) |
| *H03H 9/17* | (2006.01) |
| *H03H 9/19* | (2006.01) |
| *H03H 9/215* | (2006.01) |
| *H03H 9/02* | (2006.01) |
| *H03H 9/05* | (2006.01) |
| *H03H 9/10* | (2006.01) |
| *H03H 3/04* | (2006.01) |

(52) U.S. Cl.
CPC ............ *H03H 9/02551* (2013.01); *H03B 5/32* (2013.01); *H03H 9/0509* (2013.01); *H03H 9/0547* (2013.01); *H03H 9/1014* (2013.01); *H03H 9/17* (2013.01); *H03H 9/19* (2013.01); *H03H 9/215* (2013.01); *H03H 2003/0407* (2013.01)

(58) Field of Classification Search
CPC ............ G04F 5/04; G04F 5/06; G04F 5/063; H03B 5/30; H03B 5/32; H03H 9/17; H03H 9/176; H03H 9/19; H03H 9/21; H03H 9/215; H03H 9/2468; H03H 9/2473; H03H 9/2478; H03H 9/2484; H03H 9/2489; H03H 9/2494; H03H 2003/026; H03H 2003/0492
USPC .......... 310/311, 312, 370; 331/154, 156, 158
See application file for complete search history.

(56) References Cited

U.S. PATENT DOCUMENTS

| | | | |
|---|---|---|---|
| 6,587,009 B2 | 7/2003 | Kitamura et al. | |
| 7,759,848 B2 | 7/2010 | Hirasawa | |
| 2005/0005411 A1 | 1/2005 | Kawauchi et al. | |
| 2006/0284694 A1* | 12/2006 | Kawashima | 331/158 |
| 2007/0120449 A1* | 5/2007 | Aizawa et al. | 310/370 |
| 2008/0106172 A1* | 5/2008 | Tanaya et al. | 310/344 |
| 2008/0211350 A1* | 9/2008 | Tanaya et al. | 310/328 |

(Continued)

FOREIGN PATENT DOCUMENTS

| | | |
|---|---|---|
| JP | A-2009-130456 | 9/2002 |
| JP | A-2002-261575 | 7/2006 |

(Continued)

*Primary Examiner* — Levi Gannon
(74) *Attorney, Agent, or Firm* — Oliff PLC

(57) ABSTRACT

A resonator includes a resonator device, a package on which the resonator device is mounted, and conductive adhesives which fix the resonator device to the package. A width of the base portion of the resonator device is set as W1, a width of a linkage portion is set as W2, a Young's modulus of the conductive adhesives is set as E, a relationship of $-1.3 \text{ GPa} \leq \log E \leq -0.7 \text{ GPa}$ is satisfied, and a relationship of $0.1 \leq W2/W1 \leq 0.7$ is satisfied.

20 Claims, 41 Drawing Sheets

(56) References Cited

U.S. PATENT DOCUMENTS

| | | | |
|---|---|---|---|
| 2008/0315727 A1* | 12/2008 | Ishikawa et al. | 310/370 |
| 2009/0021120 A1* | 1/2009 | Dalla Piazza et al. | 310/370 |
| 2010/0200543 A1* | 8/2010 | Katoh | 216/41 |
| 2010/0237740 A1* | 9/2010 | Aratake et al. | 310/312 |
| 2011/0063041 A1* | 3/2011 | Yamada et al. | 331/158 |
| 2011/0068876 A1* | 3/2011 | Yamada et al. | 331/158 |
| 2013/0208573 A1* | 8/2013 | Arimatsu | 368/47 |
| 2013/0221808 A1* | 8/2013 | Morimoto et al. | 310/366 |

FOREIGN PATENT DOCUMENTS

| | | |
|---|---|---|
| JP | A-2006-196932 | 6/2009 |
| JP | A-2010-166198 | 7/2010 |

\* cited by examiner

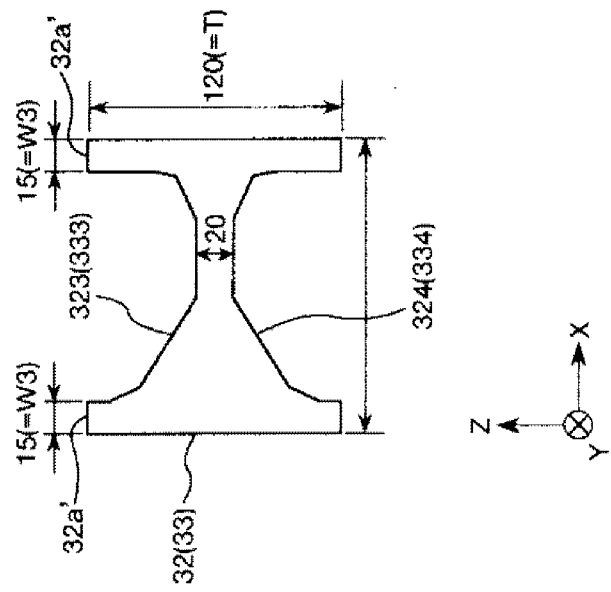
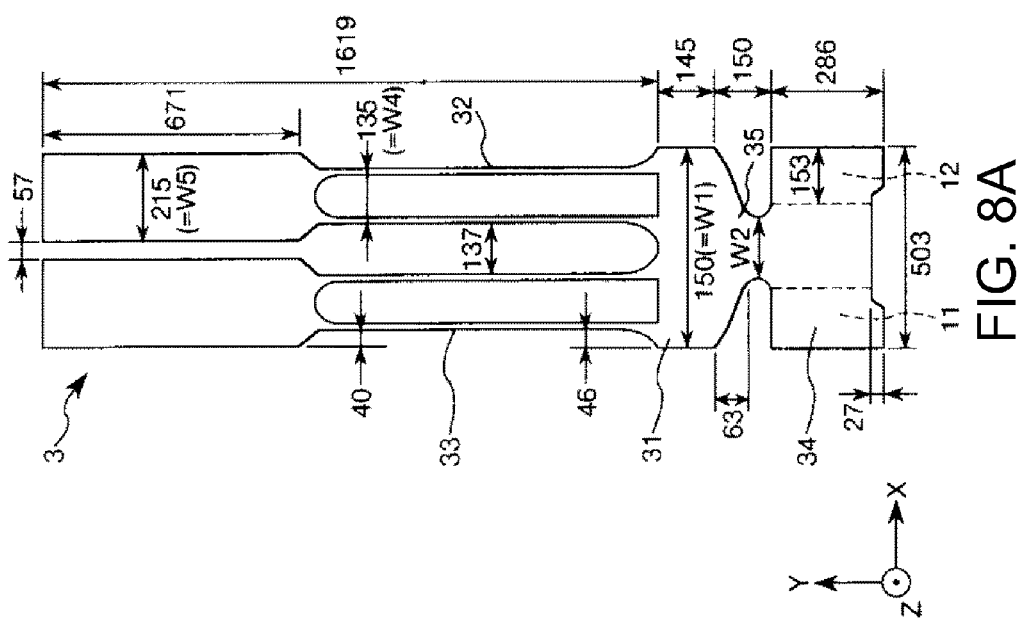
FIG. 8B
FIG. 8A

FIG. 10

[TABLE 1]

| W2 [μm] | W2/W1 | 0.05 | 0.075 | 0.1 | 0.125 | 0.15 | 0.175 | 0.2 | 0.3 | 0.5 |
|---|---|---|---|---|---|---|---|---|---|---|
| 50 | 0.100 | 1.510E+06 | 1.445E+06 | 1.378E+06 | 1.326E+06 | 1.286E+06 | 1.256E+06 | 1.169E+06 | 1.169E+06 | 1.111E+06 |
| 67 | 0.134 | 1.558E+06 | 1.453E+06 | 1.361E+06 | 1.293E+06 | 1.242E+06 | 1.203E+06 | 1.173E+06 | 1.096E+06 | 1.028E+06 |
| 83 | 0.166 | 1.632E+06 | 1.493E+06 | 1.377E+06 | 1.293E+06 | 1.231E+06 | 1.184E+06 | 1.147E+06 | 1.054E+06 | 9.729E+05 |
| 100 | 0.200 | 1.712E+06 | 1.530E+06 | 1.385E+06 | 1.281E+06 | 1.205E+06 | 1.147E+06 | 1.101E+06 | 9.888E+05 | 8.905E+05 |
| 116 | 0.232 | 1.843E+06 | 1.627E+06 | 1.456E+06 | 1.331E+06 | 1.240E+06 | 1.170E+06 | 1.116E+06 | 9.799E+05 | 8.623E+05 |
| 133 | 0.266 | 2.047E+06 | 1.802E+06 | 1.600E+06 | 1.451E+06 | 1.340E+06 | 1.254E+06 | 1.187E+06 | 1.020E+06 | 8.777E+05 |
| 150 | 0.300 | 2.269E+06 | 1.985E+06 | 1.745E+06 | 1.566E+06 | 1.431E+06 | 1.328E+06 | 1.247E+06 | 1.048E+06 | 8.824E+05 |
| 175 | 0.350 | 2.601E+06 | 2.217E+06 | 1.895E+06 | 1.656E+06 | 1.480E+06 | 1.346E+06 | 1.244E+06 | 1.000E+06 | 8.134E+05 |
| 200 | 0.400 | 2.957E+06 | 2.418E+06 | 1.994E+06 | 1.693E+06 | 1.478E+06 | 1.320E+06 | 1.202E+06 | 9.334E+05 | 7.436E+05 |
| 225 | 0.450 | 3.374E+06 | 2.630E+06 | 2.086E+06 | 1.719E+06 | 1.467E+06 | 1.289E+06 | 1.158E+06 | 8.738E+05 | 6.868E+05 |
| 250 | 0.500 | 3.595E+06 | 2.588E+06 | 1.946E+06 | 1.548E+06 | 1.289E+06 | 1.113E+06 | 9.871E+05 | 7.259E+05 | 5.635E+05 |
| 275 | 0.550 | 3.611E+06 | 2.386E+06 | 1.716E+06 | 1.331E+06 | 1.092E+06 | 9.333E+05 | 8.224E+05 | 5.976E+05 | 4.622E+05 |
| 300 | 0.600 | 3.493E+06 | 2.143E+06 | 1.491E+06 | 1.138E+06 | 9.256E+05 | 7.871E+05 | 6.914E+05 | 5.001E+05 | 3.868E+05 |
| 325 | 0.650 | 3.419E+06 | 2.000E+06 | 1.371E+06 | 1.042E+06 | 8.475E+05 | 7.216E+05 | 6.351E+05 | 4.625E+05 | 3.603E+05 |
| 350 | 0.700 | 3.293E+06 | 1.863E+06 | 1.268E+06 | 9.650E+05 | 7.872E+05 | 6.728E+05 | 5.943E+05 | 4.376E+05 | 3.444E+05 |

YOUNG'S MODULUS [GPa]

FIG. 11

[TABLE 2]

| W2 [μm] | W2/W1 | 1.0 | 1.5 | 2.0 | 2.5 | 3.0 | 3.5 | 4.0 | 4.5 | 5.0 |
|---|---|---|---|---|---|---|---|---|---|---|
| 50 | 0.100 | 1.060E+06 | 1.041E+06 | 1.032E+06 | 1.026E+06 | 1.022E+06 | 1.019E+06 | 1.017E+06 | 1.015E+06 | 1.013E+06 |
| 67 | 0.134 | 9.696E+05 | 9.488E+05 | 9.381E+05 | 9.316E+05 | 9.272E+05 | 9.240E+05 | 9.215E+05 | 9.196E+05 | 9.181E+05 |
| 83 | 0.166 | 9.055E+05 | 8.817E+05 | 8.696E+05 | 8.622E+05 | 8.572E+05 | 8.536E+05 | 8.509E+05 | 8.488E+05 | 8.470E+05 |
| 100 | 0.200 | 8.108E+05 | 7.831E+05 | 7.691E+05 | 7.606E+05 | 7.549E+05 | 7.508E+05 | 7.477E+05 | 7.452E+05 | 7.433E+05 |
| 116 | 0.232 | 7.688E+05 | 7.369E+05 | 7.209E+05 | 7.112E+05 | 7.048E+05 | 7.002E+05 | 6.967E+05 | 6.940E+05 | 6.918E+05 |
| 133 | 0.266 | 7.677E+05 | 7.314E+05 | 7.134E+05 | 7.027E+05 | 6.956E+05 | 6.905E+05 | 6.867E+05 | 6.838E+05 | 6.814E+05 |
| 150 | 0.300 | 7.612E+05 | 7.229E+05 | 7.043E+05 | 6.934E+05 | 6.863E+05 | 6.812E+05 | 6.775E+05 | 6.746E+05 | 6.722E+05 |
| 175 | 0.350 | 6.903E+05 | 6.546E+05 | 6.380E+05 | 6.286E+05 | 6.225E+05 | 6.182E+05 | 6.151E+05 | 6.128E+05 | 6.109E+05 |
| 200 | 0.400 | 6.302E+05 | 6.003E+05 | 5.870E+05 | 5.796E+05 | 5.750E+05 | 5.718E+05 | 5.696E+05 | 5.679E+05 | 5.666E+05 |
| 225 | 0.450 | 5.849E+05 | 5.603E+05 | 5.501E+05 | 5.446E+05 | 5.412E+05 | 5.390E+05 | 5.374E+05 | 5.363E+05 | 5.354E+05 |
| 250 | 0.500 | 4.805E+05 | 4.618E+05 | 4.544E+05 | 4.505E+05 | 4.482E+05 | 4.467E+05 | 4.457E+05 | 4.449E+05 | 4.444E+05 |
| 275 | 0.550 | 3.954E+05 | 3.810E+05 | 3.755E+05 | 3.727E+05 | 3.710E+05 | 3.700E+05 | 3.692E+05 | 3.687E+05 | 3.683E+05 |
| 300 | 0.600 | 3.318E+05 | 3.202E+05 | 3.159E+05 | 3.137E+05 | 3.124E+05 | 3.116E+05 | 3.111E+05 | 3.107E+05 | 3.104E+05 |
| 325 | 0.650 | 3.110E+05 | 3.009E+05 | 2.971E+05 | 2.952E+05 | 2.941E+05 | 2.935E+05 | 2.930E+05 | 2.927E+05 | 2.924E+05 |
| 350 | 0.700 | 2.993E+05 | 2.901E+05 | 2.867E+05 | 2.851E+05 | 2.842E+05 | 2.836E+05 | 2.832E+05 | 2.829E+05 | 2.827E+05 |

YOUNG'S MODULUS [GPa]

[TABLE 3]

| YOUNG'S MODULUS E [GPa] | logE [GPa] | M≥0.94 | | M≥0.96 | | M≥0.98 | |
|---|---|---|---|---|---|---|---|
| | | W2/W1 LOWER LIMIT | W2/W1 UPPER LIMIT | W2/W1 LOWER LIMIT | W2/W1 UPPER LIMIT | W2/W1 LOWER LIMIT | W2/W1 UPPER LIMIT |
| 0.05 | -1.30 | 0.100 | 0.700 | 0.256 | 0.700 | 0.357 | 0.700 |
| 0.075 | -1.12 | 0.100 | 0.700 | 0.139 | 0.700 | 0.300 | 0.656 |
| 0.1 | -1.00 | 0.100 | 0.700 | 0.100 | 0.700 | 0.260 | 0.588 |
| 0.125 | -0.90 | 0.100 | 0.700 | 0.100 | 0.699 | 0.192 | 0.562 |
| 0.15 | -0.82 | 0.100 | 0.700 | 0.100 | 0.650 | 0.100 | 0.545 |
| 0.175 | -0.76 | 0.100 | 0.700 | 0.100 | 0.616 | 0.100 | 0.526 |
| 0.2 | -0.70 | 0.100 | 0.700 | 0.100 | 0.594 | 0.100 | 0.512 |
| 0.3 | -0.52 | 0.100 | 0.602 | 0.100 | 0.520 | 0.100 | 0.438 |
| 0.5 | -0.30 | 0.100 | 0.539 | 0.100 | 0.465 | 0.100 | 0.331 |
| 1.0 | 0.00 | 0.100 | 0.509 | 0.100 | 0.427 | 0.100 | 0.215 |
| 1.5 | 0.18 | 0.100 | 0.504 | 0.100 | 0.415 | 0.100 | 0.204 |
| 2.0 | 0.30 | 0.100 | 0.502 | 0.100 | 0.409 | 0.100 | 0.200 |
| 2.5 | 0.40 | 0.100 | 0.501 | 0.100 | 0.406 | 0.100 | 0.197 |
| 3.0 | 0.48 | 0.100 | 0.500 | 0.100 | 0.404 | 0.100 | 0.196 |
| 3.5 | 0.54 | 0.100 | 0.500 | 0.100 | 0.403 | 0.100 | 0.195 |
| 4.0 | 0.60 | 0.100 | 0.500 | 0.100 | 0.402 | 0.100 | 0.194 |
| 4.5 | 0.65 | 0.100 | 0.500 | 0.100 | 0.401 | 0.100 | 0.193 |
| 5.0 | 0.70 | 0.100 | 0.500 | 0.100 | 0.400 | 0.100 | 0.193 |

FIG. 31

RESONATOR, OSCILLATOR, ELECTRONIC APPARATUS, PHYSICAL QUANTITY SENSOR, AND MOBILE OBJECT

CROSS REFERENCE

The entire disclose of Japanese Patent Application No. 2013-273627, filed Dec. 27, 2013, is expressly incorporated by reference herein.

BACKGROUND

1. Technical Field

The present invention relates to a resonator, an oscillator, an electronic apparatus, a physical quantity sensor, and a mobile object.

2. Related Art

In the related art, a resonator device using quartz crystal has been known. Such a resonator device has an excellent frequency temperature behavior, and thus, it is broadly used as a reference frequency source or a transmission source of various electronic apparatuses.

A tuning fork type resonator device disclosed in JP-A-2009-130456 includes a resonator element including a base portion, a pair of vibrating arms which extend from one end side of the base portion, a connection portion which is positioned at the other end side of the base portion, and a linkage portion (constricted portion interposed between cutouts) which is positioned between the base portion and the connection portion and links those, and can decrease vibration leakage by forming the linkage portion. JP-A-2009-130456 discloses that a width W2 of the linkage portion may be equal to or less than 50% of a width W1 of the base portion.

However, in the resonator device disclosed in JP-A-2009-130456, a weight portion (hammer head) is not provided on a distal end portion of each vibrating arm. When the weight portion is provided in the vibrating arm, distortion easily occurs in the vibrating arm at the time of the excitation, and the vibration leakage tends to increase to that extent. When the weight portions are formed in the vibrating arms having the same length, in order to realize high performance of the resonator device, an effect of the vibration on the base portion due to flexural vibration necessarily increases, and the vibration leakage also tends to increase. Accordingly, when the weight portion is provided in the vibrating arm, it is not clear that the vibration leakage can be sufficiently decreased by only setting the width W2 to be equal to or less than 50% of the width W1.

The vibration leakage of the resonator device greatly depends on a hardness of a fixing member (generally, a metal bump or a conductive adhesive) which fixes the resonator device to a package. That is, even when the width W2 is set to be equal to or less than 50% of the width W1, the vibration leakage hardly sufficiently decreases depending on the hardness of the fixing member. In JP-A-2009-130456, the description of the hardness of the fixing member is not disclosed, and therefore, a relationship between the hardness of the fixing member and the width W2 (W2/W1) is not clear.

SUMMARY

An advantage of some aspects of the invention is to provide a resonator which can decrease vibration leakage, an oscillator, an electronic apparatus, a physical quantity sensor, and a mobile object which include the resonator and have high reliability.

The invention can be implemented as the following application examples.

APPLICATION EXAMPLE 1

This application example is directed to a resonator including: a resonator device; a package to which the resonator device is attached; and a member which attaches the resonator device to the package, in which the resonator device includes a base portion, a pair of vibrating arms which extend from one end side of the base portion in a plan view, a connection portion which is disposed on the other end side of the base portion in a plan view, and a linkage portion which is disposed between the base portion and the connection portion in a plan view and links between the base portion and the connection portion, each of the vibrating arms includes a weight portion, and an arm which is disposed between the base portion and the weight portion in a plan view, and when a width of the base portion along a direction intersecting with the extension direction is set as W1, a width of the linkage portion along the intersecting direction is set as W2, a Young's modulus of the member is set as E (GPa) and a relationship of $-1.3 \leq \log E < -0.7$ is satisfied, a relationship of the following formula is satisfied.

$$0.1 \leq \frac{W2}{W1} \leq 0.7$$

With this configuration, a resonator which can decrease vibration leakage is obtained.

APPLICATION EXAMPLE 2

This application example is directed to a resonator including: a resonator device; a package to which the resonator device is attached; and a member which attaches the resonator device to the package, in which the resonator device includes a base portion, a pair of vibrating arms which extend from one end side of the base portion in a plan view, a connection portion which is disposed on the other end side of the base portion in a plan view, and a linkage portion which is disposed between the base portion and the connection portion in a plan view and links between the base portion and the connection portion, each of the vibrating arms includes a weight portion, and an arm which is disposed between the base portion and the weight portion in a plan view, and when a width of the base portion along a direction intersecting with the extension direction is set as W1, a width of the linkage portion along the intersecting direction is set as W2, a Young's modulus of the member is set as E (GPa) and a relationship of $-0.7 \leq \log E \leq 0.7$ is satisfied, a relationship of the following formula is satisfied.

$$0.100 \leq \frac{W2}{W1} \leq -1.995 \times 10^{-1} \times (\log E)^3 + 1.891 \times 10^{-1} \times (\log E)^2 - 4.561 \times 10^{-2} \times (\log E) + 5.038 \times 10^{-1}$$

With this configuration, a resonator which can decrease vibration leakage is obtained.

APPLICATION EXAMPLE 3

This application example is directed to a resonator including: a resonator device; a package to which the resonator device is attached; and a member which attaches the resonator device to the package, in which the resonator device includes a base portion, a pair of vibrating arms which extend from one end side of the base portion in a plan view, a connection portion which is disposed on the other end side of the base portion in a plan view, and a linkage portion which is disposed between the base portion and the connection portion in a plan view and links between the base portion and the connection portion, each of the vibrating arms includes a weight portion, and an arm which is disposed between the base portion and the weight portion in a plan view, and when a width of the base portion along a direction intersecting with the extension direction is set as W1, a width of the linkage portion along the intersecting direction is set as W2, a Young's modulus of the member is set as E (GPa) and a relationship of $-1.3 \leq \log E < -1.0$ is satisfied, a relationship of the following formula is satisfied.

$$1.167 \times (\log E)^2 + 2.168 \times (\log E) + 1.101 \leq \frac{W2}{W1} \leq 0.7$$

With this configuration, a resonator which can decrease vibration leakage is obtained.

APPLICATION EXAMPLE 4

This application example is directed to a resonator including: a resonator device; a package to which the resonator device is attached; and a member which attaches the resonator device to the package, in which the resonator device includes a base portion, a pair of vibrating arms which extend from one end side of the base portion in a plan view, a connection portion which is disposed on the other end side of the base portion in a plan view, and a linkage portion which is disposed between the base portion and the connection portion in a plan view and links between the base portion and the connection portion, each of the vibrating arms includes a weight portion, and an arm which is disposed between the base portion and the weight portion in a plan view, and when a width of the base portion along a direction intersecting with the extension direction is set as W1, a width of the linkage portion along the intersecting direction is set as W2, a Young's modulus of the member is set as E (GPa) and a relationship of $-1.0 \leq \log E \leq 0.7$ is satisfied, a relationship of the following formula is satisfied.

$$0.100 \leq \frac{W2}{W1} \leq -1.100 \times 10^{-1} \times (\log E)^3 + 1.433 \times 10^{-1} \times (\log E)^2 - 8.338 \times 10^{-2} \times (\log E) + 4.246 \times 10^{-1}$$

With this configuration, a resonator which can decrease vibration leakage is obtained.

APPLICATION EXAMPLE 5

This application example is directed to a resonator including: a resonator device; a package to which the resonator device is attached; and a member which attaches the resonator device to the package, in which the resonator device includes a base portion, a pair of vibrating arms which extend from one end side of the base portion in a plan view, a connection portion which is disposed on the other end side of the base portion in a plan view, and a linkage portion which is disposed between the base portion and the connection portion in a plan view and links between the base portion and the connection portion, each of the vibrating arms includes a weight portion, and an arm which is disposed between the base portion and the weight portion in a plan view, and when a width of the base portion along a direction intersecting with the extension direction is set as W1, a width of the linkage portion along the intersecting direction is set as W2, a Young's modulus of the member is set as E (GPa) and a relationship of $-1.3 \leq \log E < -0.82$ is satisfied, a relationship of the following formula is satisfied.

$$-9.877 \times 10^{-1} \times (\log E)^2 - 2.610 \times (\log E) - 1.370 \leq$$
$$\frac{W2}{W1} \leq -1.219 \times 10^{-2} \times (\log E)^6 - 2.289 \times 10^{-1} \times (\log E)^5 -$$
$$3.460 \times 10^{-1} \times (\log E)^4 + 1.566 \times 10^{-1} \times (\log E)^3 +$$
$$4.112 \times 10^{-1} \times (\log E)^2 - 2.472 \times 10^{-1} \times (\log E) + 2.285 \times 10^{-1}$$

With this configuration, a resonator which can decrease vibration leakage is obtained.

APPLICATION EXAMPLE 6

This application example is directed to a resonator including: a resonator device; a package to which the resonator device is attached; and a member which attaches the resonator device to the package, in which the resonator device includes a base portion, a pair of vibrating arms which extend from one end side of the base portion in a plan view, a connection portion which is disposed on the other end side of the base portion in a plan view, and a linkage portion which is disposed between the base portion and the connection portion in a plan view and links between the base portion and the connection portion, each of the vibrating arms includes a weight portion, and an arm which is disposed between the base portion and the weight portion in a plan view, and when a width of the base portion along a direction intersecting with the extension direction is set as W1, a width of the linkage portion along the intersecting direction is set as W2, a Young's modulus of the member is set as E (GPa), and a relationship of $-0.82 \leq \log E \leq 0.7$ is satisfied, a relationship of the following formula is satisfied.

$$0.100 \leq \frac{W2}{W1} \leq -1.219 \times 10^{-2} \times (\log E)^6 - 2.289 \times 10^{-1} \times (\log E)^5 -$$
$$3.460 \times 10^{-1} \times (\log E)^4 + 1.566 \times 10^{-1} \times (\log E)^3 +$$
$$4.112 \times 10^{-1} \times (\log E)^2 - 2.472 \times 10^{-1} \times (\log E) + 2.285 \times 10^{-1}$$

With this configuration, a resonator which can decrease vibration leakage is obtained.

APPLICATION EXAMPLE 7

This application example is directed to the resonator according to the application example described above, wherein when a length of the vibrating arm along the extension direction is set as L and a length of the weight portion along the extension direction is set as H, a relationship of the following formula is satisfied.

$$0.184 \leqq \frac{H}{L} \leqq 0.597$$

With this configuration, it is possible to improve a Q value of the resonator device.

APPLICATION EXAMPLE 8

This application example is directed to the resonator according to the application example described above, wherein when a length of the vibrating arm along the extension direction is set as L and a length of the weight portion along the extension direction is set as H, a relationship of the following formula is satisfied.

$$0.012 < \frac{H}{L} < 0.30$$

With this configuration, it is possible to decrease a CI value of the resonator device.

APPLICATION EXAMPLE 9

This application example is directed to the resonator according to the application example described above, wherein each of the vibrating arm includes a pair of main surfaces in a front-back relationship, and a pair of grooves respectively provided on the pair of main surfaces, and when a width of each portion of the main surface arranged with the groove interposed therebetween along a direction intersecting with the extension direction is set as W3, a relationship of 7 (μm)≦W3≦15 (μm) is satisfied.

With this configuration, it is possible to decrease a thermoelastic loss and to exhibit more excellent vibration characteristics.

APPLICATION EXAMPLE 10

This application example is directed to the resonator according to the application example described above, wherein each of the vibrating arm includes a pair of main surfaces in a front-back relationship, and a pair of grooves respectively provided on the pair of main surfaces, and when a thickness of the vibrating arm is set as T and a depth of the groove is set as t, a relationship of the following formula is satisfied.

$$0.4 \leqq 2 \times \frac{t}{T} < 1$$

With this configuration, it is possible to decrease the thermoelastic loss and to exhibit more excellent vibration characteristics.

APPLICATION EXAMPLE 11

This application example is directed to the resonator according to the application example described above, wherein a width of the weight portion along a direction intersecting with the extension direction is greater than that of the arm.

With this configuration, it is possible to further exhibit an effect of the weight portion.

APPLICATION EXAMPLE 12

This application example is directed to the resonator according to the application example described above, wherein the base portion includes a first constriction portion which is positioned on the other end side and has a length in a direction intersecting with the extension direction in a plan view which decreases continuously or in a stepwise manner along a center line between the pair of vibrating arms with distance from the one end.

With this configuration, it is possible to offset (relax and absorb) vibration of the vibrating arm by the first constriction portion and to decrease the vibration leakage. Accordingly, a resonator element having the excellent vibration characteristics is obtained. In addition, a separation distance between one end and the other end of the base portion increases, and it is possible to decrease heat transfer therebetween, and to decrease the thermoelastic loss.

APPLICATION EXAMPLE 13

This application example is directed to the resonator according to the application example described above, wherein the base portion includes a second constriction portion which is positioned on the one end side and between the pair of vibrating arms, and has a length in a direction intersecting with the extension direction in a plan view which decreases continuously or in a stepwise manner along a center line between the pair of vibrating arms with distance from the other end.

With this configuration, it is possible to offset (relax and absorb) vibration of the vibrating arm by the second constriction portion and to decrease the vibration leakage. Accordingly, a resonator element having the excellent vibration characteristics is obtained. In addition, the separation distance between one end and the other end of the base portion increases, and it is possible to decrease heat transfer therebetween, and to decrease the thermoelastic loss.

APPLICATION EXAMPLE 14

This application example is directed to an oscillator including: the resonator of the application example described above; and a circuit.

With this configuration, an oscillator having high reliability is obtained.

APPLICATION EXAMPLE 15

This application example is directed to an electronic apparatus including: the resonator of the application example described above.

With this configuration, an electronic apparatus having high reliability is obtained.

APPLICATION EXAMPLE 16

This application example is directed to a physical quantity sensor including: the resonator of the application example described above.

With this configuration, a physical quantity sensor having high reliability is obtained.

APPLICATION EXAMPLE 17

This application example is directed to a mobile object including: the resonator of the application example described above.

With this configuration, a mobile object having high reliability is obtained.

BRIEF DESCRIPTION OF THE DRAWINGS

The invention will be described with reference to the accompanying drawings, wherein like numbers reference like elements.

FIGS. 8A and 8B are a plan view and a cross-sectional view showing dimensions of a crystal resonator element used in a simulation.

FIG. 10 is a table showing simulation results relating to vibration leakage.

FIG. 11 is a table showing simulation results relating to vibration leakage.

FIG. 31 is a table showing a relationship between W2/W1 and a vibration leakage difficulty index.

DESCRIPTION OF EXEMPLARY EMBODIMENTS

Figure 1:
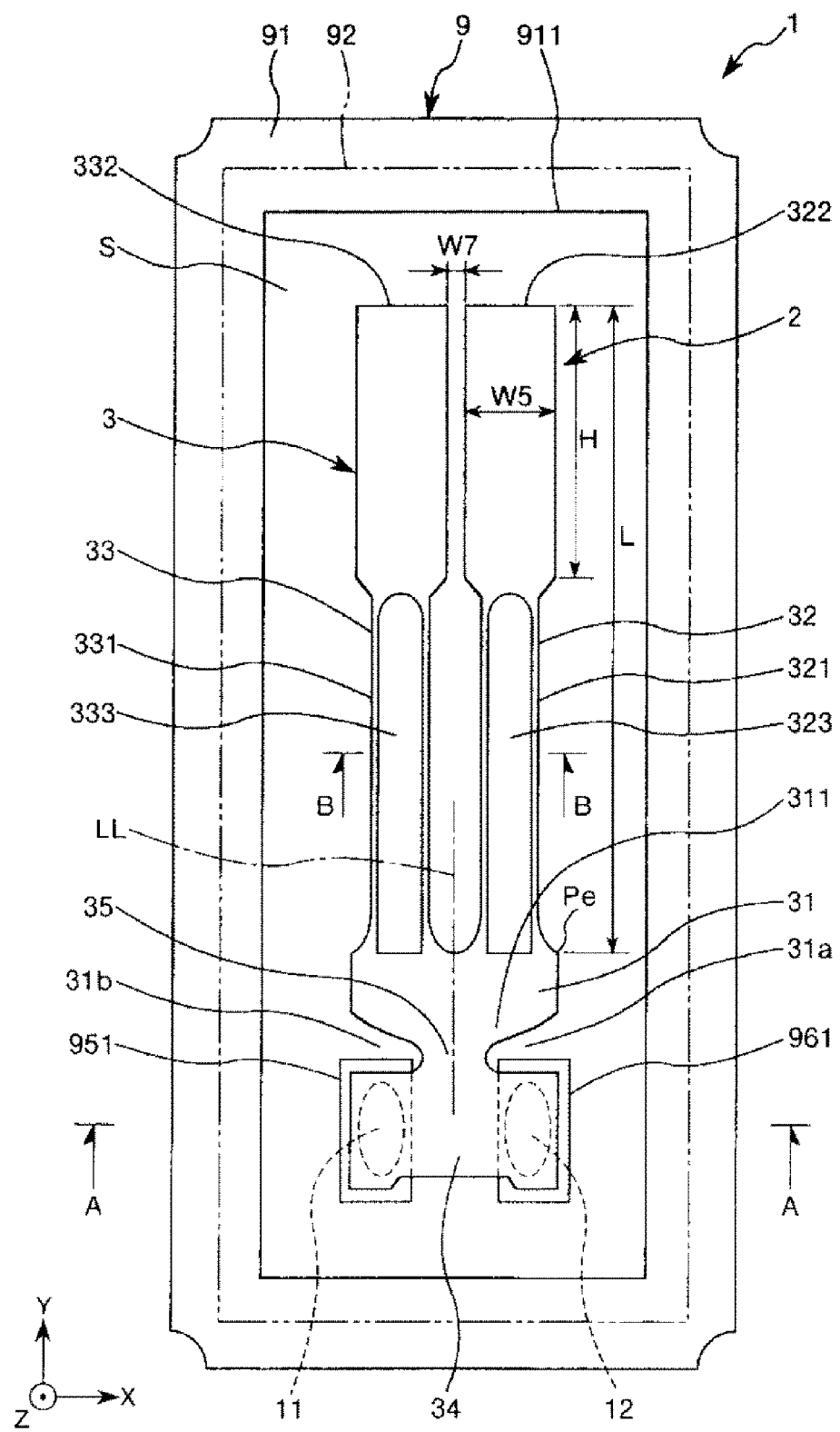
FIG. 1 is a plan view of a resonator according to a first embodiment of the invention.

Hereinafter, a resonator, an oscillator, an electronic apparatus, a physical quantity sensor, and a mobile object according to the invention will be described in detail with reference to preferred embodiments shown in the drawings.

1. Resonator

First, a resonator according to the invention will be described.

First Embodiment

Figure 2:
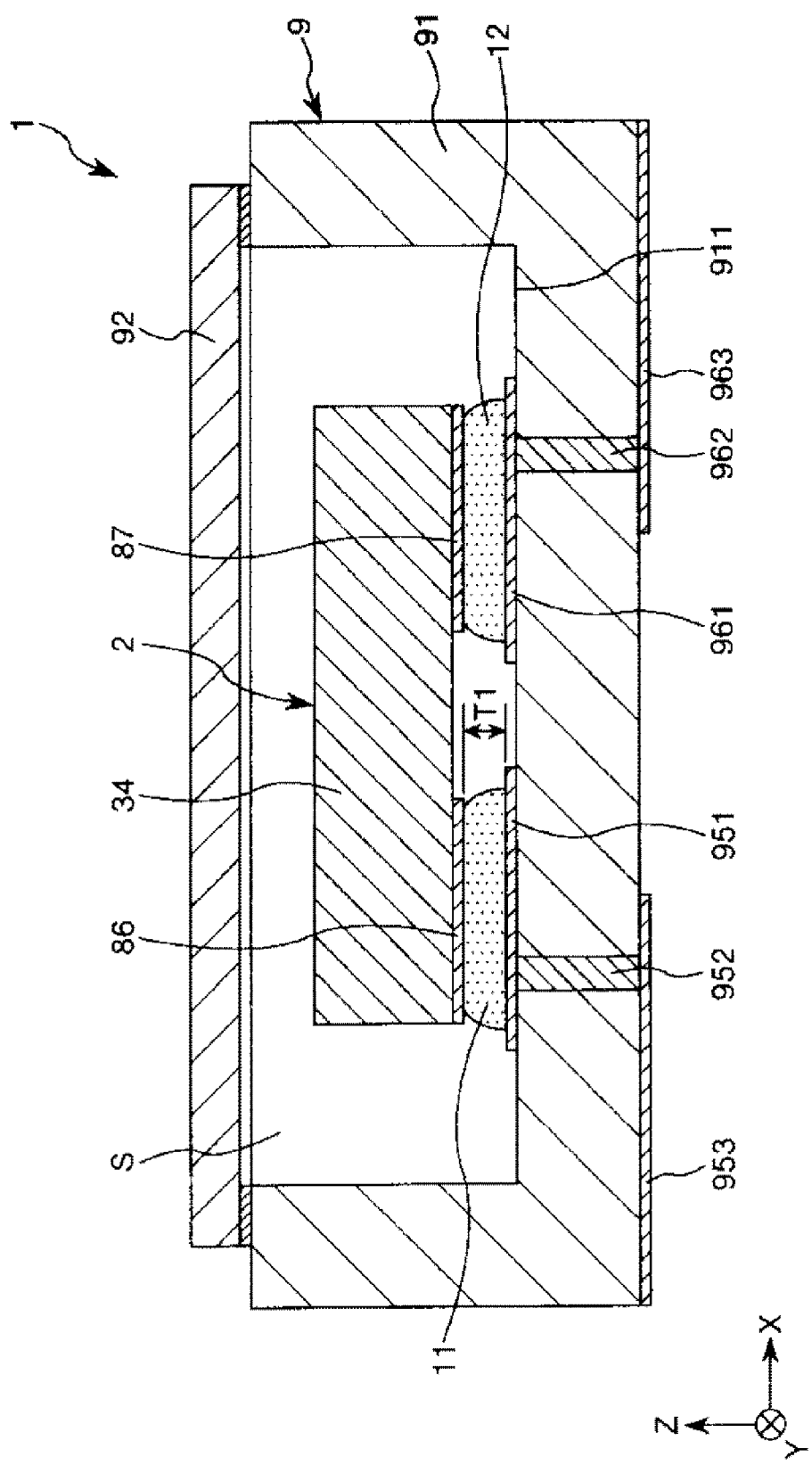
FIG. 2 is a cross-sectional view taken along line A-A of FIG. 1.
Figure 3:
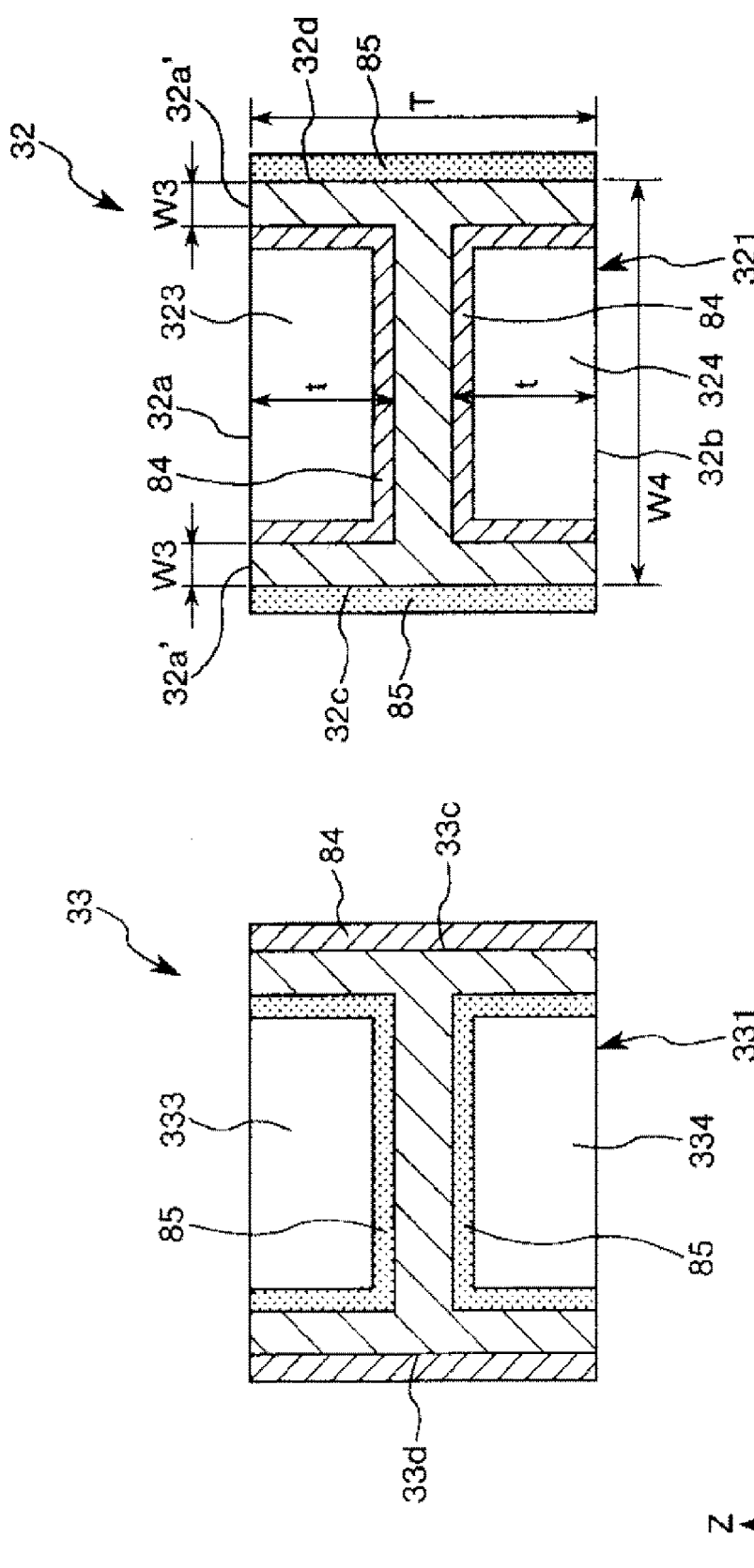
FIG. 3 is a cross-sectional view taken along line B-B of FIG. 1.
Figure 4:
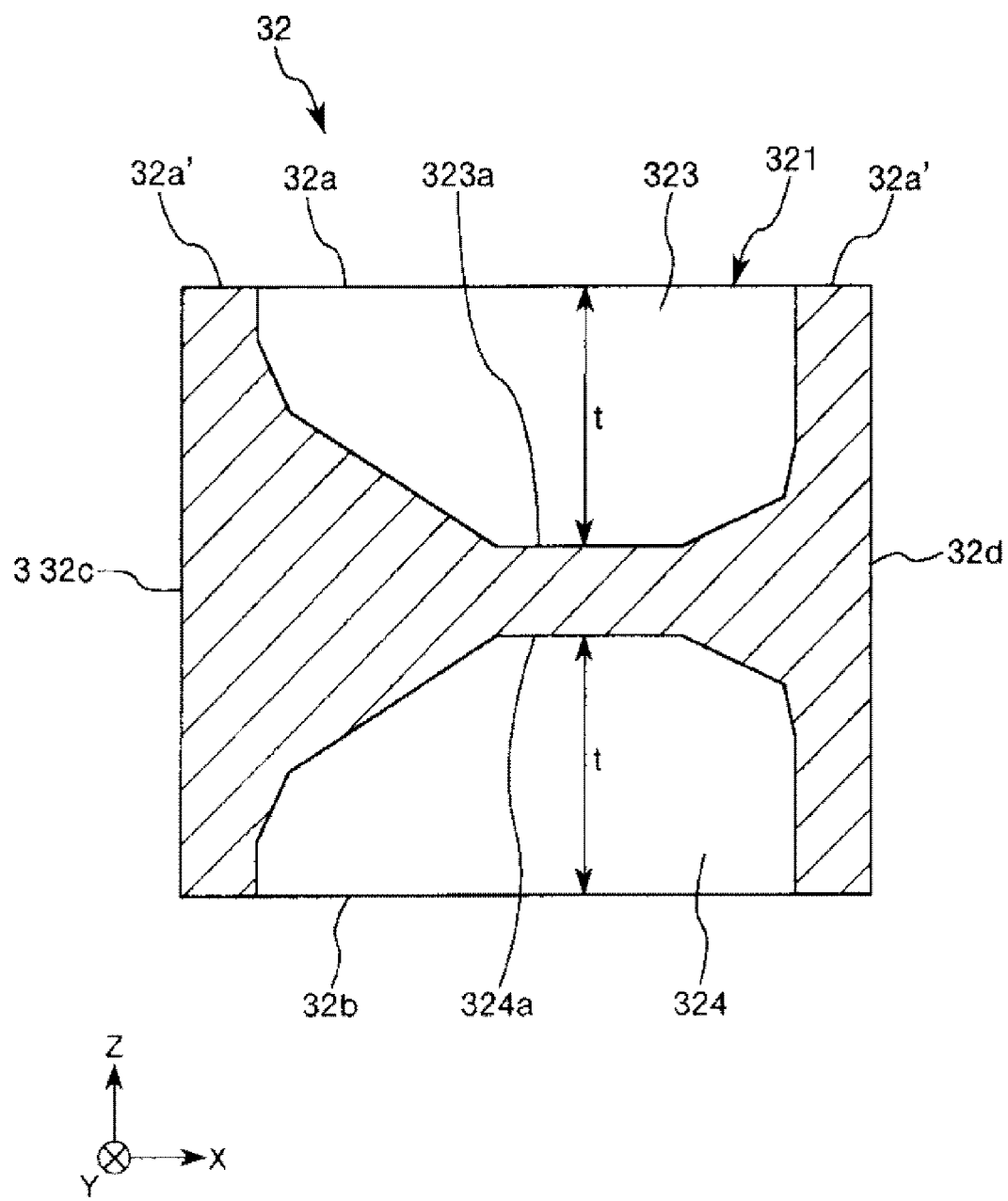
FIG. 4 is a cross-sectional view showing a vibrating arm formed by wet etching.
Figure 5:
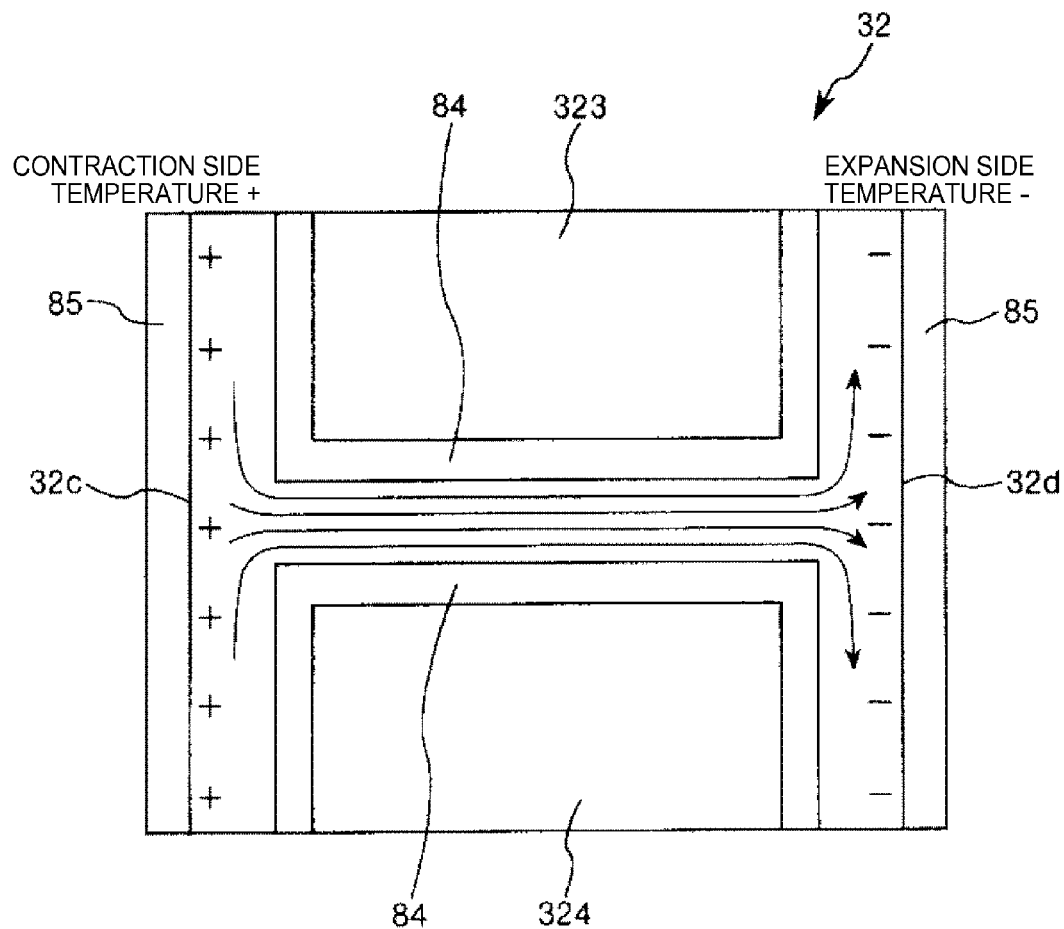
FIG. 5 is a cross-sectional view of a vibrating arm illustrating heat conduction at the time of flexural vibration.
Figure 6:
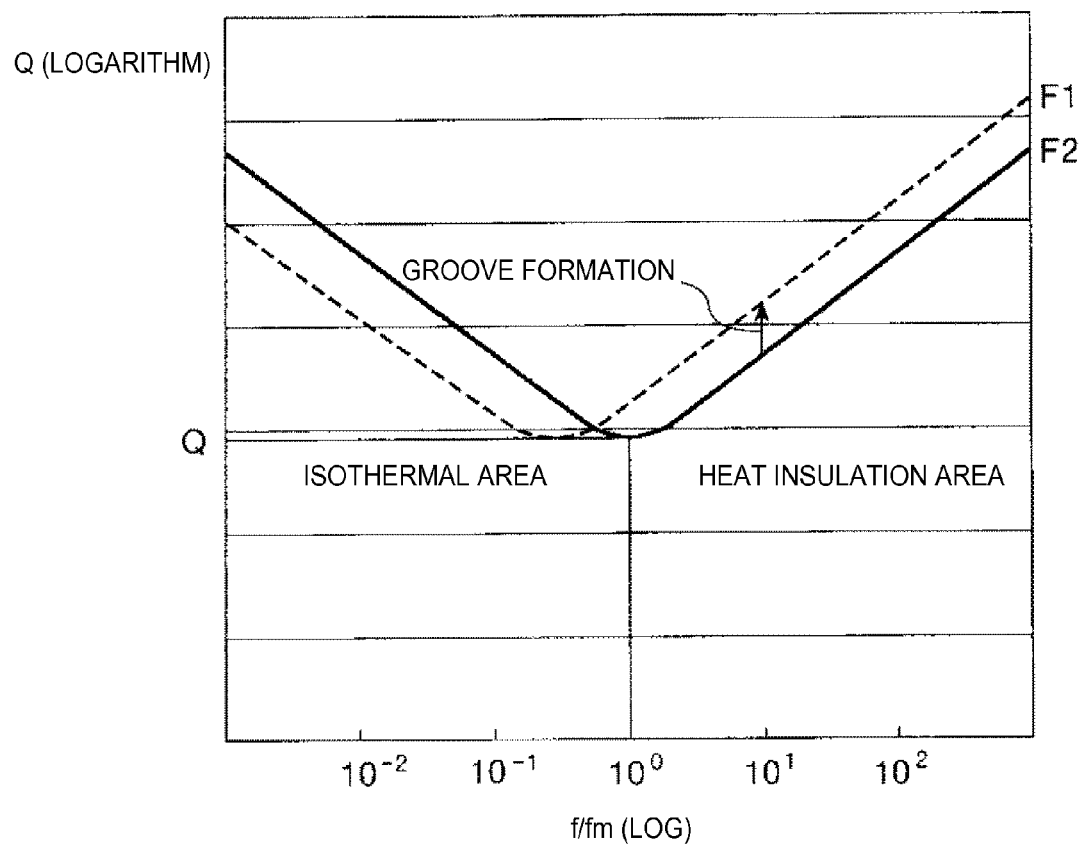
FIG. 6 is a graph showing a relationship between a Q value and f/fm.
Figure 7:
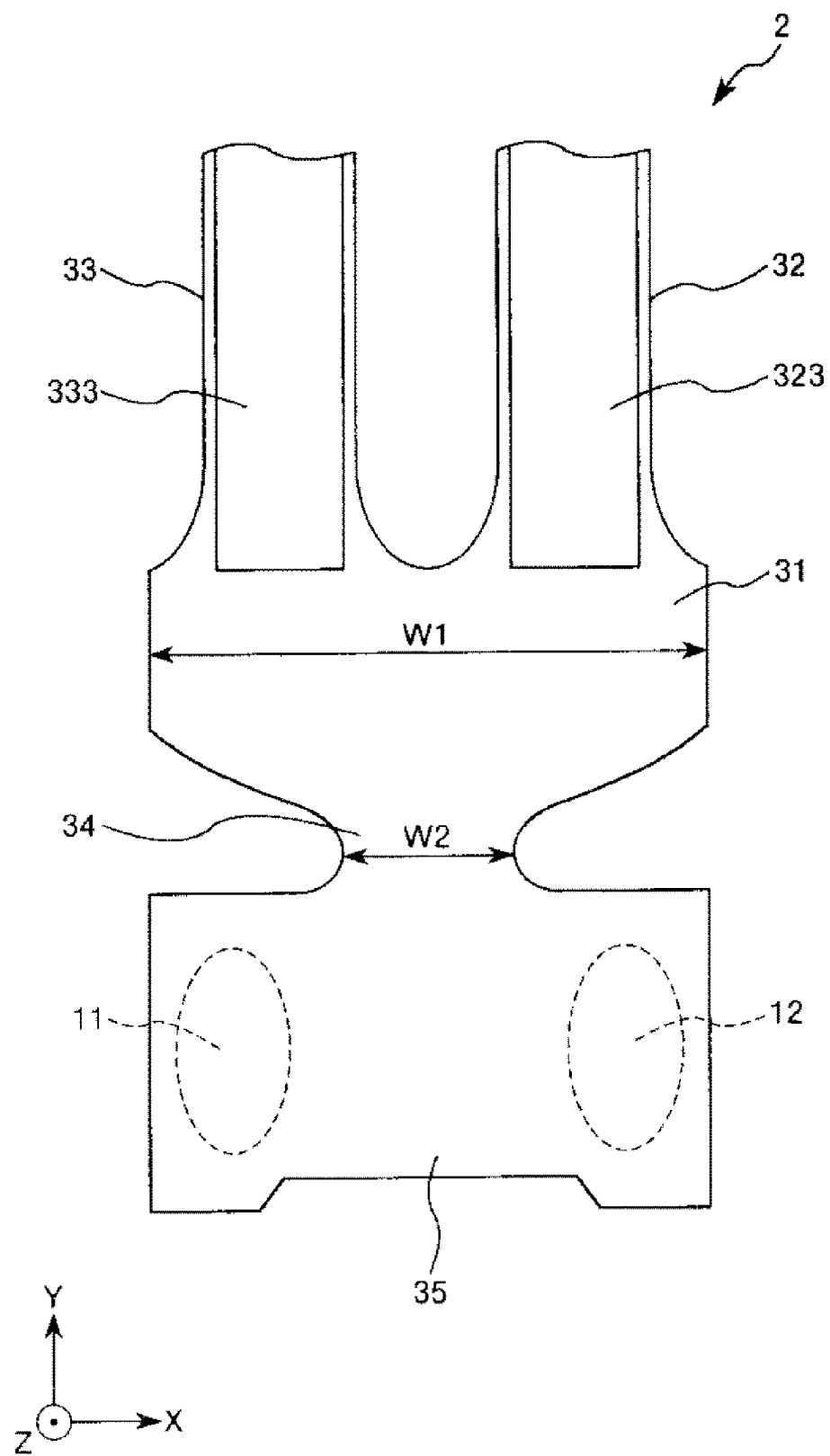
FIG. 7 is a partially enlarged plan view of a resonator device included in a resonator shown in FIG. 1.
Figure 9:
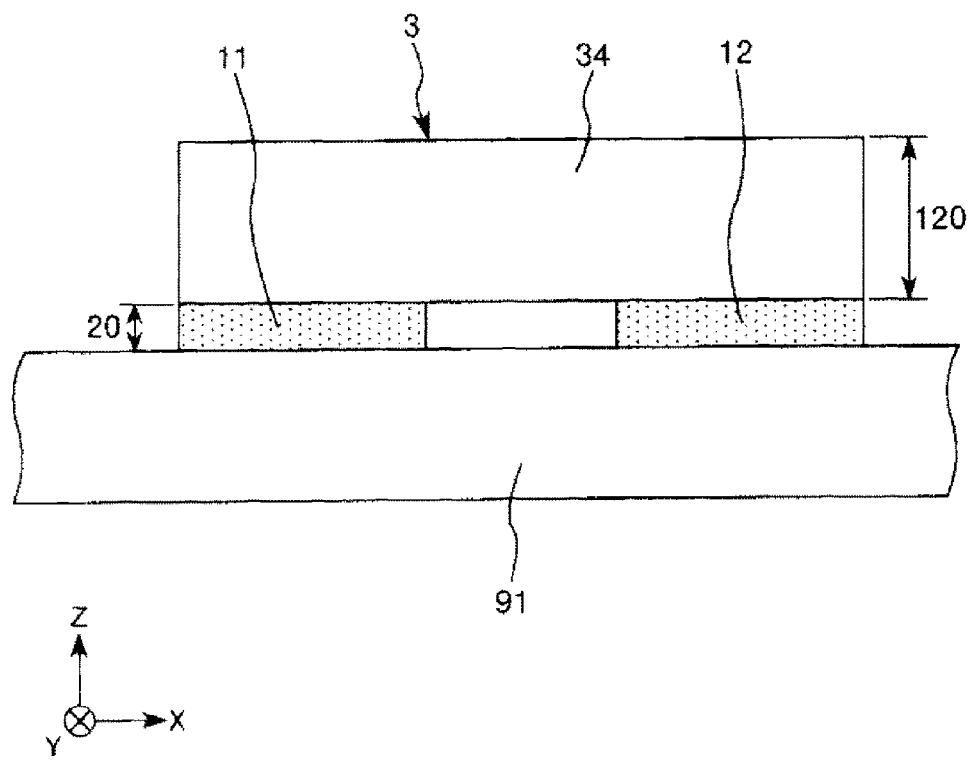
FIG. 9 is a side view showing a state where a crystal resonator element used in a simulation is attached to a base.
Figure 12:
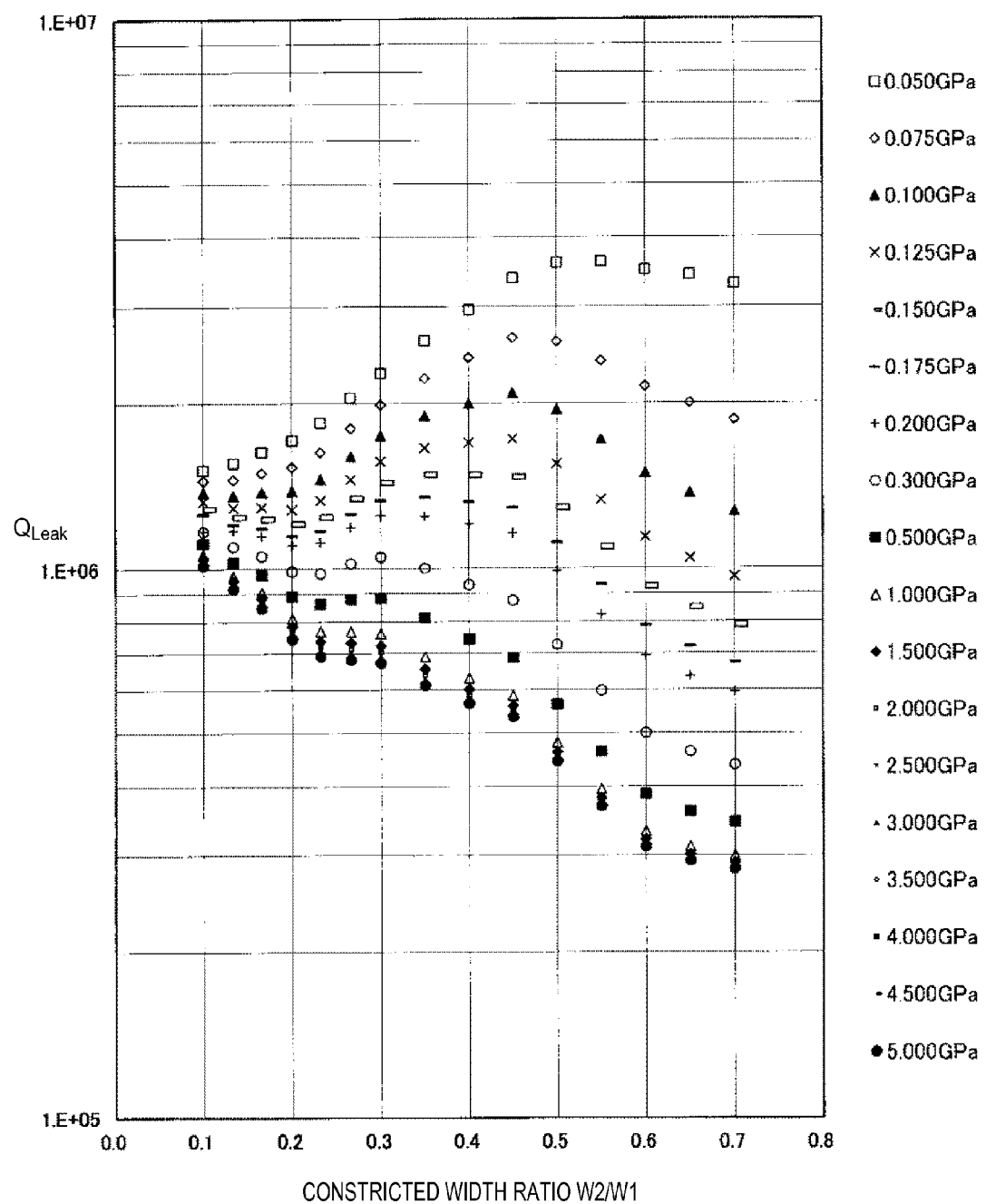
FIG. 12 is a graph showing a relationship between W2/W1 and a Q value.
Figure 13:
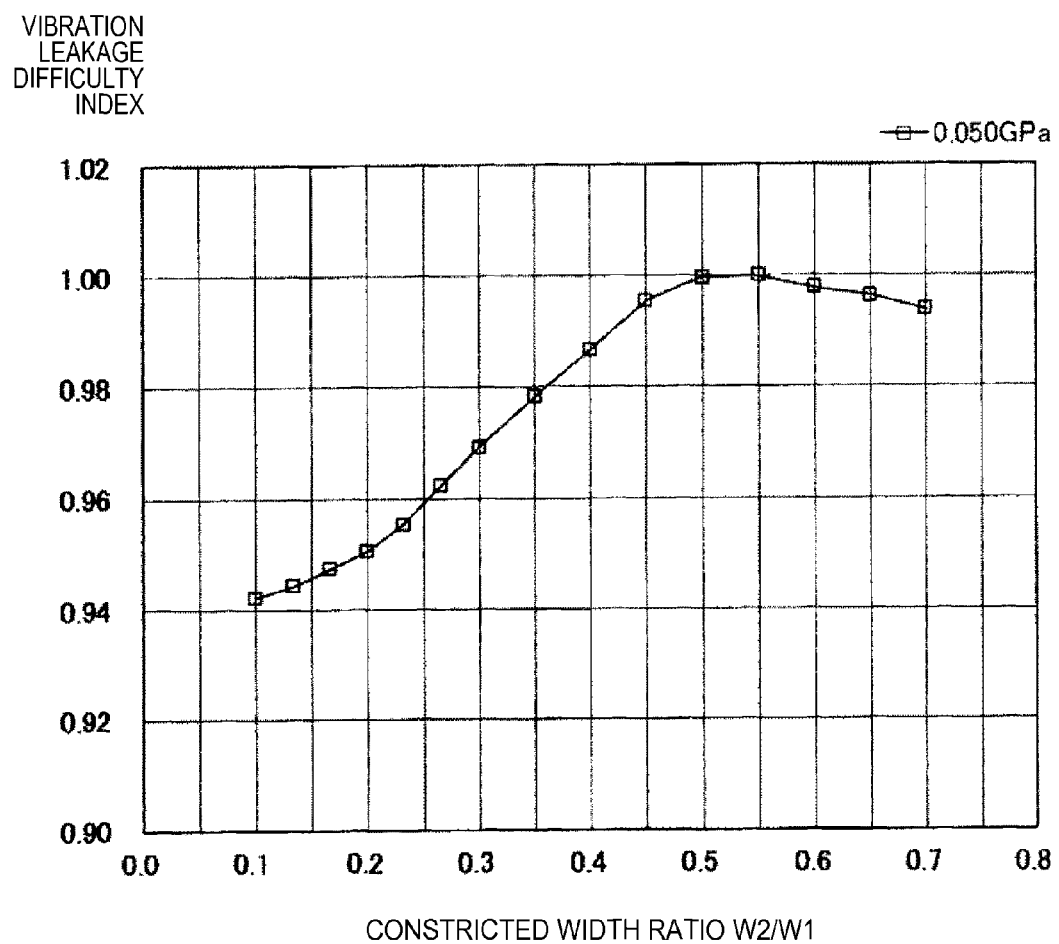
FIG. 13 is a graph showing a relationship between W2/W1 and a vibration leakage difficulty index.
Figure 14:
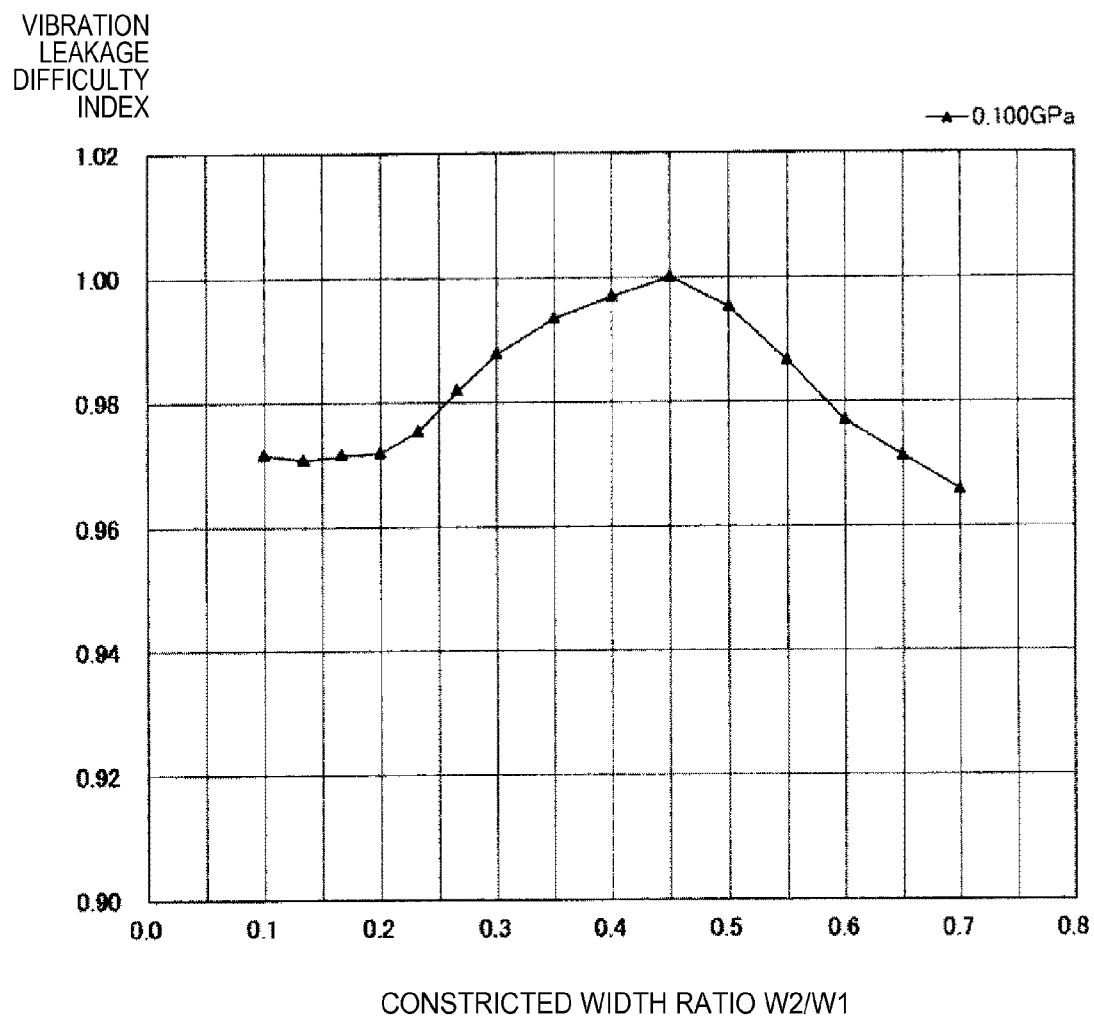
FIG. 14 is a graph showing a relationship between W2/W1 and a vibration leakage difficulty index.
Figure 15:
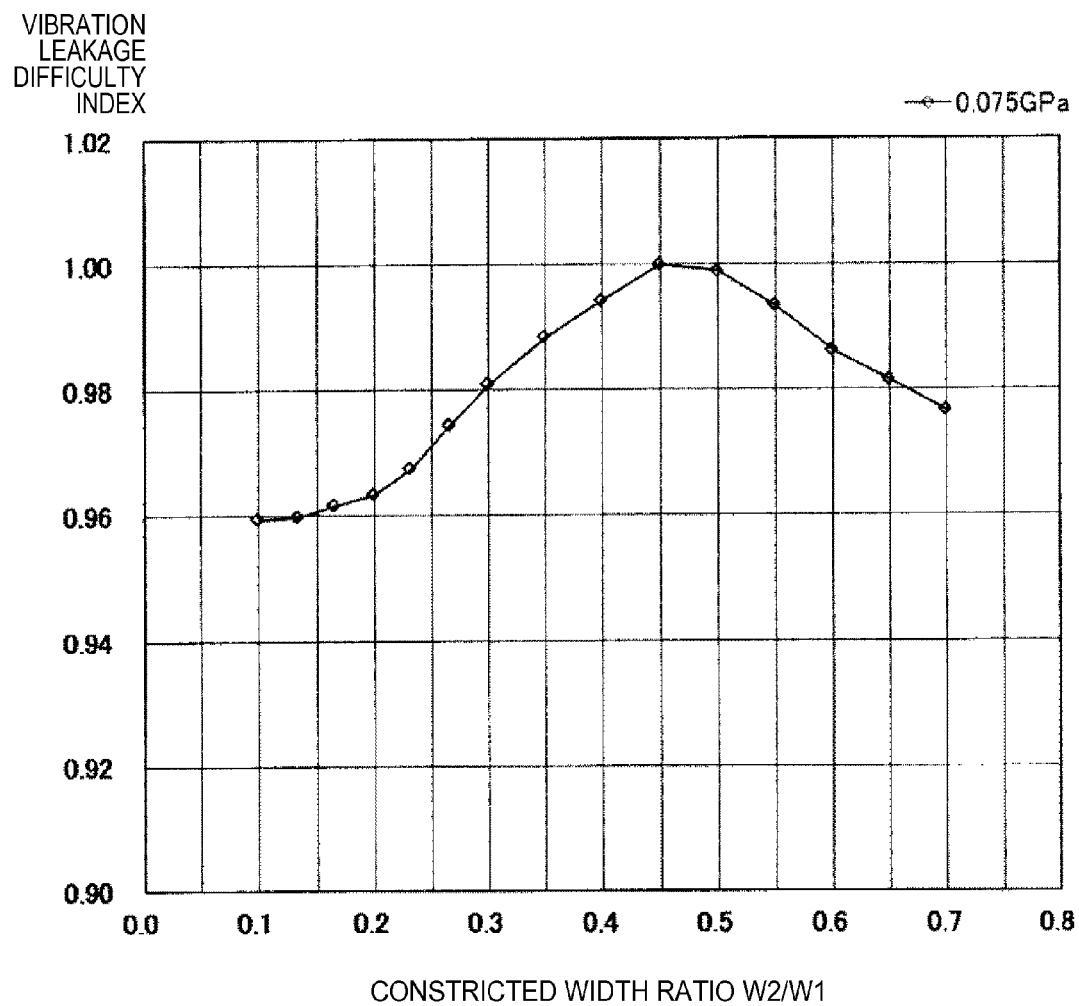
FIG. 15 is a graph showing a relationship between W2/W1 and a vibration leakage difficulty index.
Figure 16:
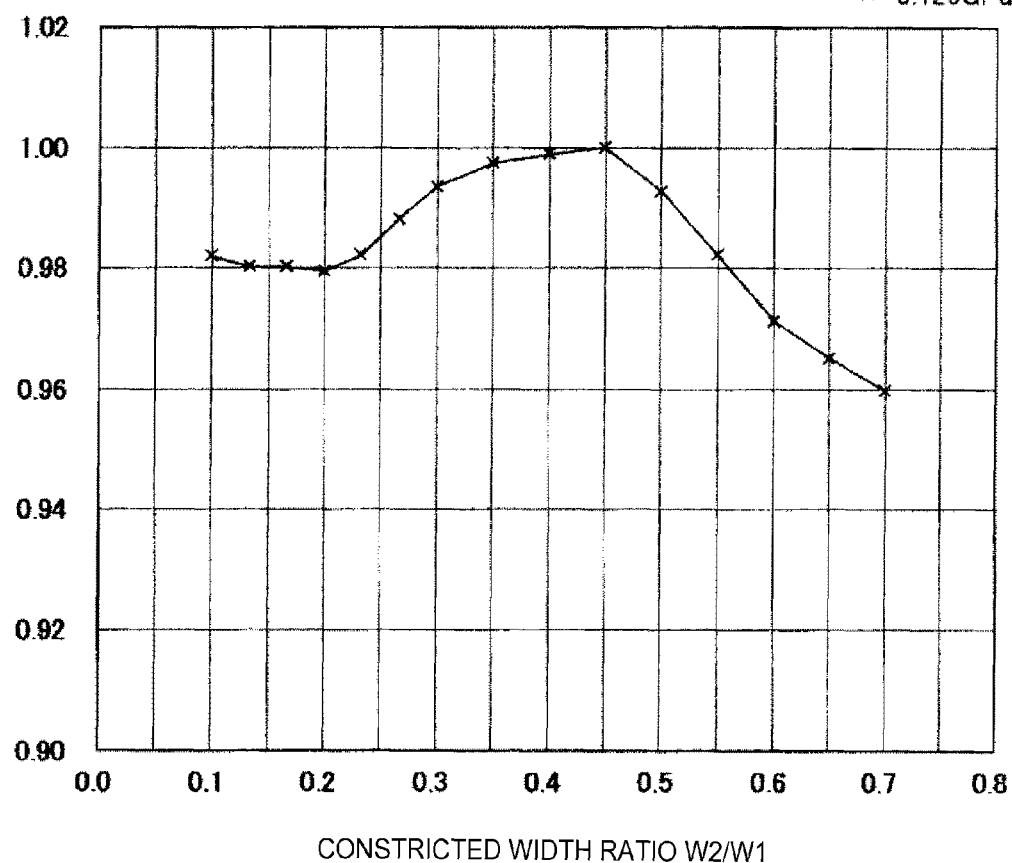
FIG. 16 is a graph showing a relationship between W2/W1 and a vibration leakage difficulty index.
Figure 17:
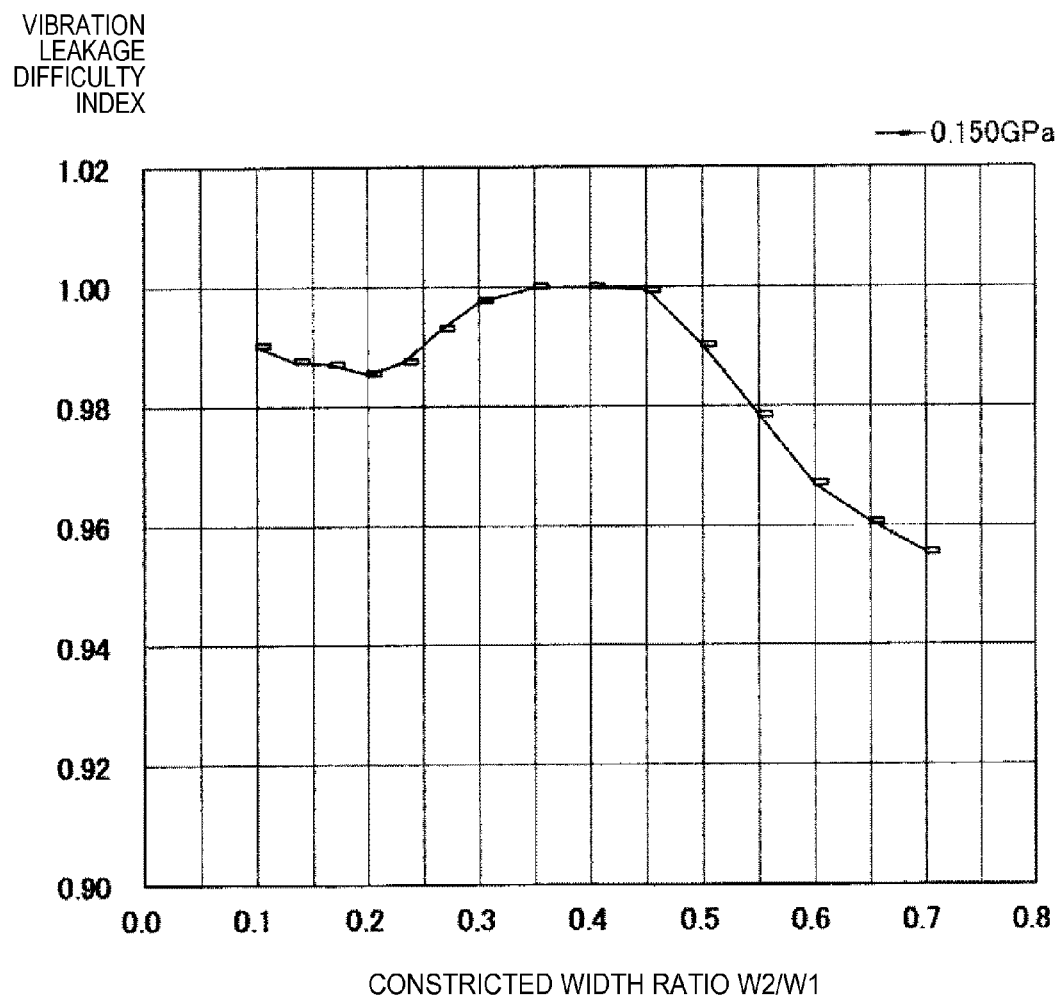
FIG. 17 is a graph showing a relationship between W2/W1 and a vibration leakage difficulty index.
Figure 18:
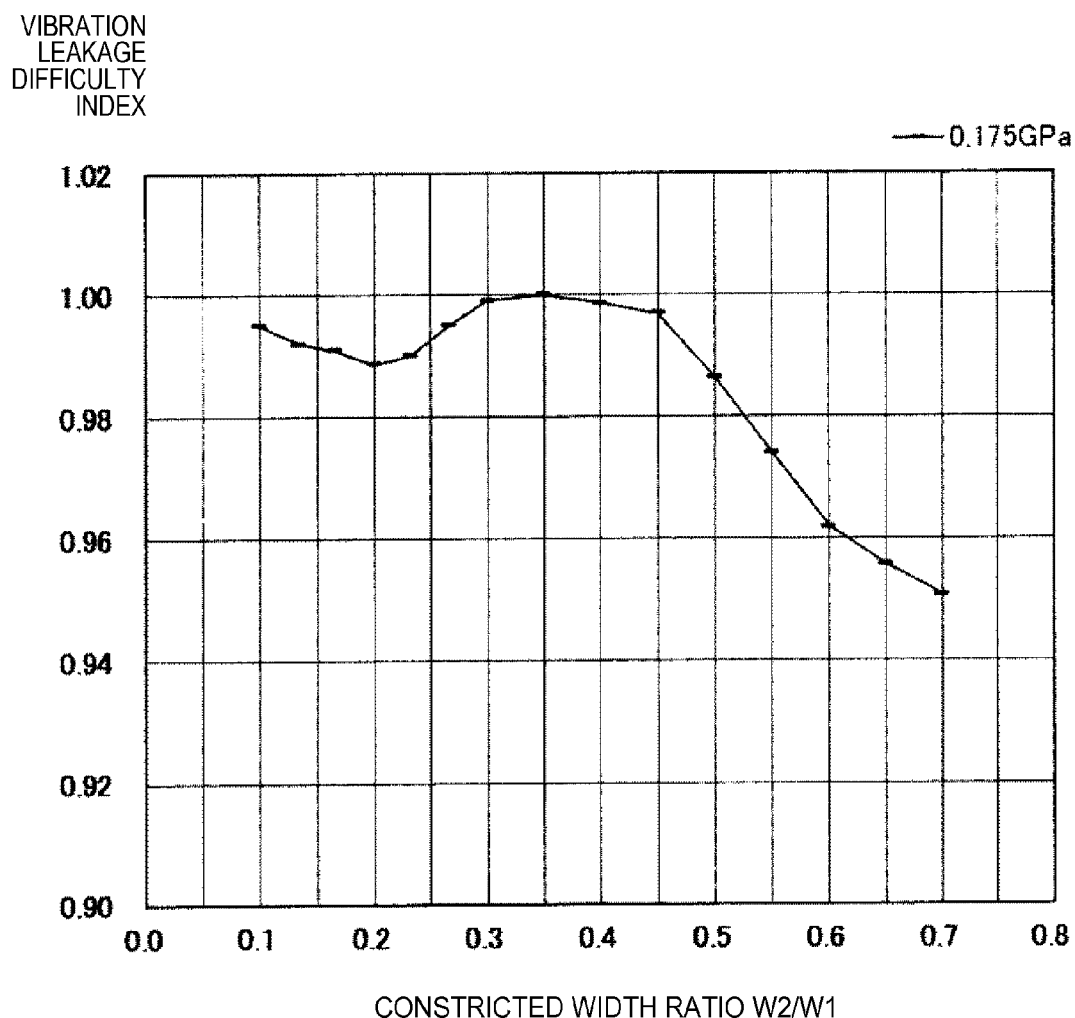
FIG. 18 is a graph showing a relationship between W2/W1 and a vibration leakage difficulty index.
Figure 19:
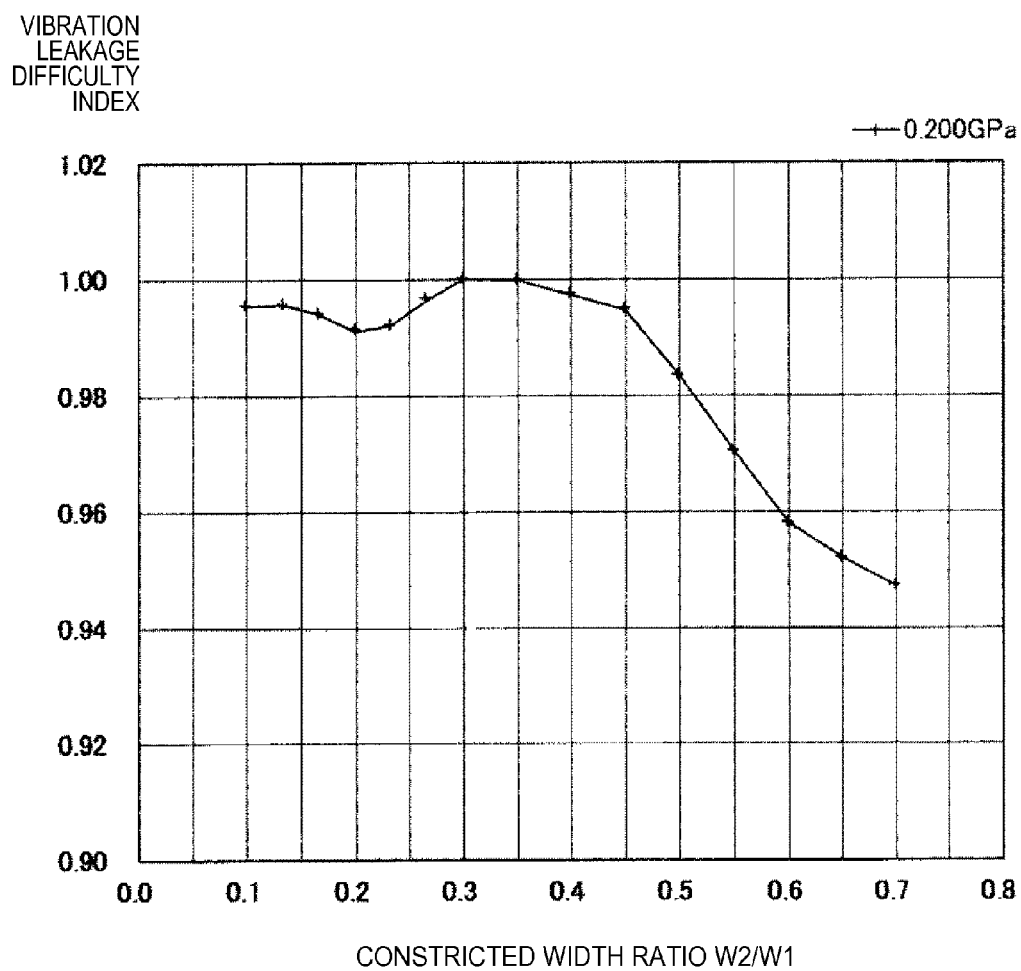
FIG. 19 is a graph showing a relationship between W2/W1 and a vibration leakage difficulty index.
Figure 20:
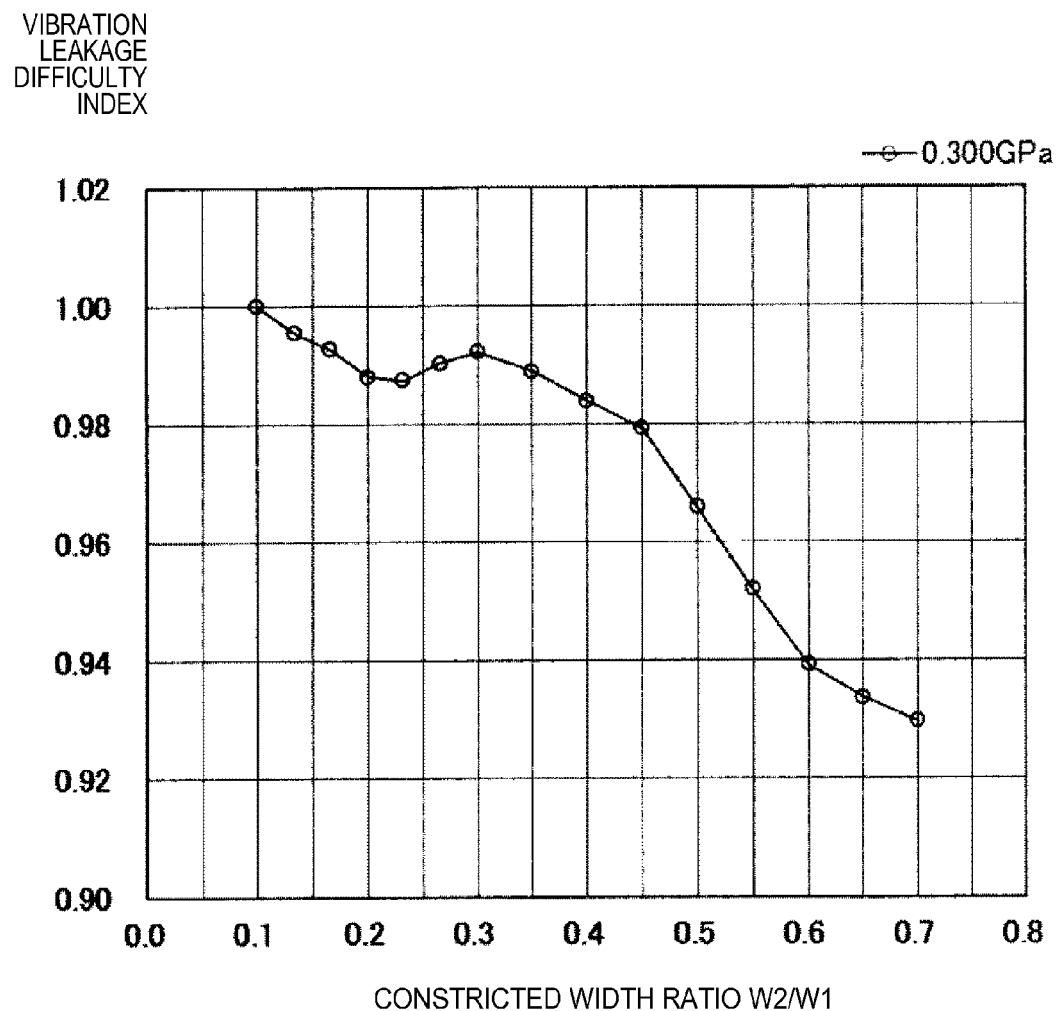
FIG. 20 is a graph showing a relationship between W2/W1 and a vibration leakage difficulty index.
Figure 21:
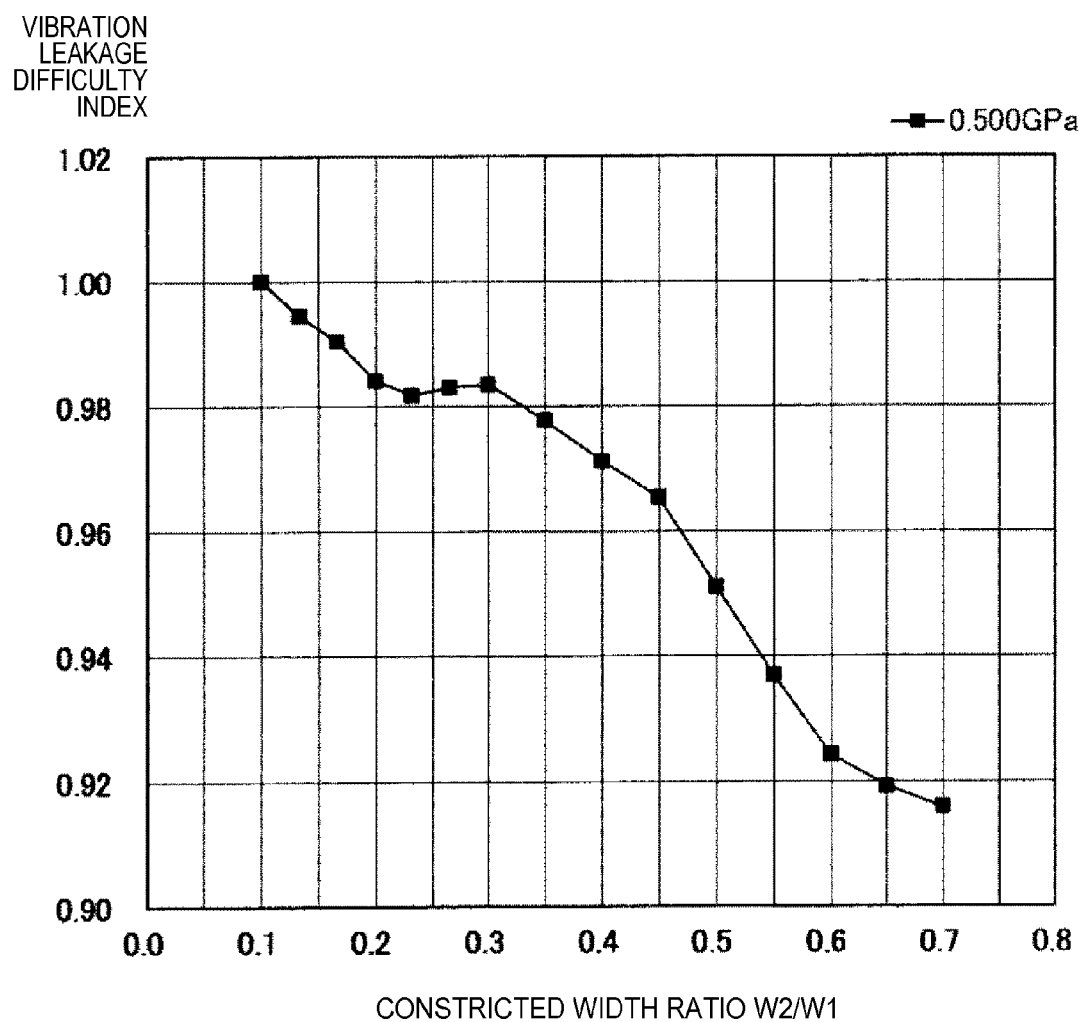
FIG. 21 is a graph showing a relationship between W2/W1 and a vibration leakage difficulty index.
Figure 22:
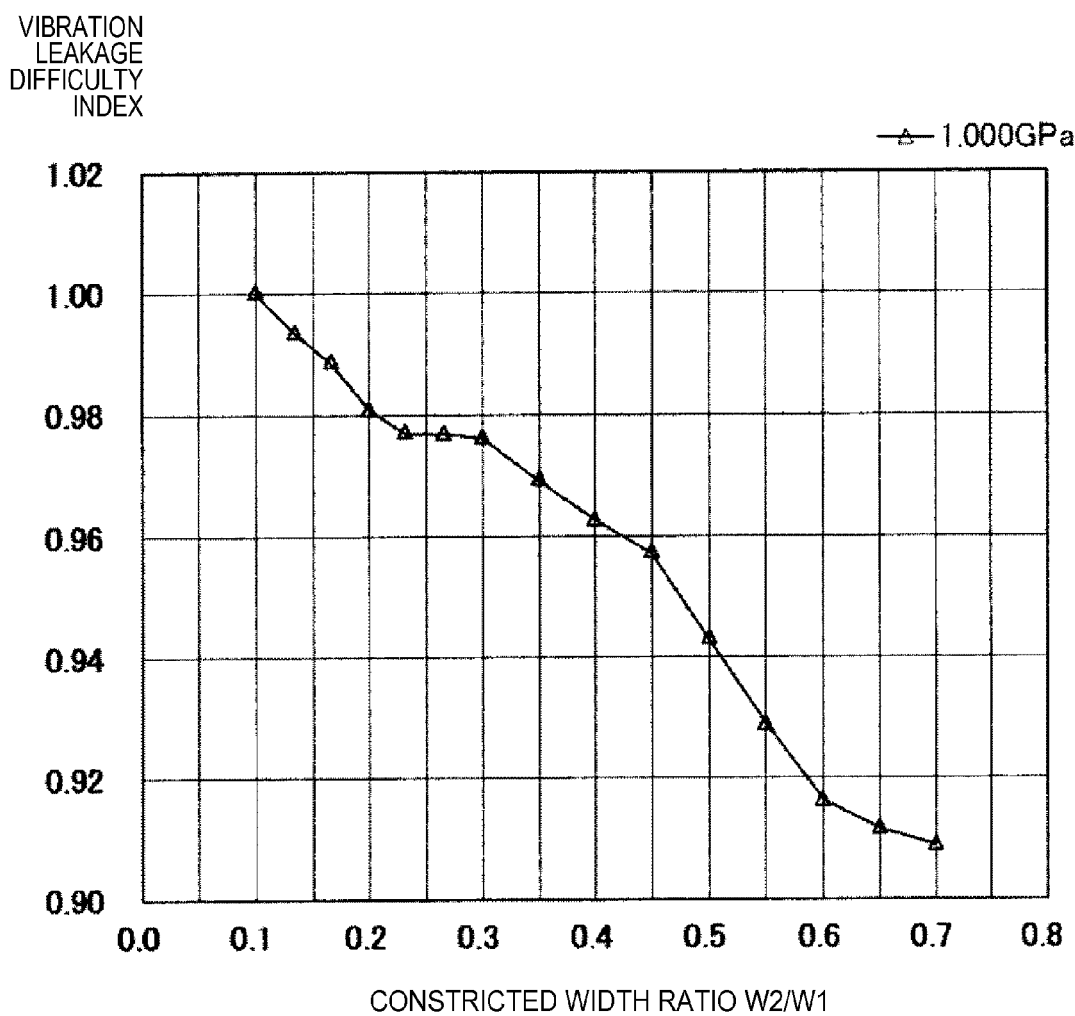
FIG. 22 is a graph showing a relationship between W2/W1 and a vibration leakage difficulty index.
Figure 23:
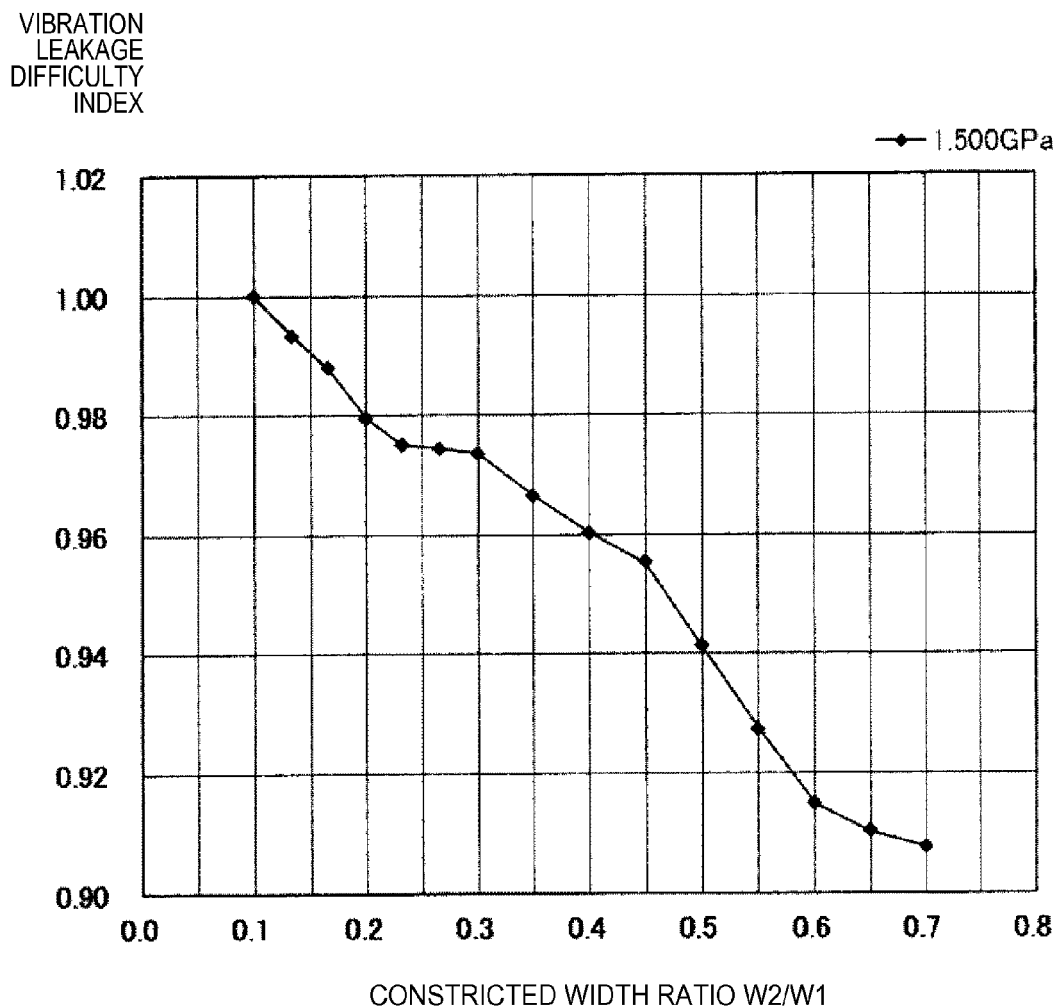
FIG. 23 is a graph showing a relationship between W2/W1 and a vibration leakage difficulty index.
Figure 24:
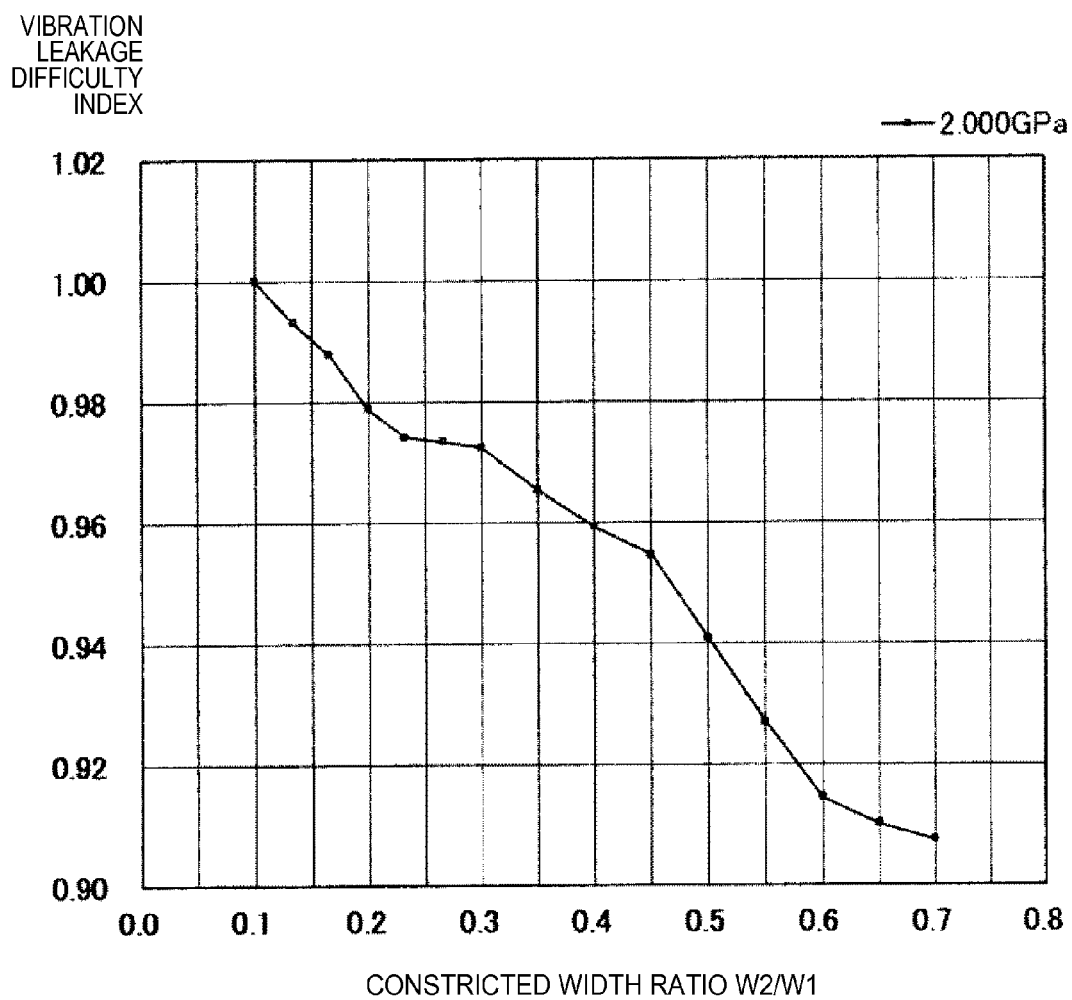
FIG. 24 is a graph showing a relationship between W2/W1 and a vibration leakage difficulty index.
Figure 25:
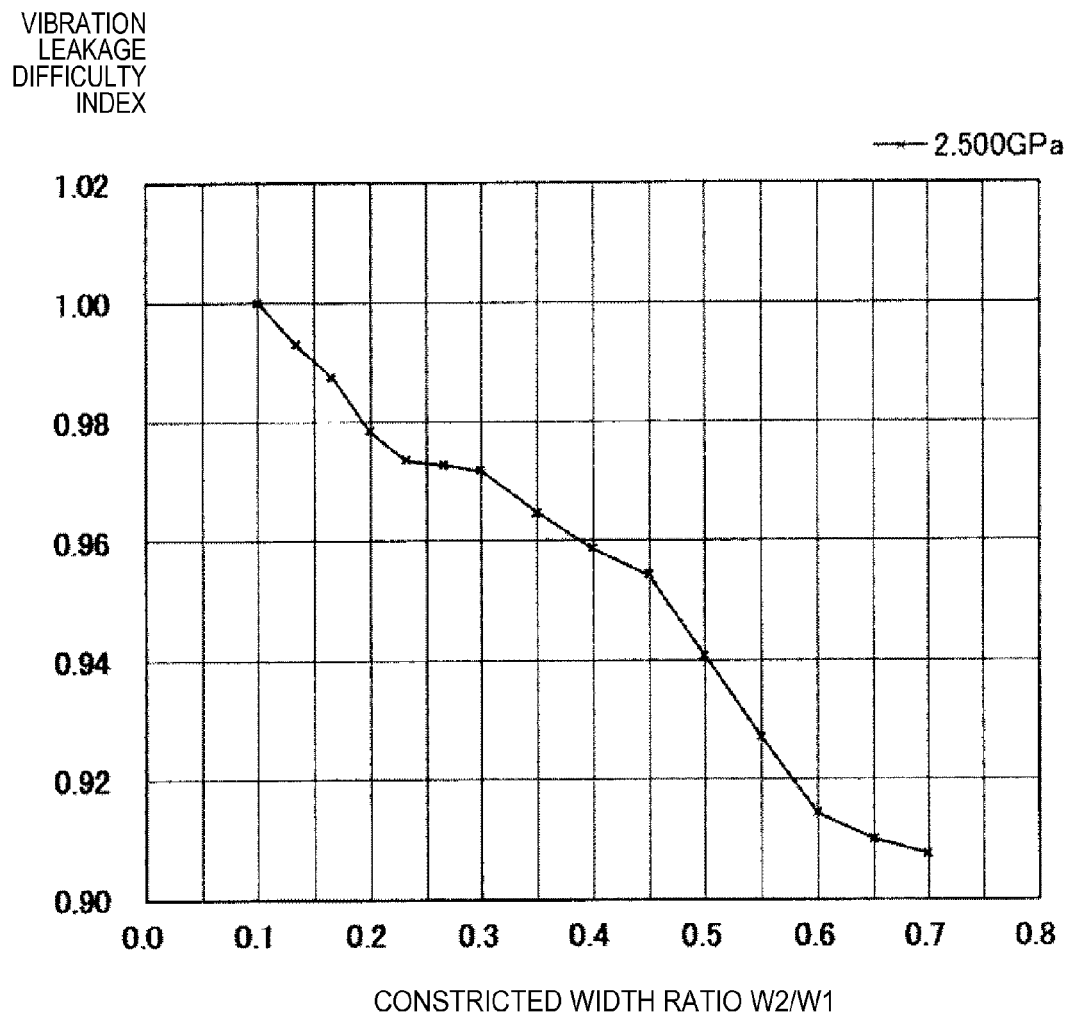
FIG. 25 is a graph showing a relationship between W2/W1 and a vibration leakage difficulty index.
Figure 26:
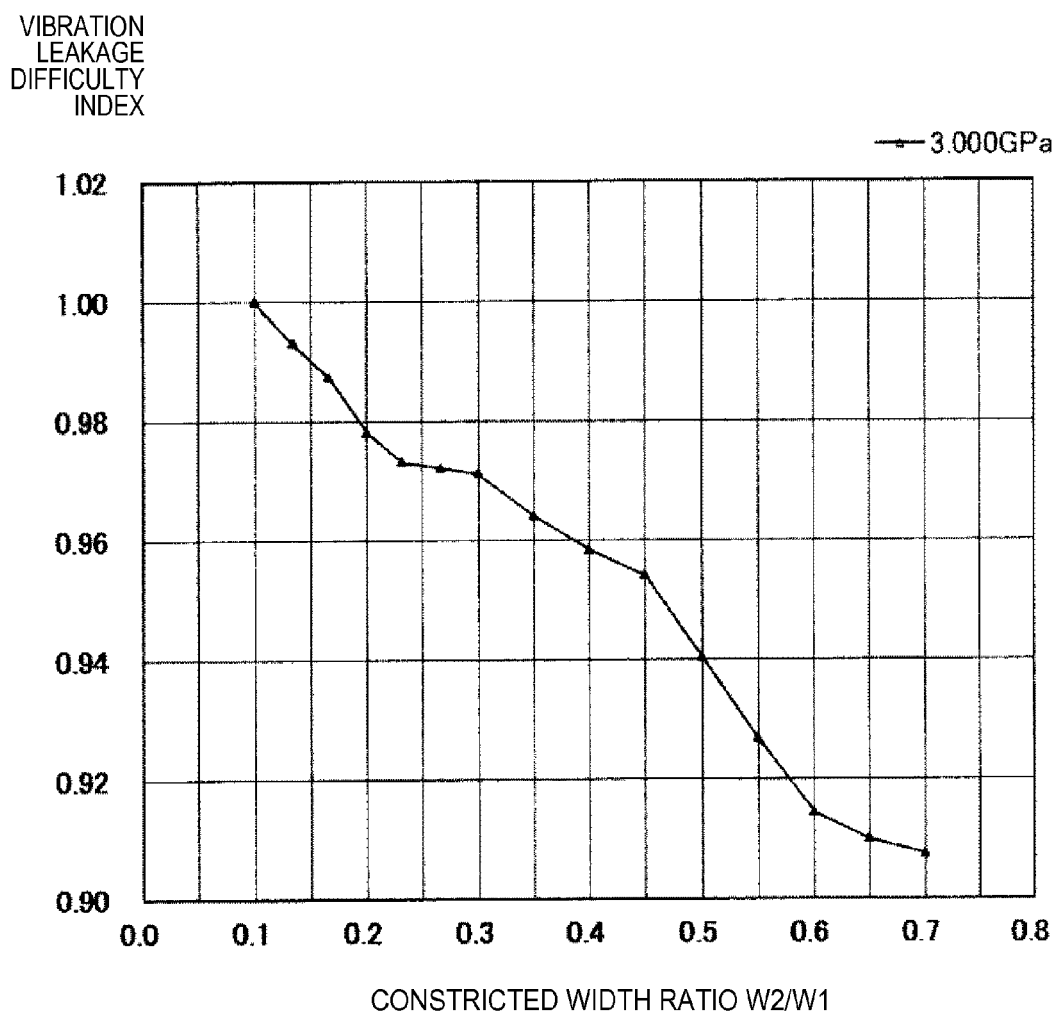
FIG. 26 is a graph showing a relationship between W2/W1 and a vibration leakage difficulty index.
Figure 27:
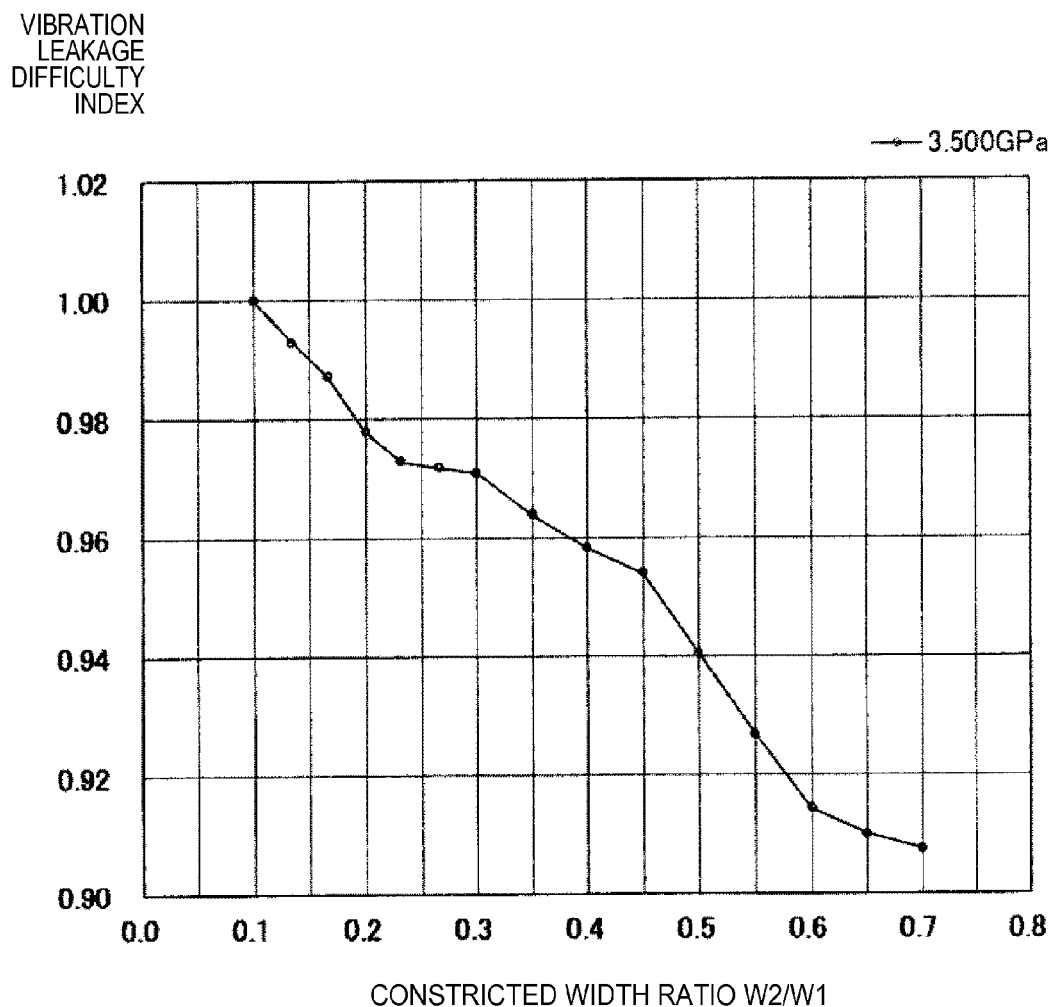
FIG. 27 is a graph showing a relationship between W2/W1 and a vibration leakage difficulty index.
Figure 28:
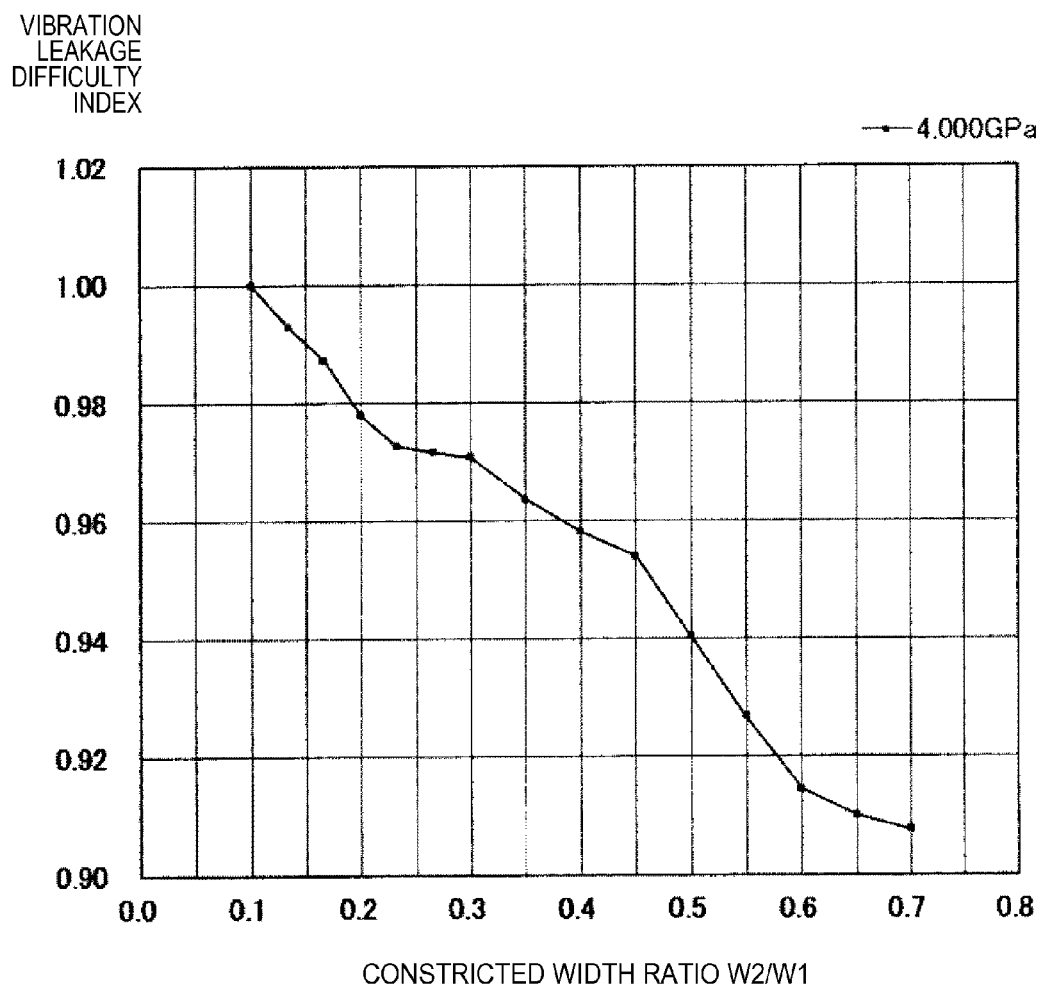
FIG. 28 is a graph showing a relationship between W2/W1 and a vibration leakage difficulty index.
Figure 29:
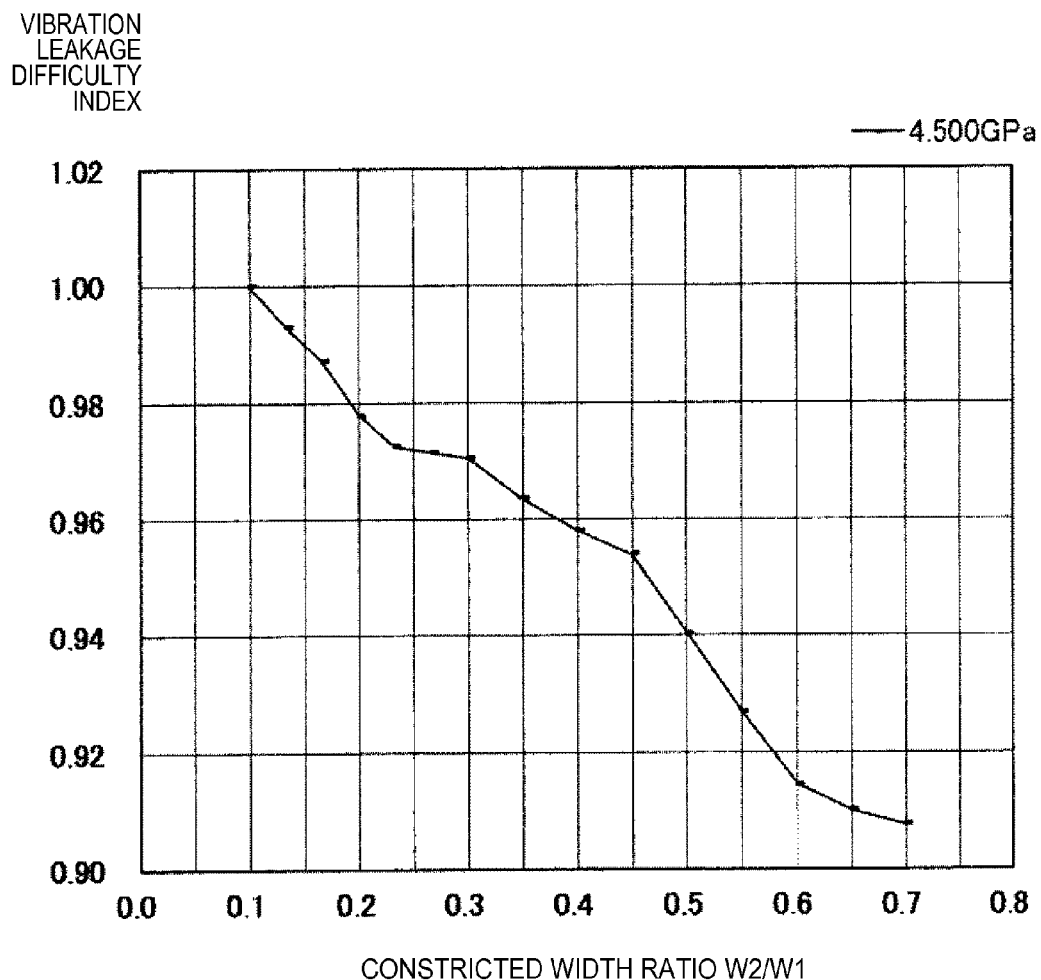
FIG. 29 is a graph showing a relationship between W2/W1 and a vibration leakage difficulty index.
Figure 30:
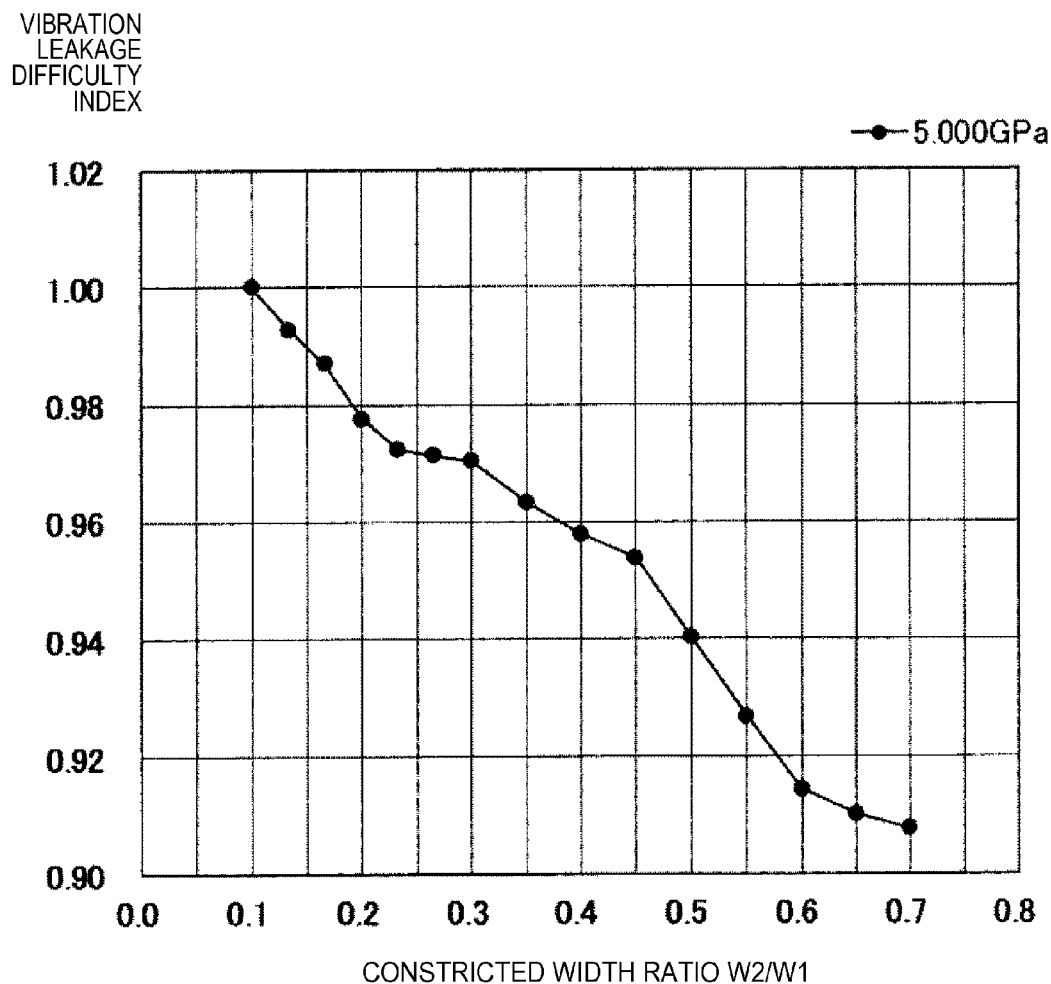
FIG. 30 is a graph showing a relationship between W2/W1 and a vibration leakage difficulty index.
Figure 32:
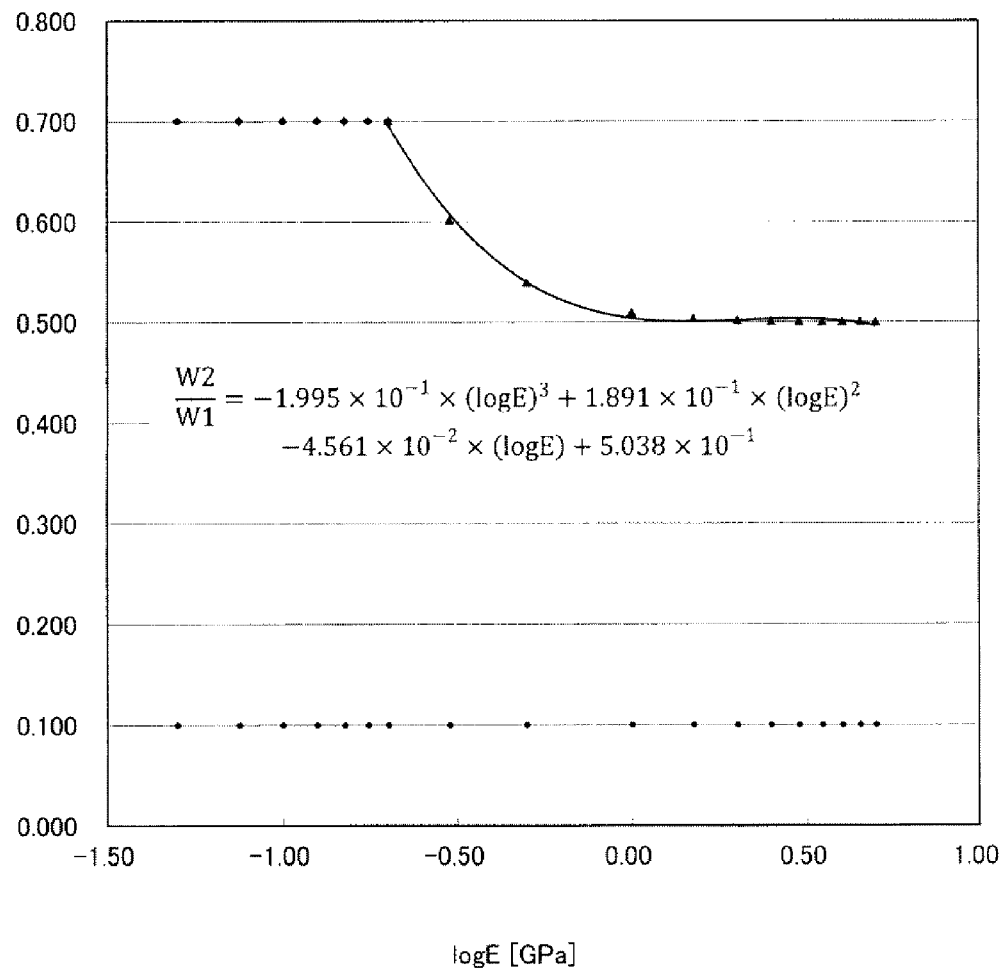
FIG. 32 is a graph showing a relationship between a Young's modulus of a conductive adhesive and W2/W1.

FIG. 1 is a plan view of a resonator according to a first embodiment of the invention. FIG. 2 is a cross-sectional view taken along line A-A of FIG. 1. FIG. 3 is a cross-sectional view taken along line B-B of FIG. 1. FIG. 4 is a cross-sectional view showing a vibrating arm formed by wet etching. FIG. 5 is a cross-sectional view of the vibrating arm illustrating heat conduction at the time of flexural vibration. FIG. 6 is a graph showing a relationship between a Q value and f/fm. FIG. 7 is a partially enlarged plan view of a resonator device included in the resonator shown in FIG. 1. FIGS. 8A and 8B are a plan view and a cross-sectional view showing dimensions of a crystal resonator element used in a simulation. FIG. 9 is a side view showing a state where the crystal resonator element used in a simulation is attached to a base. FIG. 10 and FIG. 11 are tables showing simulation results relating to vibration leakage. FIG. 12 is a graph showing a relationship between W2/W1 and a Q value. FIG. 13 to FIG. 30 are graphs showing relationships between W2/W1 and a vibration leakage difficulty index. FIG. 31 is a table showing a relationship between W2/W1 and the vibration leakage difficulty index. FIG. 32 is a graph showing a relationship between a Young's modulus of a conductive adhesive and W2/W1.

Hereinafter, for convenience of description, the upper side of FIG. 2 is set as "up" and the lower side of FIG. 2 is set as "down". The upper side of FIG. 1 is set as a "distal end" and the lower side of FIG. 1 is set as a "proximal end".

As shown in FIG. 1, the resonator 1 includes a resonator device 2, and a package 9 which accommodates the resonator device 2.

Package

As shown in FIG. 1 and FIG. 2, the package 9 includes a box-shaped base 91 including a recess 911 which is opened to an upper surface, and a plate-shaped lid 92 which is bonded to the base 91 so as to close the opening of the recess 911. The package 9 includes an accommodation space S which is formed by closing the recess 911 by the lid 92, and accommodates the resonator device 2 in the accommodation space S in an air-tight manner. An atmosphere in the accommodation space S is not particularly limited, but a depressurized state (vacuum state) is preferable. Accordingly, air resistance against excitation of the resonator device 2 is decreased, and therefore it is possible to exhibit excellent vibration characteristics. A degree of vacuum in the accommodation space S is not particularly limited, but is preferably approximately equal to or smaller than 100 Pa and is more preferably approximately equal to or smaller than 10 Pa. Inert gas such as nitrogen, helium, or argon may be sealed in the accommodation space S.

A constituent material of the base 91 is not particularly limited, and various ceramics such as aluminum oxide can be used. A constituent material of the lid 92 is not particularly limited, but a member having a close coefficient of linear expansion to that of the constituent material of the base 91 is preferable. For example, when the ceramics described above are used as the constituent material of the base 91, an alloy such as Kovar is preferably used. A bonding method of the base 91 and the lid 92 is not particularly limited, and these can be bonded to each other with a metalized layer, for example.

Connection terminals 951 and 961 are formed on a bottom surface of the recess 911 of the base 91. A conductive adhesive (fixing member) 11 is provided on the connection terminal 951 and a conductive adhesive (fixing member) 12 is provided on the connection terminal 961. The resonator device 2 is attached to the base 91, the connection terminal 951 is electrically connected to a first excitation electrode 84 which will be described later, and the connection terminal 961 is electrically connected to a second excitation electrode 85 which will be described later, with the conductive adhesives 11 and 12.

The conductive adhesives 11 and 12 are not particularly limited, as long as these both have conductivity and adhesiveness, and a conductive adhesive obtained by mixing conductive filler such as silver particles with an epoxy, acrylic, silicon, polyimide, bismaleimide, polyester, or polyurethane adhesive (resin) can be used.

A Young's modulus E [GPa] of the conductive adhesives 11 and 12 (above-described adhesives) satisfies a relationship of the following formula (1). When the relationship of the following formula (1) is satisfied, it is possible to have the flexible conductive adhesives 11 and 12. Therefore, it is possible to absorb and relax thermal stress generated from a difference of a coefficient of thermal expansion between the base 91 and the resonator device 2 by the conductive adhesives 11 and 12, and it is possible to decrease degradation or a change of the vibration characteristics of the resonator device 2.

$$-1.3 \leq \log E \leq 0.7 \quad (1)$$

If the Young's modulus E of the conductive adhesives 11 and 12 is smaller than a lower limit value of the formula (1), the conductive adhesives 11 and 12 become excessively flexible. Accordingly, when impact such as falling is applied thereto, the resonator device 2 may be greatly displaced with respect to the package 9, and for example, a concern of the vibrating arms which may come in contact with the package 9 to be damaged increases.

In contrast, when the Young's modulus of the conductive adhesives 11 and 12 exceeds an upper limit value of the formula (1), the conductive adhesives 11 and 12 become excessively hard. Accordingly, when the impact such as falling is applied thereto, the stress is concentrated on the bonded portion between the resonator device 2 and the conductive adhesives 11 and 12, for example, and a concern of the resonator device 2 which may be damaged from the stress-concentrated portions increases. A resonance frequency in an X common mode which is an unnecessary vibration mode easily approaches a resonance frequency in an X reversed-phase mode which is an excitation mode of the resonator device 2, and a concern of an increase of the vibration leakage increases.

Herein, when the Young's modulus E is 1.0 GPa, a relationship of log E=0 GPa is satisfied, and therefore the formula (1) described above can also be represented as the following formula (2).

$$0.05 \, (\text{GPa}) \leq E \leq 5.00 \, (\text{GPa}) \quad (2)$$

A Poisson ratio of the conductive adhesives 11 and 12 is not particularly limited, but is preferably approximately from 0.20 to 0.40. A thickness T1 of the conductive adhesives 11 and 12 is not particularly limited, but is preferably approximately from 5 μm to 50 μm and more preferably approximately from 15 μm to 25 μm. Mass density of the conductive adhesives 11 and 12 is not particularly limited, but is preferably approximately from 500 kg/m³ to 10000 kg/m³ and more preferably approximately from 3000 kg/m³ to 6000 kg/m³.

As shown in FIG. 2, the connection terminal 951 is electrically connected to an external terminal 953 provided on a lower surface of the base 91, through a penetration electrode 952 which penetrates a bottom portion of the base 91, and the connection terminal 961 is electrically connected to an external terminal 963 provided on a lower surface of the base 91, through a penetration electrode 962 which penetrates the bottom portion of the base 91, in the same manner. The configuration of the connection terminals 951 and 961, the penetration electrodes 952 and 962, and the external terminals 953 and 963 is not particularly limited, as long as these have conductivity, and a configuration in which a plated layer of Au (gold), Ag (silver), or Cu (copper) is formed on abase layer of Cr (chrome), Ni (nickel), W (tungsten), or molybdenum (Mo) can be used.

Resonator Device

As shown in FIG. 1 to FIG. 3, the resonator device 2 includes a crystal resonator element (resonator element) 3, and the first excitation electrode 84 and the second excitation electrode 85 formed on the crystal resonator element 3. In FIG. 1 and FIG. 2, for convenience of description, the first and second excitation electrodes 84 and 85 are omitted.

The crystal resonator element 3 is configured with a Z cut crystal plate. The Z cut crystal plate is a crystal substrate substantially using a Z axis as a thickness direction. In the crystal resonator element 3, the thickness direction and the Z axis may coincide with each other, but the Z axis is slightly inclined with respect to the thickness direction, in order to decrease a change in a frequency temperature around the room temperature. That is, when the inclined angle is set as θ degrees ($-5° \leq \theta \leq 15°$), an X axis in a orthogonal coordinate system configured with the X axis as an electrical axis of the quartz crystal, a Y axis as a mechanical axis, and a Z axis as an optical axis, is set as a rotation axis, an axis obtained by inclining the Z axis by θ degrees so that the positive Z side thereof rotates in the negative Y direction of the Y axis is set as a Z' axis, and an axis obtained by inclining the Y axis by θ degrees so that the positive Y side thereof rotates in the positive Z direction of the Z axis is set as a Y' axis, a direction along the Z' axis is set as a thickness and a surface including the X axis and the Y' axis is used as a main surface in the crystal resonator element 3. The X axis, the Y axis, and the Z axis are shown in each drawing.

The crystal resonator element 3 has the Y axis direction as a length direction, the X axis direction as a width direction, and the Z axis direction as a thickness direction. The crystal resonator element 3 has substantially the same thickness substantially over the entire area (excluding areas where grooves 323, 324, 333, and 334 which will be described later are formed) thereof. A thickness T of the crystal resonator element 3 is not particularly limited, but is preferably approximately from 100 µm to 140 µm. Accordingly, as will be described later, it is possible to sufficiently widen the areas of the first and second excitation electrodes 84 and 85 disposed on side surfaces of vibrating arms 32 and 33, and therefore, it is possible to sufficiently decrease a CI value. In addition, it is possible to secure a sufficient length of a heat transfer path (see FIG. 6) which will be described later, and therefore, it is possible to sufficiently decrease a thermoelastic loss. When the thickness of the crystal resonator element is smaller than the lower limit value, a mechanical strength is not sufficient, and the crystal resonator element 3 may be damaged, and when the thickness thereof exceeds the upper limit value, it is difficult to create a fine shape by wet etching, and the excessively large size of the resonator device 2 may be obtained.

The crystal resonator element 3 includes a base portion 31, the pair of vibrating arms 32 and 33 which extend in the positive Y axis direction from the end (one end) of the base portion 31 on the positive Y axis side, a connection portion 34 which is disposed on the negative Y axis side of the base portion 31, and a linkage portion 35 which is positioned between the base portion 31 and the connection portion 34 and links between the base portion 31 and the connection portion 34. The base portion 31, the vibrating arms 32 and 33, the connection portion 34, and the linkage portion 35 are integrally formed from the crystal substrate.

The base portion 31 has a plate shape having an expanse in an XY plane and having a thickness in the Z axis direction. The linkage portion 35 extends in the negative Y axis direction from the end of the base portion 31 on the negative Y axis side (the other end side). The connection portion 34 is connected to the end of the linkage portion 35 on the negative Y axis side, and the connection portion 34 extends to both sides of the X axis direction from the linkage portion 35.

In the resonator device 2, the connection portion 34 is attached to the base 91 by the conductive adhesives 11 and 12. As described above, it is possible to stably attach the resonator device 2 to the base 91 using the two conductive adhesives 11 and 12.

Herein, a width of the linkage portion 35 is smaller than that of the base portion 31. That is, the linkage portion 35 is constricted with respect to the base portion 31. In addition, it also can be said that the linkage portion 35 is formed by forming cut-out portions 31a and 31b which are formed on both edges of the base portion by partially constricting the dimension of the base portion 31 in the width direction, in a position sufficiently separated from the end portion of the base portion 31 on the side of the vibrating arms 32 and 33 (positive Y axis side). By providing such a linkage portion 35, when performing the flexural vibration so as to separate the vibrating arms 32 and 33 from each other, for example, portions of the base portion 31 in the vicinity of the boundary of the cut-out portions 31a and 31b interact with each other so as to offset the vibration against each other while being compressed from the vibrating arms 32 and 33 towards the linkage portion 35. When the constricted shape is not provided for the cut-out portions 31a and 31b, the offset of the vibration is substantially limited to the X axis direction, but when the constricted shape is provided for the cut-out portions 31a and 31b, the offset relating to the Y axis direction is also efficiently carried out in addition to that relating to the X axis direction, and accordingly, it is possible to decrease transfer of vibration leakage occurring at the time of the flexural vibration to the connection portion 34 and to suppress a decrease of the CI value of the resonator device 2. That is, the resonator device 2 having excellent vibration characteristics is obtained, by providing the linkage portion 35.

Particularly, in the embodiment, a first constriction portion 311 is provided on the end portion of the base portion 31 on the negative Y axis side. A width (length in the X axis direction) of the first constriction portion 311 continuously decreases towards the negative Y axis side (with distance from the end of the base portion 31 on the positive Y axis side), along a center line LL (Y axis) between the vibrating arms 32 and 33. The first constriction portion 311 is provided symmetrically with respect to the center line LL. By providing such a first constriction portion 311, it is possible to decrease displacement (vibration) of the base portion 31 in the Y axis direction accompanied with the flexural vibration of the vibrating arms 32 and 33. As a result, it is possible to obtain the resonator device 2 with small vibration leakage. In addition, by providing such a first constriction portion 311, it is possible to increase a separation distance between the end of the base portion 31 on the positive Y axis side and the end thereof on the negative Y axis side, compared to a case where the first constriction portion 311 is not provided. When performing the flexural vibration so as to separate the vibrating arms 32 and 33 from each other, regarding the base portion 31 in the vicinity of the boundary of the cut-out portions 31a and 31b, the temperature increases with the compression from the vibrating arms 32 and 33 towards the linkage portion 35, and the temperature decreases with the expansion of the periphery of one end side (end portion in the positive Y axis direction) of the base portion 31 interposed between the proximal end portions (end portions in the negative Y axis direction) of the vibrating arms 32 and 33. When performing the flexural vibration so as to make the vibrating arms 32 and 33 approach each other, regarding the base portion 31 in the vicinity of the boundary of the cut-out portions 31a and 31b, a temperature decreases with the expansion from the vibrating arms 32 and towards the linkage portion 35, and the temperature increases with the compression of the periphery of one end side (end portion in the positive Y axis direction) of the base portion 31 interposed between the proximal end portions (end portions in the negative Y axis direction) of the vibrating arms 32 and 33. However, by providing the first constriction portion 311, a length of a path necessary for heat transfer occurring therebetween increases, and therefore, it is possible to decrease a thermoelastic loss in a heat insulation area which will be described later.

Herein, the outline of the first constriction portion 311 is an arch, but there is no limitation as long as the operations described above are realized. For example, the outline thereof may be formed stepwise with a plurality of straight lines, that is, a width (length in the X axis direction) thereof may decrease in a stepwise manner towards the negative Y axis side, along the center line LL, the outline thereof may be provided by imitating an arch with the plurality of straight lines, or each portion of the first constriction portion 311 facing the cut-out portions 31a and 31b may be provided with the single straight line.

The vibrating arms 32 and 33 are arranged in the X axis direction and extend in the positive Y axis direction from the end of the base portion 31 on the positive Y axis side so as to be in parallel with each other. Each of the vibrating arms 32 and 33 has a longitudinal shape, in which a proximal end (end on the negative Y axis side) thereof is set as a fixed end and a distal end (end on the positive Y axis side) thereof is set as a free end. The vibrating arms 32 and 33 respectively include arms 321 and 331 which extend from the base portion 31, and hammer heads 322 and 332 as weight portions which are positioned on the distal end portion of the arms 321 and 331 and widths of which are greater than those of the arms 321 and 331. As described above, by providing the hammer heads 322 and 332 on the distal end side of the vibrating arms 32 and 33, it is possible to shorten the vibrating arms 32 and 33 and to realize miniaturization of the resonator device 2. As it is possible to shorten the vibrating arms 32 and 33, it is possible to decrease a vibration velocity of the vibrating arms 32 and 33 when vibrating the vibrating arms 32 and 33 at the same frequency to be lower than that in the related art, and therefore, it is possible to decrease air resistance when the vibrating arms 32 and 33 are vibrated, and the Q value increases to that extent, and it is possible to improve the vibration characteristics.

Herein, a separation distance W7 between the hammer heads 322 and 332 is not particularly limited, but it is preferable to satisfy a relationship of $0.033\ T\ (\mu m) \leq W7 \leq 0.33\ T\ (\mu m)$ with respect to a thickness T (μm) of the vibrating arms 32 and 33, for example. Accordingly, when forming the crystal resonator element 3 using a photolithography technology and a wet etching technology, a relationship between the separation distance W7 between the hammer heads 322 and 332 and the thickness T of the vibrating arms 32 and 33 (hammer heads 322 and 332) is optimized, and as a result, the microminiaturized crystal resonator element 3 is formed.

The hammer heads 322 and 332 as the weight portions having the width greater than that of the arms are described as examples, but there is no limitation, and the hammer heads having mass density per unit length higher than that of the arms 321 and 331 may be used. Examples thereof include hammer heads having portions thicker than the arms, hammer heads provided with a thick metal such as Au, or hammer heads formed of a material having high mass density (material different from that of the arm and which is doped with respect to the same material as that of the arm). These may be used in combination.

Hereinafter, a calculation method of the relational expression described above will be described. When the time necessary for penetrating the Z cut crystal plate having the thickness T (μm) by wet etching is set as m1 (minute), the time for the actual working for the Z cut crystal plate is set as m2 (minute), and the sum of amounts (side-etched amounts) of the Z cut crystal plate etched in the positive and negative X axis directions for the time m2 using a predetermined coefficient as k is set as ΔX (μm), ΔX can be expressed as $\Delta X = m2/m1 \times T \times k$. In this formula, when a relationship of m1=m2 is satisfied, a formula of $\Delta X = T \times k$ ... (Equation A) is obtained.

Here, the wet etching is performed from the main surfaces of the front and back sides until the Z cut crystal plate having the thickness T of 100 (μm) is actually penetrated, and the wet etching is completed when the Z cut crystal plate is penetrated. When ΔX is measured at that time, ΔX was 1.63 (μm). By substituting this measured value in (Equation A), k is calculated as 0.0163. When this is converted into a case of the wet etching performed from one main surface, k is calculated as 0.0326.

When creating the resonator device 2, the vibration leakage is suppressed with a high symmetry of the cross-sectional shapes of the vibrating arms 32 and 33 (hammer heads 322 and 332), and accordingly, $2 \leq m2/m1 \leq 30$ ... (Equation B) is preferable. In a case of the wet etching performed from the main surfaces of the front and back sides, a relationship of $0.033\ T\ (\mu m) \leq W7 \leq 0.489\ T\ (\mu m)$ is obtained, and in a case of the wet etching performed from the one main surface, a relationship of $0.065\ T\ (\mu m) \leq W7 \leq 0.978\ T\ (\mu m)$ is obtained, based on the (Equation B) and the (Equation A).

In order to miniaturize the resonator device 2, it is preferable to decrease the value of ΔX by performing the wet etching from a first main surface and a second main surface which are in a front-back relationship, and accordingly, the above-described relational expression $0.033\ T\ (\mu m) \leq W7 \leq 0.489\ T\ (\mu m)$ is derived. However, in the embodiment, the upper limit value thereof is set to be a smaller value as in the above-described relational expression $0.033\ T\ (\mu m) \leq W7 \leq 0.33\ T\ (\mu m)$. Therefore, the microminiaturization of the crystal resonator element 3 is realized.

Hereinafter, the vibrating arms 32 and 33 will be described, but the vibrating arms 32 and 33 have the same configuration, and therefore, hereinafter, the vibrating arm 32 will be described as a representative, and the description of the vibrating arm 33 will be omitted.

As shown in FIG. 3, the arm 321 includes a pair of main surfaces 32a and 32b which are configured with the XY plane in a front-back relationship, and a pair of side surfaces 32c and 32d which are configured with the YZ plane and connect the pair of main surfaces 32a and 32b. The arm 321 includes a bottomed groove 323 opened to the main surface 32a and a bottomed groove 324 opened to the main surface 32b. As described above, by forming the grooves 323 and 324 in the vibrating arm 32, it is possible to decrease the thermoelastic loss and to exhibit the excellent vibration characteristics. A length of the grooves 323 and 324 is not particularly limited, and a distal end thereof may extend to the hammer head 322 or a proximal end thereof may extend to the base portion 31. With the configuration described above, stress concentration on the boundary of the arm 321 and the hammer head 322 and the boundary of the arm 321 and the base portion 31 is relaxed, and a concern of fracture or cracks occurring when the impact is applied, decreases. The groove may be provided only on any one of the main surfaces 32a and 32b or may be omitted.

A depth t of the grooves 323 and 324 preferably satisfy the following formula (3), in the relationship with the thickness T of the vibrating arm 32. When the relationship of the following formula (3) is satisfied, the length of the heat transfer path increases as will be described later, and accordingly, it is possible to efficiently decrease the thermoelastic loss in the heat insulation area which will be described later. Therefore, it is possible to realize the improvement of the Q value, the decrease of the CI value accompanied therewith, and the decrease of the CI value by further widening an electrode area for applying an electrical field in a flexural deformity area.

$$0.4 \leq 2 \times \frac{t}{T} < 1 \tag{3}$$

When manufacturing the crystal resonator element 3 with a patterning by the wet etching of the crystal substrate, the cross-sectional shape of the arm 321 is a shape in which a crystal plane of the quartz crystal is exposed, as shown in FIG. 4. Specifically, since an etching rate in the negative X axis direction is lower than an etching rate in the positive X axis direction, the side surface in the negative X axis direction is comparatively gently inclined, and the side surface in the positive X axis direction is almost vertically inclined. As shown in FIG. 4, the depth t of the grooves 323 and 324 in this case is the depth in the deepest position. Herein, as shown in FIG. 4, the grooves 323 and 324 preferably include bottom surfaces 323a and 324a configured with the XY plane. Accordingly, it is possible to further increase the length of the heat transfer path, and it is possible to efficiently decrease the thermoelastic loss in the heat insulation area.

The grooves 323 and 324 are preferably formed by adjusting the position in the X axis direction with respect to the vibrating arm 32, so that the center of gravity of the cross section of the vibrating arm 32 coincides with the center of cross-sectional shape of the vibrating arm 32. By doing so, the unnecessary vibration (specifically, vibration having an out-of-plane direction component) of the vibrating arm 32 decreases, and accordingly, it is possible to decrease the vibration leakage. In this case, the excitation of the unnecessary vibration is reduced, and therefore, it is possible to relatively enlarge the excitation area and to decrease the CI value.

A width (length in the X axis direction) W3 of bank portions 32a' positioned on both sides in the X axis direction of the groove 323 of the main surface 32a of the arm 321 is not particularly limited, but it is preferable to satisfy a relationship of 7 µm≤W3≤15 µm. Accordingly, it is possible to decrease the heat transfer between the side surface 32c and the side surface 32d which will be described later, to decrease the thermoelastic loss, to improve the Q value to that extent, and to exhibit the excellent vibration characteristics.

A width (length in the X axis direction) W4 of the arm 321 is not particularly limited, but is preferably approximately from 13 µm to 300 µm and more preferably approximately from 30 µm to 150 µm. When the width W4 is smaller than the lower limit value, it is difficult to form the grooves 323 and 324 in the arm 321 by the manufacturing technology, and when the vibration frequency is in a range of 32.768 kHz±1 kHz, the vibrating arm 32 may not be the heat insulation area, and the thermoelastic loss may be increased due to the formation of the groove 323 or the groove 324. Meanwhile, when the width W4 exceeds the upper limit value, the rigidity of the arm 321 excessively increases depending on the thickness T of the crystal resonator element 3, and the flexural vibration of the arm 321 may not be smoothly performed according to the decrease in excitation power due to the low power consumption. As the vibrating arm 32 becomes heavy, fixing strength due to the conductive adhesives 11 and 12 is insufficient, and the resonator device 2 may be detached from the base 91 when the impact is applied. The width W4 herein is a width of a portion which is positioned in the center of the arm 321 and extends with the substantially constant width, and is not a width of a tapered portion which is positioned on both end portions.

When the total length (length in the Y axis direction) of the vibrating arm 32 is set as L and the total length (length in the Y axis direction) of the hammer head 322 is set as H, the L and the H preferably satisfy a relationship of the following formula (4). Accordingly, it is possible to decrease the thermoelastic loss and to improve the Q value to that extent. Therefore, the resonator device 2 having the excellent vibration characteristics is obtained. The total length H of the hammer head 322 means a length of a portion with the constant width on the distal end side of the tapered portion, excluding the tapered portion positioned in the proximal end portion (boundary with the arm 321) of the hammer head 322. The proximal end of the vibrating arm 32 is set to a terminal Pe of the tapered portion provided on the proximal end portion of the vibrating arm 32.

$$0.184 \leq \frac{H}{L} \leq 0.597 \tag{4}$$

When the total length (length in the Y axis direction) of the vibrating arm 32 is set as L and the total length (length in the Y axis direction) of the hammer head 322 is set as H, it is preferable to satisfy a relationship of the following formula (5). Accordingly, the resonator device 2 with the suppressed low CI value, the decreased vibration loss, and the excellent vibration characteristics is obtained.

$$0.012 < \frac{H}{L} < 0.30 \tag{5}$$

A width (length in the X axis direction) W5 of the hammer head 322 is not particularly limited, but is preferably from 1.5 times to 10 times the width W4 of the arm 321. That is, a relationship of 1.5×W4≤W5≤10×W4 is preferably satisfied. Accordingly, it is possible to sufficiently secure a great width of the hammer head 322. Thus, even when the length H of the hammer head 322 is comparatively small, it is possible to sufficiently exhibit the mass effect by the hammer head 322. Therefore, it is possible to suppress the total length L of the vibrating arm 32 and to realize the miniaturization of the resonator device 2. Since the flexural vibration is not pure in-plane vibration, the hammer head 322 may be greatly twisted and the vibration leakage may be increased at the time of the flexural vibration of the vibrating arm 32, as the W5 increases; however, this concern can be reduced.

Hereinabove, the shape of the crystal resonator element 3 has been described.

As shown in FIG. 3, the pair of first excitation electrodes 84 and the pair of second excitation electrodes 85 are formed in the vibrating arm 32 included in the crystal resonator element 3. One of the first excitation electrodes 84 is formed on the inner surface of the groove 323 and the other one thereof is formed on the inner surface of the groove 324. One of the second excitation electrodes 85 is formed on the side surface 32c and the other one thereof is formed on the side surface 32d. In the same manner as described above, the pair of first excitation electrodes 84 and the pair of second excitation electrodes 85 are also formed in the vibrating arm 33. One of the first excitation electrodes 84 is formed on the side surface 33c and the other one thereof is formed on the side surface 33d. One of the second excitation electrodes 85 is formed on the inner surface of the groove 333 and the other one thereof is formed on the inner surface of the groove 334.

Each of the first excitation electrodes 84 is extracted to a connection electrode 86 provided on the lower surface of the connection portion 34 by a wiring (not shown), and is electrically connected to the connection terminal 951 through the conductive adhesive 11 by the connection electrode 86. In the same manner as described above, each of the second excitation electrodes 85 is extracted to a connection electrode 87 provided on the lower surface of the connection portion 34 by a wiring (not shown), and is electrically connected to the connection terminal 961 through the conductive adhesive 12 by the connection electrode 87. When an alternating voltage is applied between the first and second excitation electrodes 84 and 85, the vibration of the vibrating arms 32 and 33 is performed in the X reversed-phase mode so that the vibrating arms repeatedly approach and are separation from each other.

The constituent material of the first and second excitation electrodes 84 and 85 is not particularly limited as long as it has conductivity, and a configuration in which a coating layer of Au (gold), Ag (silver), or Cu (copper) is formed on abase layer of Cr (chrome), Ni (nickel), W (tungsten), or molybdenum (Mo) can be used.

As the specific configuration of the first and second excitation electrodes 84 and 85, a configuration in which an Au layer having a thickness of 700 Å or less is formed on a Cr layer having a thickness of 700 Å or less can be used, for example. Particularly, since Cr or Au has the great thermoelastic loss, the thickness of the Cr layer and the Au layer is preferably 200 Å or less. When increasing the insulation breakdown resistance, the thickness of the Cr layer and the Au layer is preferably 1000 Å or more. In addition, since the coefficient of thermal expansion of Ni is close to the coefficient of thermal expansion of the quartz crystal, by using the Ni layer instead of the Cr layer as a base, it is possible to decrease thermal stress due to the electrode and to obtain the resonator device having an excellent long-term reliability (aging property).

Hereinabove, the configuration of the resonator device 2 has been described. As described above, by forming the grooves 323, 324, 333, and 334 in the vibrating arms 32 and 33 of the resonator device 2, it is possible to decrease the thermoelastic loss and to exhibit the excellent vibration characteristics. Hereinafter, these effects will be specifically described using the vibrating arm 32 as an example.

As described above, the vibrating arm 32 performs flexural vibration in the in-plane direction by applying the alternating voltage between the first and second excitation electrodes 84 and 85. As shown in FIG. 5, at the time of the flexural vibration, when the side surface 32c of the arm 321 is contracted, the side surface 32d thereof is expanded, and in contrast, when the side surface 32c thereof is expanded, the side surface 32d thereof is contracted. When the Gough-Joule effect of the vibrating arm 32 does not occur (energy elasticity is dominant over entropy elasticity), the temperature of the contracting surface side among the side surfaces 32c and 32d increases, and the temperature of the expanding surface side decreases. Accordingly, a difference in a temperature between the side surface 32c and the side surface 32d, that is, in the inner portion of the arm 321, is generated. A loss of a vibration energy occurs by the heat conduction occurring from the difference in the temperature, and accordingly, the Q value of the resonator device 2 decreases. The loss of the energy accompanied with the decrease of the Q value is also referred to as the thermoelastic loss.

In a resonator device which vibrates in a flexural vibration mode having the configuration of the resonator device 2, when a flexural vibration frequency (mechanical flexural vibration frequency) f of the vibrating arm 32 is changed, the Q value becomes the minimum value when the flexural vibration frequency of the vibrating arm 32 coincides with a thermal relaxation frequency fm. The thermal relaxation frequency fm can be acquired by the following formula (6). Herein, in the formula (6), π represents a circular constant, and when e is set as a Napier's constant, τ represents relaxation time necessary for obtaining the difference in the temperature to be $e^{-1}$ times by the heat conduction.

$$fm = \frac{1}{2\pi\tau} \quad (6)$$

When the heat relaxation frequency of the flat plate structure (structure of the rectangular cross-sectional shape) is set as fm0, the fm0 can be acquired by the following formula (7). In the formula (7), π represents a circular constant, k represents thermal conductivity of the vibrating arm 32 in the vibration direction, ρ represents the mass density of the vibrating arm 32, Cp represents thermal capacity of the vibrating arm 32, and a represents the width of the vibrating arm 32 in the vibration direction. When the constants of the material of the vibrating arm 32 (that is, quartz crystal) are input to the thermal conductivity k, the mass density ρ, and the thermal capacity Cp of the formula (7), the heat relaxation frequency fm0 to be acquired is a value in a case where the grooves 323 and 324 are not provided in the vibrating arm 32.

$$fm0 = \frac{\pi k}{2\rho C p a^2} \quad (7)$$

The grooves 323 and 324 are formed in the vibrating arm 32 so as to be positioned between the side surfaces 32c and 32d. Accordingly, the heat transfer path for balancing the difference in the temperature between the side surfaces 32c and 32d occurring at the time of the flexural vibration of the vibrating arm 32 by the heat conduction is formed so as to bypass the grooves 323 and 324, and the length of the heat transfer path increases more than the direct distance (shortest distance) between the side surfaces 32c and 32d. Thus, the relaxation time τ increases and the thermal relaxation frequency fm decreases, compared to a case where the grooves 323 and 324 are not provided in the vibrating arm 32.

FIG. 6 is a graph showing f/fm dependency of the Q value of the resonator device in the flexural vibration mode. In the drawing, a curve F1 shown with a dotted line shows a case where the grooves are formed in the vibrating arm as in the resonator device 2, and a curve F2 shown with a solid line shows a case where the grooves are not formed in the vibrating arm. In the drawing, the shape of the curves F1 and F2 does not change, but the curve F1 is shifted with respect to the curve F2 in a frequency decreasing direction, according to the decrease in the thermal relaxation frequency fm described above. Accordingly, when the thermal relaxation frequency in a case where the grooves are formed in the vibrating arm as in the resonator device 2 is set as fm1 and the following formula (8) is satisfied, the Q value of the resonator device in which the grooves are formed in the vibrating arm is constantly higher than the Q value of the resonator device in which the grooves are not formed in the vibrating arm.

$$f > \sqrt{fm0 \cdot fm1} \qquad (8)$$

When the relationship is limited to the relationship of the following formula (9), it is possible to obtain the higher Q value.

$$\frac{f}{fm0} > 1 \qquad (9)$$

In FIG. 6, an area satisfying the relationship of f/fm<1 is also referred to as an isothermal area, and the Q value increases as the value of f/fm decreases, in this isothermal area. This is because the difference in the temperature in the vibrating arm described above is difficult to be generated, as the mechanical frequency of the vibrating arm decreases (vibration of the vibrating arm is delayed). Accordingly, when the f/fm approaches 0 without limit, a quasi-isothermal operation is performed, and the thermoelastic loss approaches 0 without limit. Meanwhile, an area satisfying the relationship of f/fm>1 is also referred to as the heat insulation area, and the Q value increases as the value of f/fm increases, in this heat insulation area. This is because a speed of switching of the temperature increase and the temperature decrease of each side surface is high and the time for the heat conduction described above decreases, as the mechanical frequency of the vibrating arm increases. Accordingly, when the f/fm increases without limit, a heat insulation operation is performed, and the thermoelastic loss approaches 0 without limit. Therefore, to satisfy the relationship of the f/fm>1 can be, in other words, to have the value of f/fm in the heat insulation area.

Hereinabove, the thermoelastic loss has been described.

In the resonator device 2 described above, a relationship between the Young's modulus E (GPa) of the conductive adhesives 11 and 12, the width (length in the X axis direction) W1 of the base portion 31, and the width (length in the X axis direction) W2 of the linkage portion 35 is preferably the following pattern 1, more preferably the following pattern 2, and even more preferably the following pattern 3. When any of the patterns 1 to 3 is satisfied, the resonator 1 with the decreased vibration leakage can be obtained.

As shown in FIG. 7, the width W1 of the base portion 31 is a width of a portion with the greatest width, and the width W2 of the linkage portion 35 is a width of a portion with the smallest width. Both of the width W1 of the base portion 31 and the width W2 of the linkage portion 35 are limited by the outline of the front and back main surfaces.

Pattern 1

In the pattern 1, both of the following formulae (10) and (11) are satisfied, or both of the following formulae (12) and (13) are satisfied.

$$-1.3 \leq \log E < -0.7 \qquad (10)$$

$$0.1 \leq \frac{W2}{W1} \leq 0.7 \qquad (11)$$

$$-0.7 \leq \log E \leq 0.7 \qquad (12)$$

$$0.100 \leq \frac{W2}{W1} \leq -1.995 \times 10^{-1} \times (\log E)^3 + \qquad (13)$$
$$1.891 \times 10^{-1} \times (\log E)^2 - 4.561 \times 10^{-2} \times (\log E) + 5.038 \times 10^{-1}$$

Pattern 2

In the pattern 2, both of the following formulae (14) and (15) are satisfied, or both of the following formulae (16) and (17) are satisfied.

$$-1.3 \leq \log E < -1.0 \qquad (14)$$

$$1.167 \times (\log E)^2 + 2.168 \times (\log E) + 1.101 \leq \frac{W2}{W1} \leq 0.7 \qquad (15)$$

$$-1.0 \leq \log E \leq 0.7 \qquad (16)$$

$$0.100 \leq \frac{W2}{W1} \leq -1.100 \times 10^{-1} \times (\log E)^3 + \qquad (17)$$
$$1.433 \times 10^{-1} \times (\log E)^2 - 8.338 \times 10^{-2} \times (\log E) + 4.246 \times 10^{-1}$$

Pattern 3

In the pattern 3, both of the following formulae (18) and (19) are satisfied, or both of the following formulae (20) and (21) are satisfied.

$$-1.3 \leq \log E < -0.82 \qquad (18)$$

$$-9.877 \times 10^{-1} \times (\log E)^2 - 2.610 \times (\log E) - 1.370 \leq \qquad (19)$$
$$\frac{W2}{W1} \leq -1.219 \times 10^{-2} (\log E)^6 - 2.289 \times 10^{-1} \times (\log E)^5 -$$
$$3.460 \times 10^{-1} \times (\log E)^4 + 1.566 \times 10^{-1} \times (\log E)^3 +$$
$$4.112 \times 10^{-1} \times (\log E)^2 - 2.472 \times 10^{-1} \times (\log E) + 2.285 \times 10^{-1}$$

$$-0.82 \leq \log E \leq 0.7 \qquad (20)$$

$$0.100 \leq \frac{W2}{W1} \leq -1.219 \times 10^{-2} \times (\log E)^6 - 2.289 \times 10^{-1} \times (\log E)^5 - \qquad (21)$$
$$3.460 \times 10^{-1} \times (\log E)^4 + 1.566 \times 10^{-1} \times (\log E)^3 +$$
$$4.112 \times 10^{-1} \times (\log E)^2 - 2.472 \times 10^{-1} \times (\log E) + 2.285 \times 10^{-1}$$

Hereinafter, the resonator 1 with the decreased vibration leakage obtained by satisfying any of the patterns 1, 2, and 3 is verified, based on simulation results performed by the inventors. The crystal resonator element 3 used in the simulation is obtained by patterning the Z cut crystal plate by the wet etching and has the dimensions shown in FIGS. 8A and 8B. The unit of all numerical values in FIGS. 8A and 8B is μm. Since the crystal resonator element 3 patterned by the wet etching is used in the simulation, the grooves 323, 324, 333, and 334 formed in the vibrating arms 32 and 33 have a shape having the crystal plane of the quartz crystal appearing as shown in FIG. 8B. The first and second excitation electrodes 84 and 85 and the other wirings are not formed in the crystal resonator element 3 used in the simulation. The inventors have verified that the simulation result has not substantially changed (has the same tendency), even when the dimension of each portion is different.

As shown in FIG. 9, the simulation was performed by assuming the state where the resonator 1 in which the width W2 of the linkage portion 35 is any of 50 μm to 350 μm (W2=50 μm, 67 μm, 83 μm, 100 μm, 116 μm, 133 μm, 150 μm, 175 μm, 200 μm, 225 μm, 250 μm, 275 μm, 300 μm, 325 μm, 350 μm) is attached to the base 91 in two portions (both end portions in the X axis direction) of the connection portion 34, using the conductive adhesives 11 and 12 having any of the Young's modulus E of 0.050 GPa to 5.000 GPa (E=0.0050 GPa, 0.075 GPa, 0.100 GPa, 0.125 GPa, 0.150 GPa, 0.175 GPa, 0.200 GPa, 0.300 GPa, 0.500 GPa, 1.000 GPa, 1.500 GPa, 2.000 GPa, 2.500 GPa, 3.000 GPa, 3.500 GPa, 4.000 GPa, 4.500 GPa, 5.000 GPa). As the parameters other than the Young's modulus E of the conductive adhesives 11 and 12, the thickness (T1) was set as 20 μm, the Poisson ratio was set as 0.33, and the mass density was set as 4070 kg/m$^3$. As the base 91, a ceramic base in which the Young's modulus E is set as 320 Gpa, the Poisson ratio is set as 0.23, and the mass density is set as 3800 kg/m$^3$ was assumed.

Simulation

The simulation was performed by calculating the vibration leakage when the vibrating arms 32 and 33 perform the excitation vibration in the X reversed-phase mode at 32.768 kHz which is the excitation frequency of the resonator device 2. The vibration leakage was calculated as a leak of the energy arriving on the back surfaces of the conductive adhesives 11 and 12 in the base 91. The inventors have verified that the simulation result has not substantially changed (has the same tendency), even when the excitation frequency is different (for example, even when the frequency is 32.768 kHz±1 kHz).

The simulation results are shown in FIG. 10 to FIG. 12. FIG. 10 and FIG. 11 are Tables 1 and 2 showing the simulation results and FIG. 12 is a graph for the tables in FIG. 10 and FIG. 11. A vertical axis of FIG. 12 indicates the Q value "$Q_{Leak}$" obtained by only considering the vibration leakage, and a horizontal axis thereof indicates W2/W1. FIG. 12 shows that, as the value of $Q_{Leak}$ increases, the vibration leakage decreases.

Next, FIG. 13 to FIG. 30 show graphs in which "vibration leakage difficulty indexes (M)" standardized using the maximum value as "1" for each Young's modulus of the conductive adhesives 11 and 12 are plotted, by taking the logarithm of each $Q_{Leak}$. A vertical axis of FIG. 13 to FIG. 30 indicates the vibration leakage difficulty index, and a horizontal axis thereof indicates W2/W1. FIG. 13 to FIG. 30 show that, as the vibration leakage difficulty index approaches 1.0, the vibration leakage can be decreased.

Review of Simulation Results

Next, the lower limit value and the upper limit value of W2/W1 for satisfying the relationship of the vibration leakage difficulty index (M)≥0.94 are acquired for each Young's modulus E of the conductive adhesives 11 and 12. The results thereof are shown in Table 3 of FIG. 31 and a graph of FIG. 32. When the relationship of M≥0.94 is satisfied in all ranges of W2/W1, the lower limit value of W2/W1 is 0.1 and the upper limit value thereof is 0.7. From FIG. 31 and FIG. 32, it is found that the vibration leakage difficulty index (M) is equal to or greater than 0.94 and the resonator 1 which can efficiently decrease the vibration leakage is obtained, by satisfying both of the formula (10) and the formula (11) or satisfying both of the formula (12) and the formula (13), that is, by satisfying the conditions of the pattern 1. The y axis in the graph disclosed in FIG. 32 represents W2/W1 and the x axis represents log E.

Figure 33:
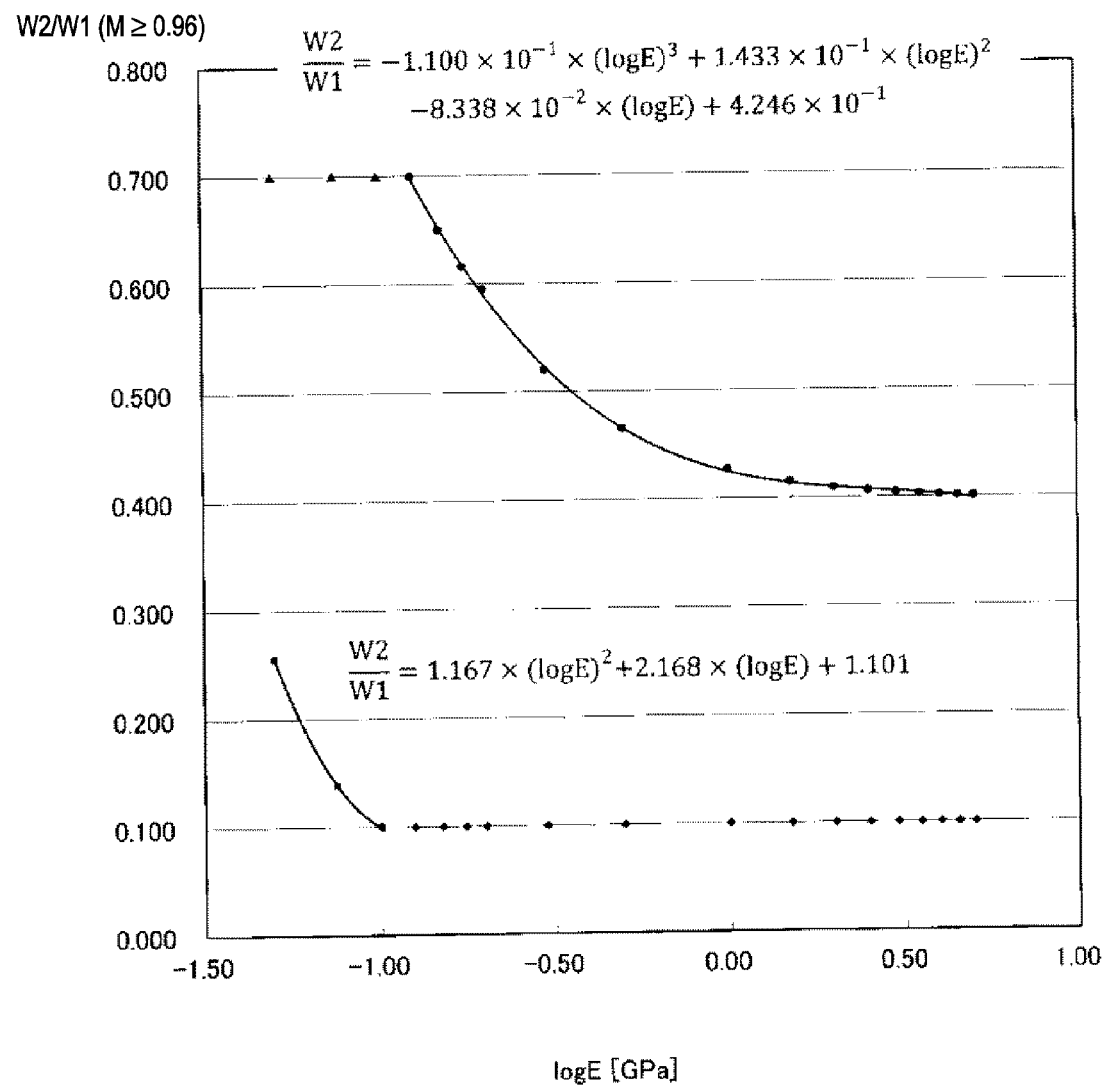
FIG. 33 is a graph showing a relationship between a Young's modulus of a conductive adhesive and W2/W1.

The lower limit value and the upper limit value of W2/W1 for satisfying the relationship of the vibration leakage difficulty index (M)≥0.96 are acquired for each Young's modulus E of the conductive adhesives 11 and 12. The results thereof are shown in Table 3 of FIG. 31 and a graph of FIG. 33. When the relationship of M≥0.96 is satisfied in all ranges of W2/W1, the lower limit value of W2/W1 is 0.1 and the upper limit value thereof is 0.7. From FIG. 31 and FIG. 33, it is found that the vibration leakage difficulty index (M) is equal to or greater than 0.96 and the resonator 1 which can more efficiently decrease the vibration leakage is obtained, by satisfying both of the formula (14) and the formula (15) or satisfying both of the formula (16) and the formula (17), that is, by satisfying the conditions of the pattern 2. The y axis in the graph disclosed in FIG. 33 represents W2/W1 and the x axis represents log E.

Figure 34:
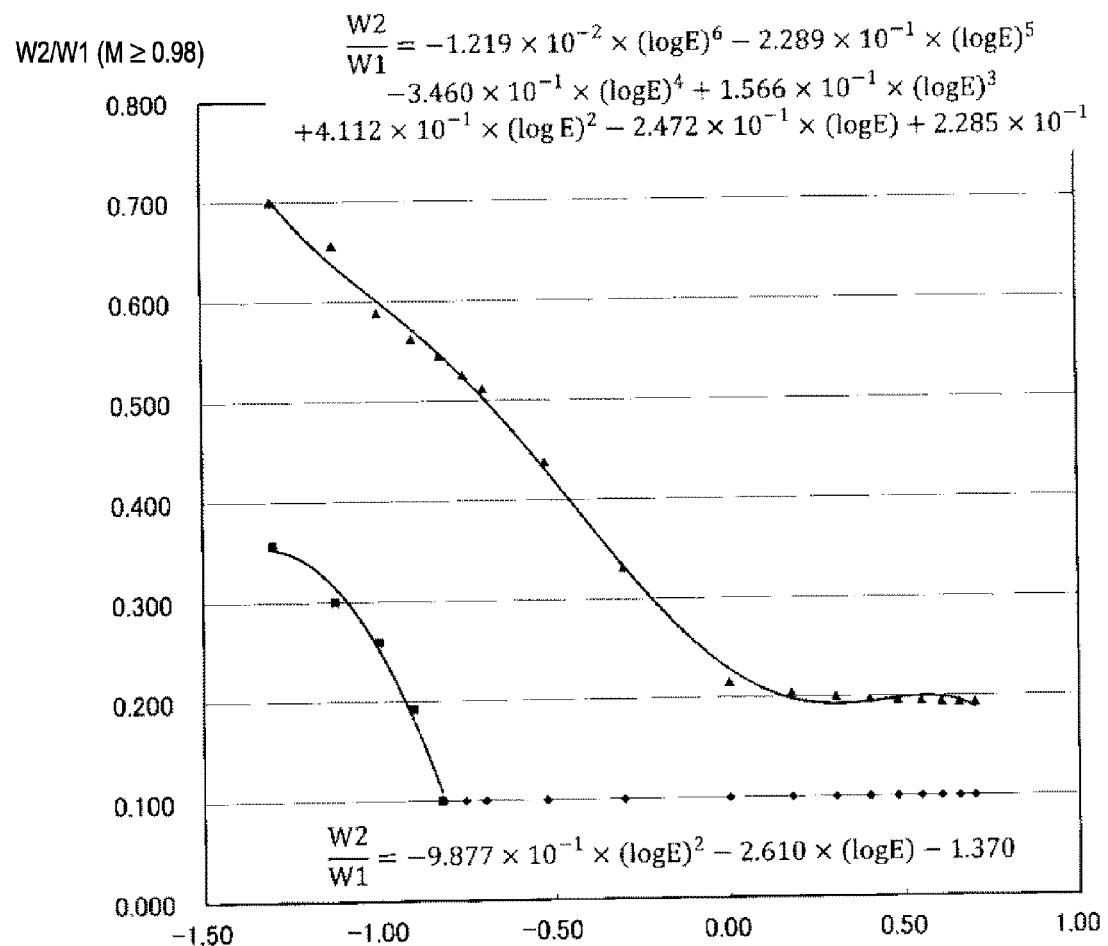
FIG. 34 is a graph showing a relationship between a Young's modulus of a conductive adhesive and W2/W1.

The lower limit value and the upper limit value of W2/W1 for satisfying the relationship of the vibration leakage difficulty index (M)≥0.98 are acquired for each Young's modulus E of the conductive adhesives 11 and 12. The results thereof are shown in Table 3 of FIG. 31 and a graph of FIG. 34. When the relationship of M≥0.98 is satisfied in all ranges of W2/W1, the lower limit value of W2/W1 is 0.1 and the upper limit value thereof is 0.7. From FIG. 31 and FIG. 34, it is found that, the vibration leakage difficulty index (M) is equal to or greater than 0.98 and the resonator 1 which can more efficiently decrease the vibration leakage is obtained, by satisfying both of the formula (18) and the formula (19) or satisfying both of the formula (20) and the formula (21), that is, by satisfying the conditions of the pattern 3. The y axis in the graph disclosed in FIG. 34 represents W2/W1 and the x axis represents log E.

As described above, the resonator 1 with sufficiently decreased vibration leakage is obtained, by satisfying any one of the patterns 1, 2, and 3.

Second Embodiment

Next, a second embodiment of a resonator according to the invention will be described.

Figure 35:
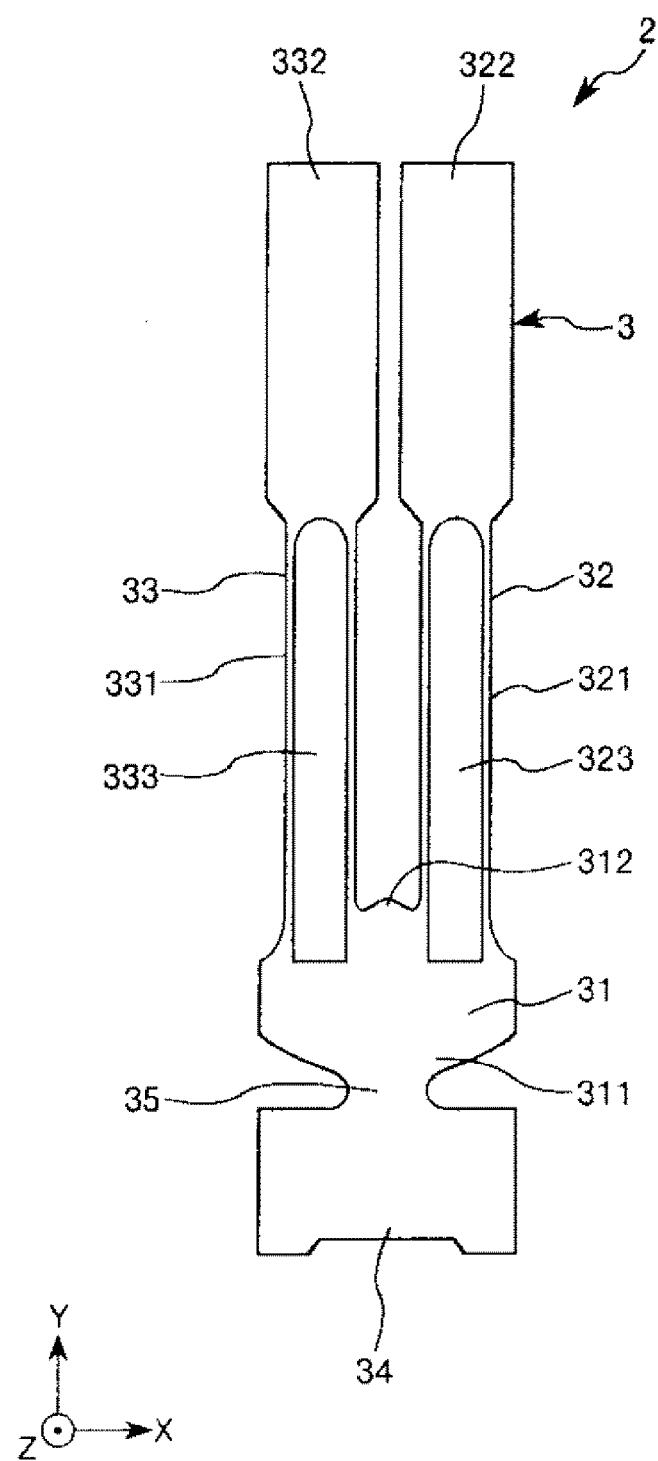
FIG. 35 is a plan view of a resonator device included in a resonator according to a second embodiment of the invention.

FIG. 35 is a plan view of a resonator device included in a resonator according to the second embodiment of the invention. In FIG. 35, for convenience of description, the first and second excitation electrodes are omitted.

Hereinafter, the description will be performed with a focus on the points of the resonator of the second embodiment different from the resonator of the first embodiment, and the description of the same configurations will be omitted.

The resonator of the embodiment is the same as the resonator of the first embodiment, except for the different shape of the resonator device.

As shown in FIG. 35, a vibrators device 2 of the embodiment includes a second constriction portion 312 which is an end portion of the base portion 31 on the positive Y axis side and is disposed between the vibrating arms 32 and 33. A width (length in the X axis direction) of the second constriction portion 312 continuously decreases towards the positive Y axis side (with distance from the first constriction portion 311 of the base portion 31), along the center line LL. The second constriction portion 312 is provided symmetrically with respect to the center line LL. In the same manner as that of the first constriction portion 311, by providing such a second constriction portion 312, it is possible to decrease displacement (vibration) of the base portion 31 in the Y axis direction accompanied with the flexural vibration of the vibrating arms 32 and 33. As a result, it is possible to obtain the resonator device 2 with small vibration leakage. In addition, by providing such a second constriction portion 312, it is possible to increase the separation distance between the end of the base portion 31 on the positive Y axis side and the end thereof on the negative Y axis side, compared to the first embodiment. Accordingly, the heat transfer therebetween is decreased, and thus, it is possible to decrease the thermoelastic loss.

Herein, the outline of the second constriction portion 312 is an arch, but there is no limitation as long as the operations described above are realized. For example, the outline thereof may be formed stepwise with a plurality of straight lines, that is, a width (length in the X axis direction) thereof may decrease in a stepwise manner towards the positive Y axis side, along the center line LL, the outline thereof may be provided by imitating an arch with the plurality of straight lines, or the outline thereof may be provided with two straight lines.

Even in the second embodiment, it is possible to exhibit the same effect as that of the first embodiment.

2. Oscillator

Next, an oscillator including the resonator according to the invention will be described.

Figure 36:
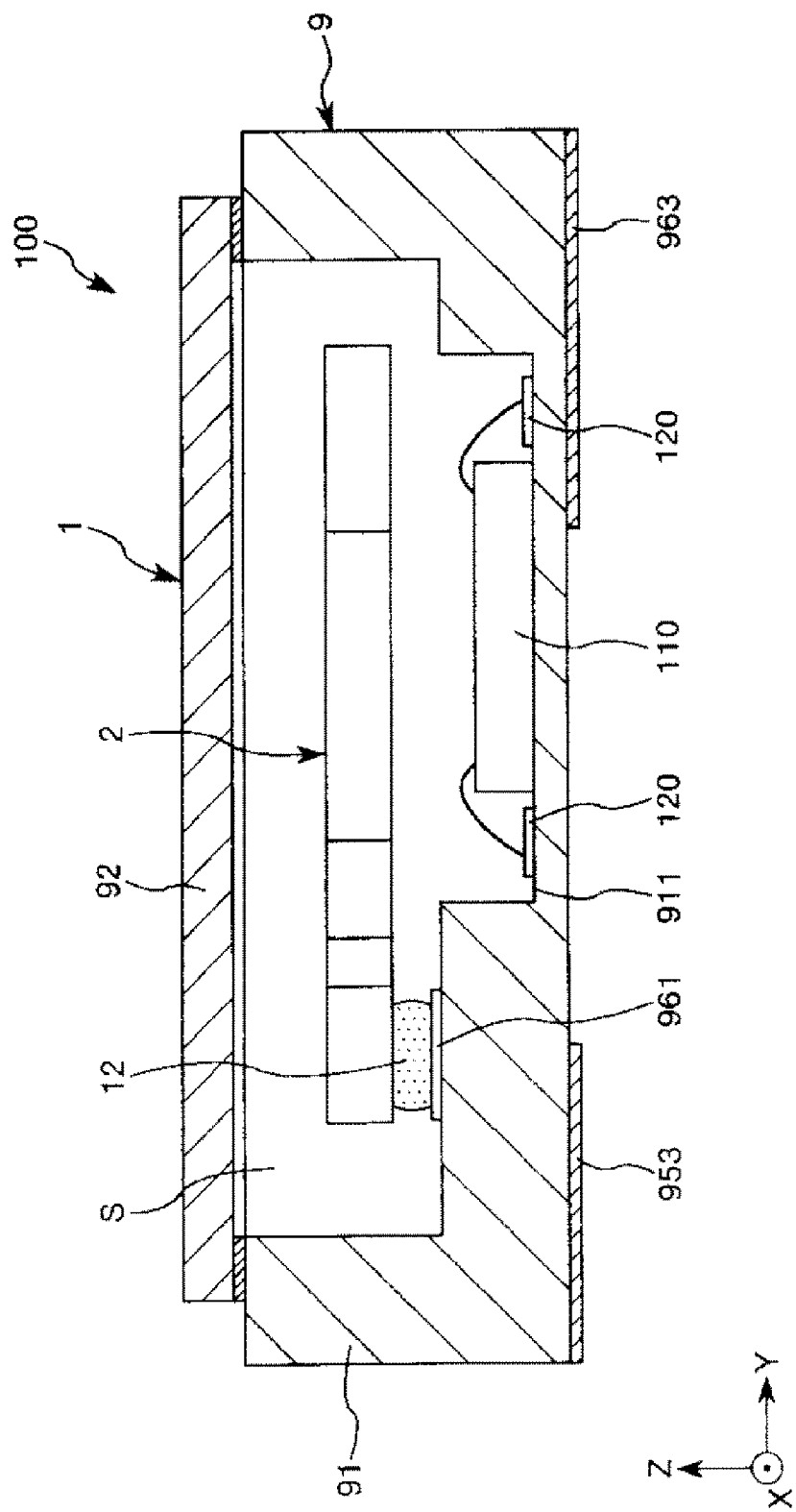
FIG. 36 is a cross-sectional view showing a preferred embodiment of an oscillator according to the invention.

FIG. 36 is a cross-sectional view showing a preferred embodiment of the oscillator according to the invention.

An oscillator 100 shown in FIG. 36 includes the resonator 1 and an IC chip 110 for driving the resonator device 2. Hereinafter, the description will be performed with a focus on the points of the oscillator 100 different from the resonator described above, and the description of the same configurations will be omitted.

As shown in FIG. 36, in the oscillator 100, the IC chip 110 is fixed to the recess 911 of the base 91. The IC chip 110 is electrically connected to a plurality of inner terminals 120 formed on the bottom surface of the recess 911. One of the plurality of inner terminals 120 is connected to the connection terminals 951 and 961 and another one thereof is connected to the external terminals 953 and 963. The IC chip 110 includes an oscillation circuit (circuit) for controlling the vibration of the resonator device 2. When the resonator device 2 is driven by the IC chip 110, it is possible to extract a signal at a predetermined frequency.

3. Physical Quantity Sensor

Next, a physical quantity sensor including the resonator according to the invention will be described.

Figure 37:
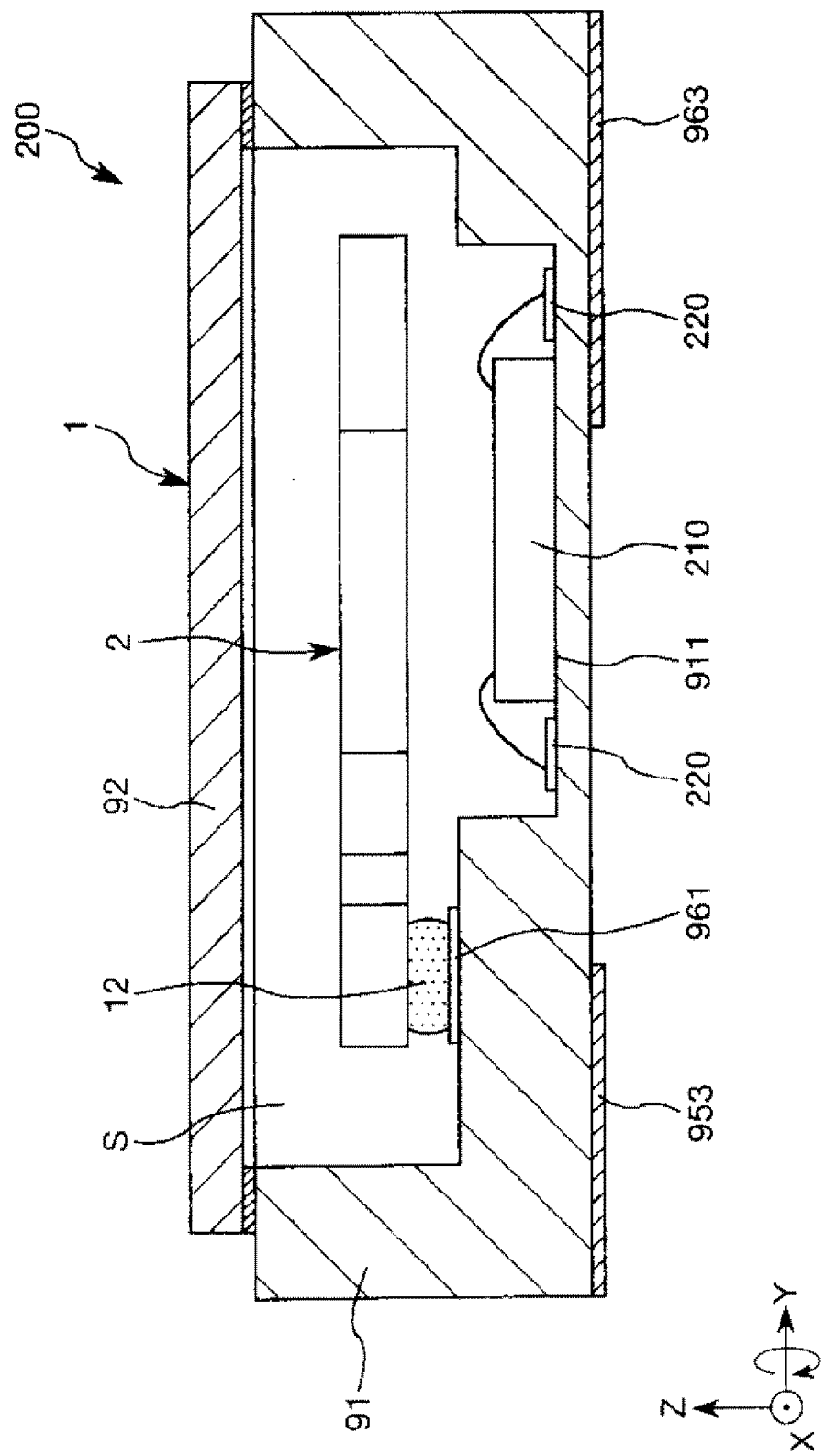
FIG. 37 is a cross-sectional view showing a preferred embodiment of a physical quantity sensor according to the invention.

FIG. 37 is a cross-sectional view showing a preferred embodiment of the physical quantity sensor according to the invention.

A physical quantity sensor 200 shown in FIG. 37 is an angular velocity sensor (gyro sensor) which can detect angular velocity around the Y axis, and includes the resonator 1, and the IC chip 110 for driving the resonator device 2. Hereinafter, the description will be performed with a focus on the points of the physical quantity sensor 200 different from the resonator described above, and the description of the same configurations will be omitted.

As shown in FIG. 37, in the physical quantity sensor 200, an IC chip 210 is fixed to the recess 911 of the base 91. The IC chip 210 is electrically connected to a plurality of inner terminals 220 formed on the bottom surface of the recess 911. One of the plurality of inner terminals 220 is connected to the connection terminals 951 and 961 and another one thereof is connected to the external terminals 953 and 963. The IC chip 210 includes an oscillation circuit (circuit) for controlling the excitation of the resonator device 2, and a detection circuit for detecting the angular velocity.

In such a physical quantity sensor, when the angular velocity around the Y axis is applied when the excitation vibration of the vibrating arms 32 and 33 is performed in the excitation vibration mode which is the X reversed-phase mode, a detection vibration mode which is a Z axis reversed-phase mode is generated in the vibrating arms 32 and 33. An electrode voltage (voltage between the first and second excitation electrodes 84 and 85) changes by this detection vibration mode, and it is possible to detect the angular velocity based on this change.

The physical quantity sensor is not particularly limited to the angular velocity sensor, and an acceleration sensor or a pressure sensor can also be used.

4. Electronic Apparatus

An electronic apparatus including the resonator according to the invention will be described.

Figure 38:
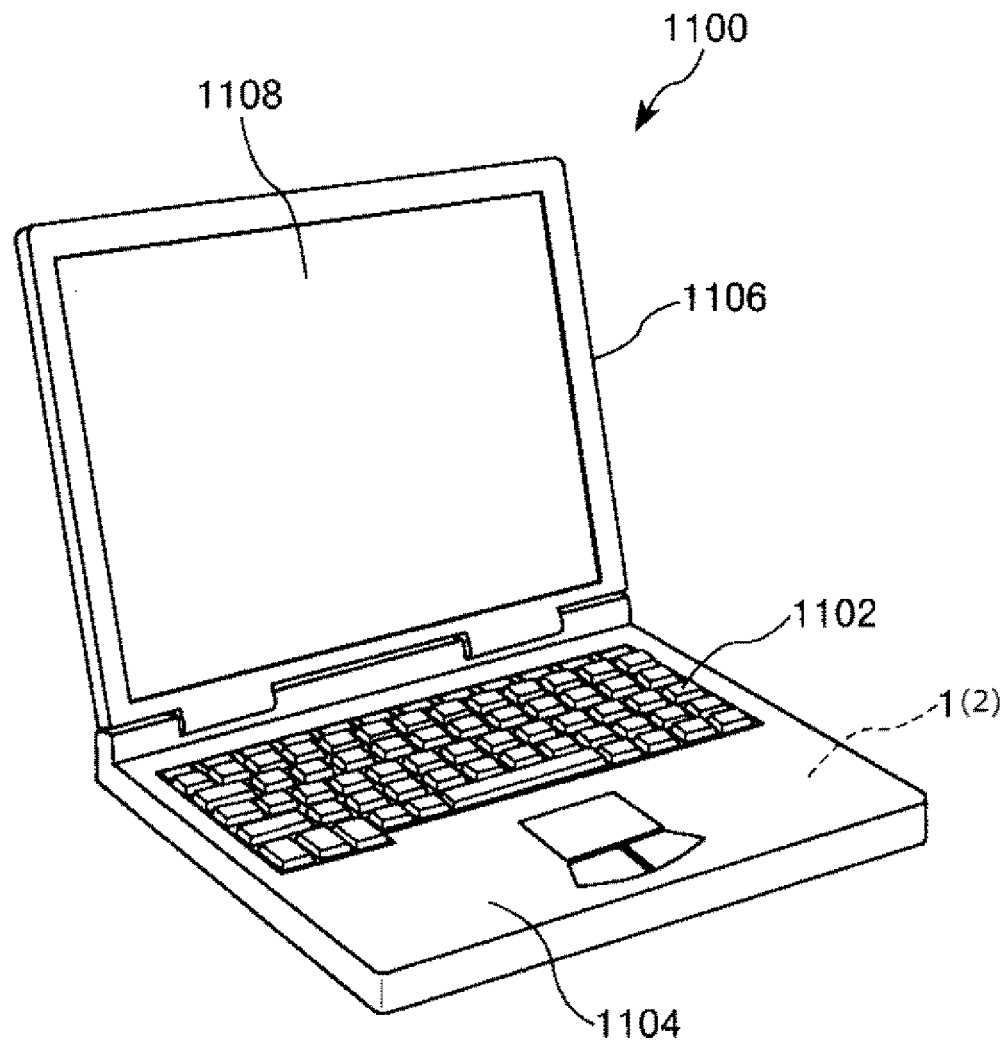
FIG. 38 is a perspective view showing a configuration of a mobile type (or notebook type) personal computer to which an electronic apparatus according to the invention is applied.

FIG. 38 is a perspective view showing a configuration of a mobile type (or notebook type) personal computer to which the electronic apparatus according to the invention is applied. In this drawing, a personal computer 1100 is configured with a main body unit 1104 including a keyboard 1102 and a display unit 1106 including a display section 1108, and the display unit 1106 is rotatably supported with respect to the main body unit 1104 through a hinge structure portion. The resonator 1 which functions as a filter, a resonator, and a reference clock is embedded in such a personal computer 1100.

Figure 39:
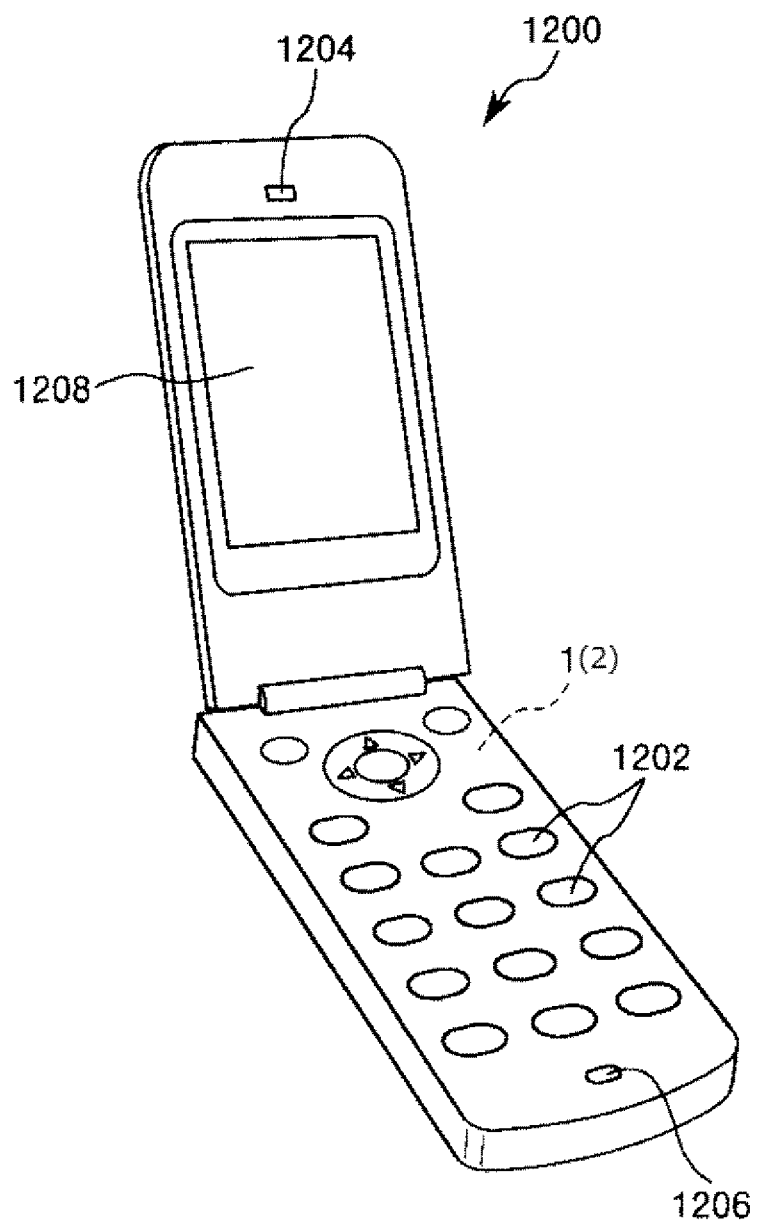
FIG. 39 is a perspective view showing a configuration of a mobile phone (also including a PHS) to which an electronic apparatus according to the invention is applied.

FIG. 39 is a perspective view showing a configuration of a mobile phone (also including a PHS) to which the electronic apparatus according to the invention is applied. In the drawing, the mobile phone 1200 includes a plurality of operation buttons 1202, an earpiece 1204, and a mouthpiece 1206, and a display unit 1208 is disposed between the operation buttons 1202 and the earpiece 1204. The resonator 1 which functions as a filter, a resonator, and a reference clock is embedded in such a mobile phone 1200.

Figure 40:
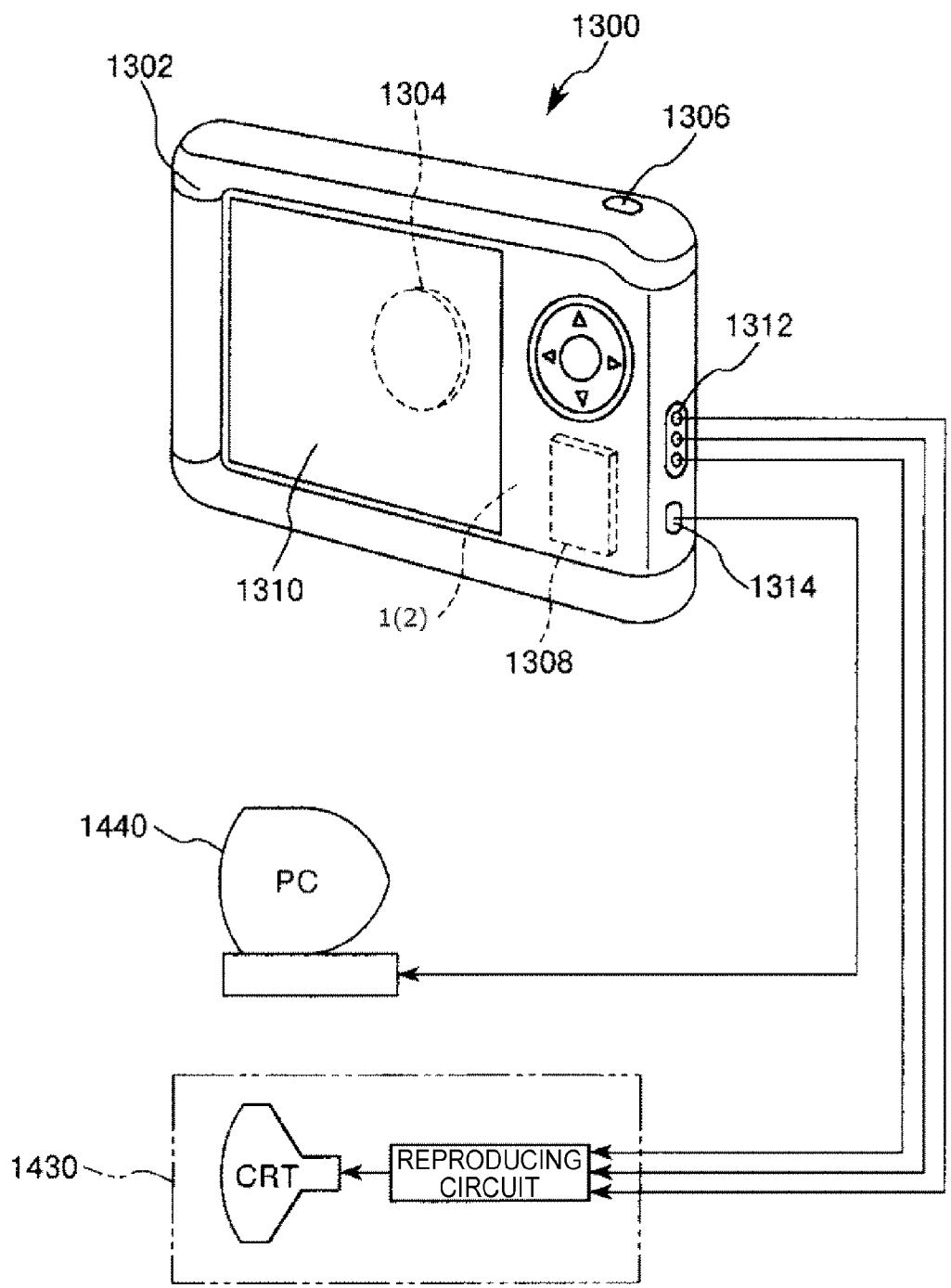
FIG. 40 is a perspective view showing a configuration of a digital still camera to which an electronic apparatus according to the invention is applied.

FIG. 40 is a perspective view showing a configuration of a digital still camera to which the electronic apparatus according to the invention is applied. The drawing also simply shows connection to an external device. Herein, the digital still camera 1300 generates an imaging signal (image signal) by performing photoelectric conversion of a light image of a subject by an imaging device such as a charge coupled device (CCD), whereas the general film camera exposes a silver-halide photo film by a light image of a subject.

A display unit 1310 is provided on a rear surface of a case (body) 1302 of the digital still camera 1300 and has a configuration of performing a display based on the imaging signal by the CCD, and the display unit functions as a finder for displaying a subject as an electronic image. A light receiving unit 1304 including an optical lens (optical imaging system) or the CCD is provided on a front surface side of the case 1302 (back surface side in the drawing).

When a photographer confirms a subject image displayed on the display unit and presses a shutter button 1306, an imaging signal of CCD at that point in time is transmitted and stored in a memory 1308. In the digital still camera 1300, a video signal output terminal 1312 and a data communication input and output terminal 1314 are provided on a side surface of the case 1302. As shown in the drawing, a television monitor 1430 is connected to the video signal output terminal 1312 and a personal computer 1440 is connected to the data communication input and output terminal 1314, respectively, if necessary. In addition, the imaging signal stored in the memory 1308 is output to the television monitor 1430 or the personal computer 1440 by a predetermined operation. The resonator 1 which functions as a filter, a resonator, and a reference clock is embedded in such a digital still camera 1300.

In addition to the personal computer (mobile type personal computer) shown in FIG. 38, the mobile phone shown in FIG. 39, and the digital still camera shown in FIG. 40, the electronic apparatus including the resonator according to the invention can be applied to an ink jet type discharging apparatus (for example, ink jet printer), a laptop type personal computer, a television, a video camera, a video tape recorder, a car navigation device, a pager, an electronic organizer (including communication function), an electronic dictionary, a calculator, an electronic game device, a word processer, a work station, a video phone, a security monitor, electronic binoculars, a POS terminal, medical equipment (for example, an electronic thermometer, a blood pressure meter, a blood glucose meter, an ECG measuring device, a ultrasound diagnostic device, or an electronic endoscope), a fishfinder, a variety of measurement equipment, a meter (for example, a meter for vehicles, aircraft, or a ship), a flight simulator, or the like.

5. Mobile Object

Next a mobile object including the resonator according to the invention will be described.

Figure 41:
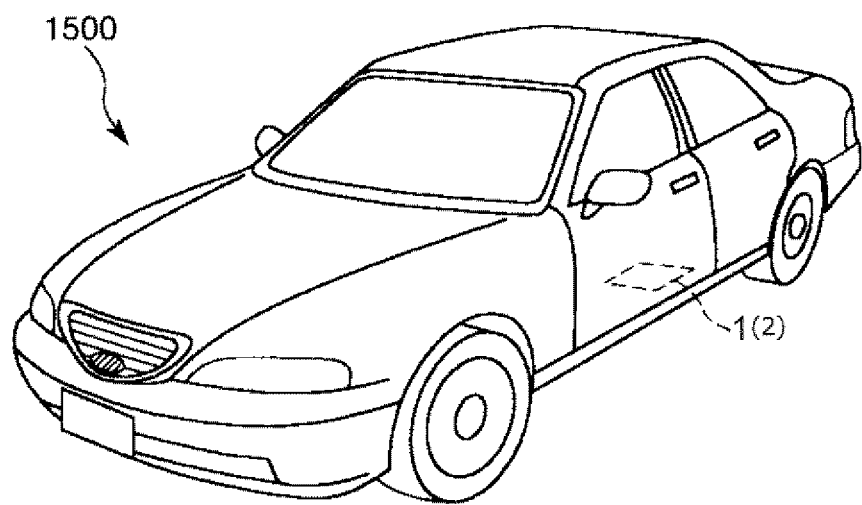
FIG. 41 is a perspective view showing a vehicle to which a mobile object according to the invention is applied.

FIG. 41 is a perspective view showing a vehicle to which the mobile object according to the invention is applied. The resonator 1 (resonator device 2) is mounted in a vehicle 1500. The resonator 1, for example, can also be widely applied to an electronic control unit (ECU) such as a keyless entry, an immobilizer, a car navigation system, a car air conditioner, an anti-lock brake system (ABS), an air bag, a tire pressure monitoring system (TPMS), an engine control, a battery charge monitor of a hybrid car or an electric car, or a vehicle body attitude control system.

Hereinabove, the resonator, the oscillator, the electronic apparatus, the physical quantity sensor, and the mobile object according to the invention have been described based on the embodiments shown in the drawings, but the invention is not limited thereto, and the configuration of each unit can be replaced with an arbitrary configuration having the same function. The other arbitrary configuration may be added to the invention. Each embodiment may be suitably combined.

In the embodiments described above, one groove is provided on each main surface of each vibrating arm, but the number of grooves is not particularly limited, and the grooves may be two or more. For example, two grooves arranged in the X axis direction may be provided on each main surface.

The embodiments have been specifically described as described above, but it is apparent to a person skilled in the art that any modifications can be performed in a range not departing from the novel matters and the effects of the invention. Accordingly, all of modification examples are included in the scope of the invention. For example, in the embodiments and the modification examples, the example in which the quartz crystal is used as the formation material of the resonator element has been described, but a piezoelectric material other than the quartz crystal can be used. For example, aluminum nitride (AlN), an oxide substrate of lithium niobate ($LiNbO_3$), lithium tantalate ($LiTaO_3$), lead zirconate titanate (PZT), lithium tetraborate ($Li_2B_4O_7$), or langasite crystal ($La_3Ga_5SiO_{14}$), a laminated piezoelectric substrate configured by laminating a piezoelectric material such as aluminum nitride or tantalum pentoxide ($Ta_2O_5$) on a glass substrate, or piezoelectric ceramics can be used.

In addition, the resonator element can be formed using a material other than the piezoelectric material. For example, the resonator element can also be formed using a silicon semiconductor material. A vibration (excitation) method of the resonator element is not limited to piezoelectric excitation. In addition to the piezoelectric excitation type using a piezoelectric substrate, it is possible to exhibit the configuration and the effect of the invention, even with the resonator element with an electrostatic excitation type using an electrostatic force or a Lorentz excitation type using a magnetic force. In addition, in the specification or the drawings, a term which is disclosed with a different term having a wider or the same meaning at least once can be replaced with the different term in any part of the specification or the drawings.

What is claimed is:

1. A resonator comprising:
   a resonator device;
   a package to which the resonator device is attached; and
   a member which attaches the resonator device to the package,
   the resonator device including:
      a base portion,
      a pair of vibrating arms which extend from one end side of the base portion in a plan view,
      a connection portion which is disposed only on an other end side of the base portion in a plan view, the connection portion being mounted to the package at connection positions, the connection positions being disposed only at the other end side of the base portion, and
      a linkage portion which is disposed between the base portion and the connection portion in a plan view and links between the base portion and the connection portion,
   each of the vibrating arms including:
      a weight portion, and
      an arm which is disposed between the base portion and the weight portion in a plan view, and
   a width of the base portion along a direction intersecting with the extension direction is set as W1, a width of the linkage portion along the intersecting direction is set as W2, a Young's modulus of the member is set as E (GPa) and a relationship of $-1.3 \leq \log E \leq -0.7$ is satisfied, and a relationship of the following formula:

$$0.1 \leq \frac{W2}{W1} \leq 0.7$$

is satisfied.

2. A resonator comprising:
   a resonator device;
   a package to which the resonator device is attached; and
   a member which attaches the resonator device to the package,
   the resonator device including:
      a base portion,
      a pair of vibrating arms which extend from one end side of the base portion in a plan view,
      a connection portion which is disposed only on an other end side of the base portion in a plan view, the connection portion being mounted to the package at connection positions, the connection positions being disposed only at the other end side of the base portion, and
      a linkage portion which is disposed between the base portion and the connection portion in a plan view and links between the base portion and the connection portion, each of the vibrating arms including:
  a weight portion, and
  an arm which is disposed between the base portion and the weight portion in a plan view, and
a width of the base portion along a direction intersecting with the extension direction is set as W1, a width of the linkage portion along the intersecting direction is set as W2, a Young's modulus of the member is set as E (GPa) and a relationship of $-0.7 \leq \log E \leq 0.7$ is satisfied, and a relationship of the following formula:

$$0.100 \leq \frac{W2}{W1} \leq -1.995 \times 10^{-1} \times (\log E)^3 + 1.891 \times 10^{-1} \times (\log E)^2 - 4.561 \times 10^{-2} \times (\log E) + 5.038 \times 10^{-1}$$

is satisfied.

3. A resonator comprising:
a resonator device;
a package to which the resonator device is attached; and
a member which attaches the resonator device to the package,
the resonator device including:
  a base portion,
  a pair of vibrating arms which extend from one end side of the base portion in a plan view,
  a connection portion which is disposed only on an other end side of the base portion in a plan view, the connection portion being mounted to the package at connection positions, the connection positions being disposed only at the other end side of the base portion, and
  a linkage portion which is disposed between the base portion and the connection portion in a plan view and links between the base portion and the connection portion,
each of the vibrating arms including:
  a weight portion, and
  an arm which is disposed between the base portion and the weight portion in a plan view, and
a width of the base portion along a direction intersecting with the extension direction is set as W1, a width of the linkage portion along the intersecting direction is set as W2, a Young's modulus of the member is set as E (GPa), and a relationship of $-1.3 \leq \log E < -1.0$ is satisfied, and a relationship of the following formula:

$$1.167 \times (\log E)^2 + 2.168 \times (\log E) + 1.101 \leq \frac{W2}{W1} \leq 0.7$$

is satisfied.

4. A resonator comprising:
a resonator device;
a package to which the resonator device is attached; and
a member which attaches the resonator device to the package,
the resonator device including:
  a base portion,
  a pair of vibrating arms which extend from one end side of the base portion in a plan view,
  a connection portion which is disposed only on an other end side of the base portion in a plan view, the connection portion being mounted to the package at connection positions, the connection positions being disposed only at the other end side of the base portion, and
  a linkage portion which is disposed between the base portion and the connection portion in a plan view and links between the base portion and the connection portion,
each of the vibrating arms including:
  a weight portion, and
  an arm which is disposed between the base portion and the weight portion in a plan view, and
a width of the base portion along a direction intersecting with the extension direction is set as W1, a width of the linkage portion along the intersecting direction is set as W2, a Young's modulus of the member is set as E (GPa), and a relationship of $-1.0 \leq \log E \leq 0.7$ is satisfied, and a relationship of the following formula:

$$0.100 \leq \frac{W2}{W1} \leq -1.100 \times 10^{-1} \times (\log E)^3 + 1.433 \times 10^{-1} \times (\log E)^2 - 8.338 \times 10^{-2} \times (\log E) + 4.246 \times 10^{-1}$$

is satisfied.

5. A resonator comprising:
a resonator device;
a package to which the resonator device is attached; and
a member which attaches the resonator device to the package,
the resonator device including:
  a base portion,
  a pair of vibrating arms which extend from one end side of the base portion in a plan view,
  a connection portion which is disposed only on an other end side of the base portion in a plan view, the connection portion being mounted to the package at connection positions, the connection positions being disposed only at the other end side of the base portion, and
  a linkage portion which is disposed between the base portion and the connection portion in a plan view and links between the base portion and the connection portion,
each of the vibrating arms including:
  a weight portion, and
  an arm which is disposed between the base portion and the weight portion in a plan view, and
a width of the base portion along a direction intersecting with the extension direction is set as W1, a width of the linkage portion along the intersecting direction is set as W2, a Young's modulus of the member is set as E (GPa) and a relationship of $-1.3 \leq \log E < -0.82$ is satisfied, and a relationship of the following formula:

$$-9.877 \times 10^{-1} \times (\log E)^2 - 2.610 \times (\log E) - 1.370 \leq$$
$$\frac{W2}{W1} \leq -1.219 \times 10^{-2} (\log E)^6 - 2.289 \times 10^{-1} \times (\log E)^5 - 3.460 \times 10^{-1} \times (\log E)^4 + 1.566 \times 10^{-1} \times (\log E)^3 + 4.112 \times 10^{-1} \times (\log E)^2 - 2.472 \times 10^{-1} \times (\log E) + 2.285 \times 10^{-1}$$

is satisfied.

6. A resonator comprising:
a resonator device;
a package to which the resonator device is attached; and
a member which attaches the resonator device to the package,
the resonator device including:
a base portion,
a pair of vibrating arms which extend from one end side of the base portion in a plan view,
a connection portion which is disposed only on an other end side of the base portion in a plan view, the connection portion being mounted to the package at connection positions, the connection positions being disposed only at the other end side of the base portion, and
a linkage portion which is disposed between the base portion and the connection portion in a plan view and links between the base portion and the connection portion,
each of the vibrating arms including:
a weight portion, and
an arm which is disposed between the base portion and the weight portion in a plan view, and
a width of the base portion along a direction intersecting with the extension direction is set as W1, a width of the linkage portion along the intersecting direction is set as W2, a Young's modulus of the member is set as E (GPa) and a relationship of $-0.82 \leq \log E \leq 0.7$ is satisfied, and a relationship of the following formula:

$$0.100 \leq \frac{W2}{W1} \leq -1.219 \times 10^{-2} \times (\log E)^6 - 2.289 \times 10^{-1} \times (\log E)^5 -$$
$$3.460 \times 10^{-1} \times (\log E)^4 + 1.566 \times 10^{-1} \times (\log E)^3 +$$
$$4.112 \times 10^{-1} \times (\log E)^2 - 2.472 \times 10^{-1} \times (\log E) + 2.285 \times 10^{-1}$$

is satisfied.

7. The resonator according to claim 1,
wherein, a length of the vibrating arm along the extension direction is set as L and a length of the weight portion along the extension direction is set as H, and a relationship of the following formula:

$$0.184 \leq \frac{H}{L} \leq 0.597$$

is satisfied.

8. The resonator according to claim 1,
wherein, a length of the vibrating arm along the extension direction is set as L and a length of the weight portion along the extension direction is set as H, and a relationship of the following formula:

$$0.012 < \frac{H}{L} < 0.30$$

is satisfied.

9. The resonator according to claim 1,
wherein each of the vibrating arm includes a pair of main surfaces in a front-back relationship, and a pair of grooves respectively provided on the pair of main surfaces, and
a width of each portion of the main surface arranged with the groove interposed therebetween along a direction intersecting with the extension direction is set as W3, and a relationship of 7 (µm)≤W3≤15 (µm) is satisfied.

10. The resonator according to claim 1,
wherein each of the vibrating arm includes a pair of main surfaces in a front-back relationship, and a pair of grooves respectively provided on the pair of main surfaces, and
a thickness of the vibrating arm is set as T and a depth of the groove is set as t, and a relationship of the following formula:

$$0.4 \leq 2 \times \frac{t}{T} < 1$$

is satisfied.

11. The resonator according to claim 1,
wherein a width of the weight portion along a direction intersecting with the extension direction is greater than that of the arm.

12. The resonator according to claim 1,
wherein the base portion includes a first constriction portion which is positioned on the other end side and has a length in a direction intersecting with the extension direction in a plan view which decreases continuously or in a stepwise manner along a center line between the pair of vibrating arms with distance from the one end.

13. The resonator according to claim 1,
wherein the base portion includes a second constriction portion which is positioned on the one end side and between the pair of vibrating arms, and has a length in a direction intersecting with the extension direction in a plan view which decreases continuously or in a stepwise manner along a center line between the pair of vibrating arms with distance from the other end.

14. An oscillator comprising:
the resonator according to claim 1; and
a circuit.

15. An oscillator comprising:
the resonator according to claim 2; and
a circuit.

16. An electronic apparatus comprising:
the resonator according to claim 1.

17. An electronic apparatus comprising:
the resonator according to claim 2.

18. A physical quantity sensor comprising:
the resonator according to claim 1.

19. A physical quantity sensor comprising:
the resonator according to claim 2.

20. A mobile object comprising:
the resonator according to claim 1.

* * * * *